United States Patent
Resch et al.

(10) Patent No.: US 11,656,941 B2
(45) Date of Patent: *May 23, 2023

(54) RETRIEVAL OF DATA OBJECTS WITH A COMMON TRAIT IN A STORAGE NETWORK

(71) Applicant: Pure Storage, Inc., Mountain View, CA (US)

(72) Inventors: Jason K. Resch, Chicago, IL (US); Greg Dhuse, Chicago, IL (US); Andrew Baptist, Mt. Pleasant, WI (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/443,915

(22) Filed: Jul. 28, 2021

(65) Prior Publication Data

US 2021/0357290 A1 Nov. 18, 2021

Related U.S. Application Data

(63) Continuation of application No. 17/195,150, filed on Mar. 8, 2021, now Pat. No. 11,093,330, which is a
(Continued)

(51) Int. Cl.
*G11C 29/00* (2006.01)
*G06F 11/10* (2006.01)
(Continued)

(52) U.S. Cl.
CPC .......... *G06F 11/1076* (2013.01); *G06F 3/064* (2013.01); *G06F 3/067* (2013.01);
(Continued)

(58) Field of Classification Search
CPC .......... G06F 3/064; G06F 3/0619; G06F 3/06; G06F 16/951; G06F 16/86;
(Continued)

(56) References Cited

U.S. PATENT DOCUMENTS 4,092,732 A 5/1978 Ouchi
5,454,101 A 9/1995 Mackay
(Continued)

OTHER PUBLICATIONS

Chung; An Automatic Data Segmentation Method for 3D Measured Data Points; National Taiwan University; pp. 1-8; 1998.
(Continued)

*Primary Examiner* — Samir W Rizk
(74) *Attorney, Agent, or Firm* — Garlick & Markison; Timothy W. Markison; Bruce E. Stuckman

(57) ABSTRACT

A method includes identifying an independent data object of a plurality of independent data objects for retrieval from dispersed storage network (DSN) memory. The method further includes determining a mapping of the plurality of independent data objects into a data matrix, wherein the mapping is in accordance with the dispersed storage error encoding function. The method further includes identifying, based on the mapping, an encoded data slice of the set of encoded data slices corresponding to the independent data object. The method further includes sending a retrieval request to a storage unit of the DSN memory regarding the encoded data slice. When the encoded data slice is received, the method further includes decoding the encoding data slice in accordance with the dispersed storage error encoding function and the mapping to reproduce the independent data object.

20 Claims, 63 Drawing Sheets

Related U.S. Application Data continuation of application No. 17/081,056, filed on Oct. 27, 2020, now Pat. No. 10,977,127, which is a continuation of application No. 16/988,247, filed on Aug. 7, 2020, now Pat. No. 10,853,172, which is a continuation of application No. 16/171,794, filed on Oct. 26, 2018, now Pat. No. 10,776,204, which is a continuation of application No. 15/679,569, filed on Aug. 17, 2017, now Pat. No. 10,169,150, which is a continuation of application No. 15/351,628, filed on Nov. 15, 2016, now Pat. No. 9,798,619, which is a continuation of application No. 14/589,391, filed on Jan. 5, 2015, now Pat. No. 9,529,834.

(60) Provisional application No. 61/944,742, filed on Feb. 26, 2014.

(51) Int. Cl.
  *G06F 16/84* (2019.01)
  *G06F 16/951* (2019.01)
  *G06F 16/22* (2019.01)
  *G06F 3/06* (2006.01)
  *H03M 13/29* (2006.01)

(52) U.S. Cl.
  CPC ........ *G06F 3/0619* (2013.01); *G06F 11/1092* (2013.01); *G06F 16/2237* (2019.01); *G06F 16/86* (2019.01); *G06F 16/951* (2019.01); *H03M 13/2906* (2013.01); *G06F 2211/1028* (2013.01)

(58) Field of Classification Search
  CPC ............. G06F 16/2237; G06F 11/1076; G06F 11/1092; H03M 13/2906
  See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers | |
| 5,802,364 A | 9/1998 | Senator | |
| 5,809,285 A | 9/1998 | Hilland | |
| 5,890,156 A | 3/1999 | Rekieta | |
| 5,987,622 A | 11/1999 | Lo Verso | |
| 5,991,414 A | 11/1999 | Garay | |
| 6,012,159 A | 1/2000 | Fischer | |
| 6,058,454 A | 5/2000 | Gerlach | |
| 6,128,277 A | 10/2000 | Bruck | |
| 6,175,571 B1 | 1/2001 | Haddock | |
| 6,192,472 B1 | 2/2001 | Garay | |
| 6,256,688 B1 | 7/2001 | Suetaka | |
| 6,272,658 B1 | 8/2001 | Steele | |
| 6,301,604 B1 | 10/2001 | Nojima | |
| 6,356,949 B1 | 3/2002 | Katsandres | |
| 6,366,995 B1 | 4/2002 | Vilkov | |
| 6,374,336 B1 | 4/2002 | Peters | |
| 6,415,373 B1 | 7/2002 | Peters | |
| 6,418,539 B1 | 7/2002 | Walker | |
| 6,449,688 B1 | 9/2002 | Peters | |
| 6,567,948 B2 | 5/2003 | Steele | |
| 6,571,282 B1 | 5/2003 | Bowman-Amuah | |
| 6,609,223 B1 | 8/2003 | Wolfgang | |
| 6,718,361 B1 | 4/2004 | Basani | |
| 6,760,808 B2 | 7/2004 | Peters | |
| 6,785,768 B2 | 8/2004 | Peters | |
| 6,785,783 B2 | 8/2004 | Buckland | |
| 6,826,711 B2 | 11/2004 | Moulton | |
| 6,879,596 B1 | 4/2005 | Dooply | |
| 7,003,688 B1 | 2/2006 | Pittelkow | |
| 7,024,451 B2 | 4/2006 | Jorgenson | |
| 7,024,609 B2 | 4/2006 | Wolfgang | |
| 7,080,101 B1 | 7/2006 | Watson | |
| 7,103,824 B2 | 9/2006 | Halford | |
| 7,103,915 B2 | 9/2006 | Redlich | |
| 7,111,115 B2 | 9/2006 | Peters | |
| 7,140,044 B2 | 11/2006 | Redlich | |
| 7,146,644 B2 | 12/2006 | Redlich | |
| 7,171,493 B2 | 1/2007 | Shu | |
| 7,222,133 B1 | 5/2007 | Raipurkar | |
| 7,240,236 B2 | 7/2007 | Cutts | |
| 7,272,613 B2 | 9/2007 | Sim | |
| 7,636,724 B2 | 12/2009 | De La Torre | |
| 2002/0062422 A1 | 5/2002 | Butterworth | |
| 2002/0166079 A1 | 11/2002 | Ulrich | |
| 2003/0018927 A1 | 1/2003 | Gadir | |
| 2003/0037261 A1 | 2/2003 | Meffert | |
| 2003/0065617 A1 | 4/2003 | Watkins | |
| 2003/0084020 A1 | 5/2003 | Shu | |
| 2004/0024963 A1 | 2/2004 | Talagala | |
| 2004/0122917 A1 | 6/2004 | Menon | |
| 2004/0215998 A1 | 10/2004 | Buxton | |
| 2004/0228493 A1 | 11/2004 | Ma | |
| 2005/0100022 A1 | 5/2005 | Ramprashad | |
| 2005/0114594 A1 | 5/2005 | Corbett | |
| 2005/0125593 A1 | 6/2005 | Karpoff | |
| 2005/0131993 A1 | 6/2005 | Fatula, Jr. | |
| 2005/0132070 A1 | 6/2005 | Redlich | |
| 2005/0144382 A1 | 6/2005 | Schmisseur | |
| 2005/0229069 A1 | 10/2005 | Hassner | |
| 2006/0047907 A1 | 3/2006 | Shiga | |
| 2006/0136448 A1 | 6/2006 | Cialini | |
| 2006/0156059 A1 | 7/2006 | Kitamura | |
| 2006/0224603 A1 | 10/2006 | Correll, Jr. | |
| 2007/0079081 A1 | 4/2007 | Gladwin | |
| 2007/0079082 A1 | 4/2007 | Gladwin | |
| 2007/0079083 A1 | 4/2007 | Gladwin | |
| 2007/0088970 A1 | 4/2007 | Buxton | |
| 2007/0174192 A1 | 7/2007 | Gladwin | |
| 2007/0214285 A1 | 9/2007 | Au | |
| 2007/0234110 A1 | 10/2007 | Soran | |
| 2007/0283167 A1 | 12/2007 | Venters, III | |
| 2009/0094251 A1 | 4/2009 | Gladwin | |
| 2009/0094318 A1 | 4/2009 | Gladwin | |
| 2010/0023524 A1 | 1/2010 | Gladwin | |
| 2011/0004812 A1 | 1/2011 | Yang | |
| 2012/0317439 A1 | 12/2012 | K. | |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

(56) References Cited

OTHER PUBLICATIONS

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Kin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Directory Information Models; IETF Network Working Croup; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

| DST allocation info 242 | data partition info 320: data ID; No. of partitions; Addr. info for each partition; format conversion indication | | | | | | | |
|---|---|---|---|---|---|---|---|---|
| | task execution info 322 | | | | | intermediate result info 324 | | |
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 &<br>1_5 | R1-1_1 - R1-1_z &<br>R1-5_1 - R1-5_z | 1_1, 2_1, 3_1, 4_1, & 5_1 | R1-6 | DST unit 2 | DST unit 2 | DST units 2-6 |
| 1_7 | after 1_2 &<br>1_5 | R1-2_1 - R1-2_z &<br>R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

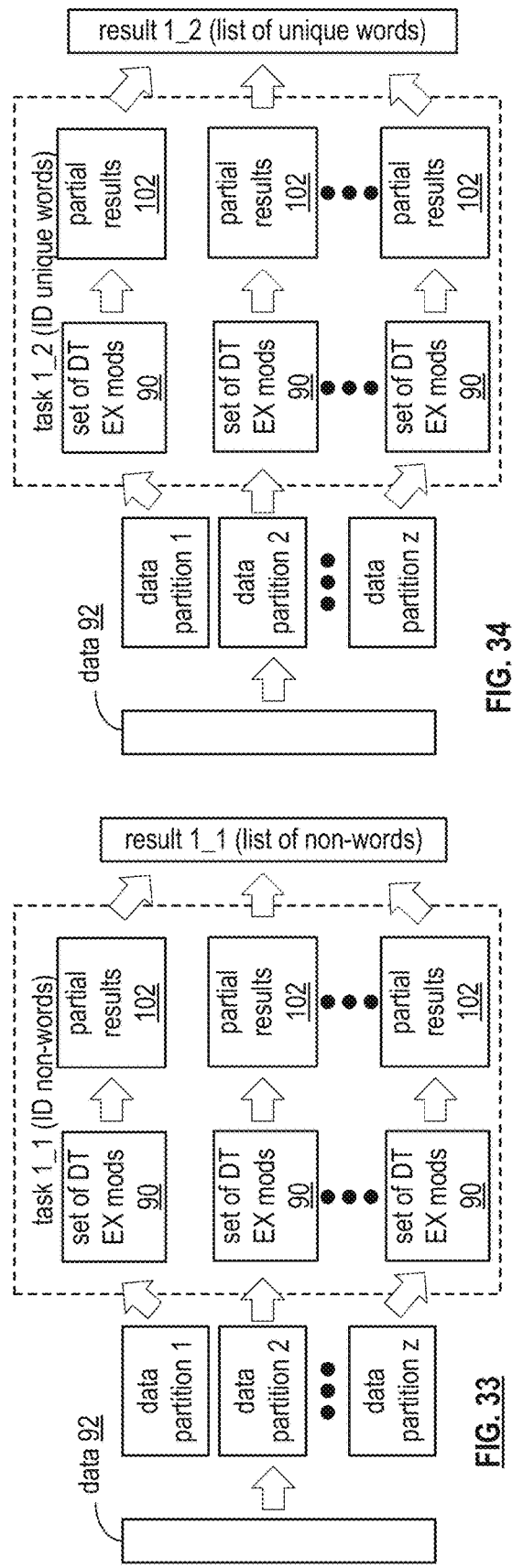
FIG. 33
FIG. 34
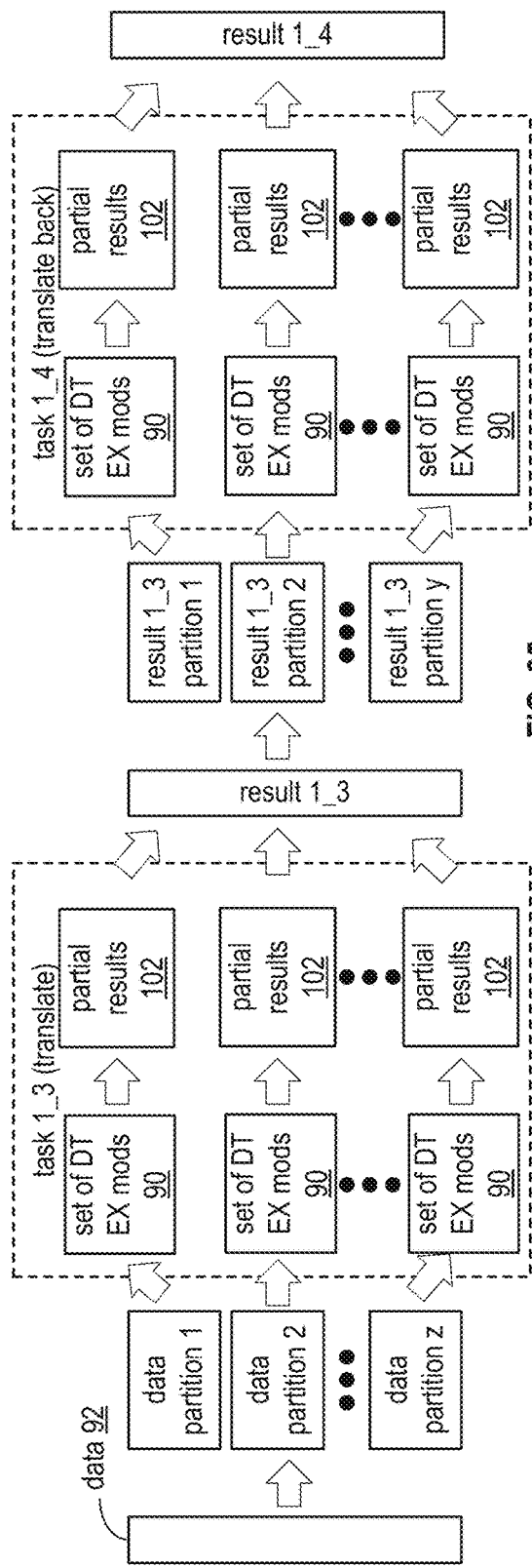
FIG. 35

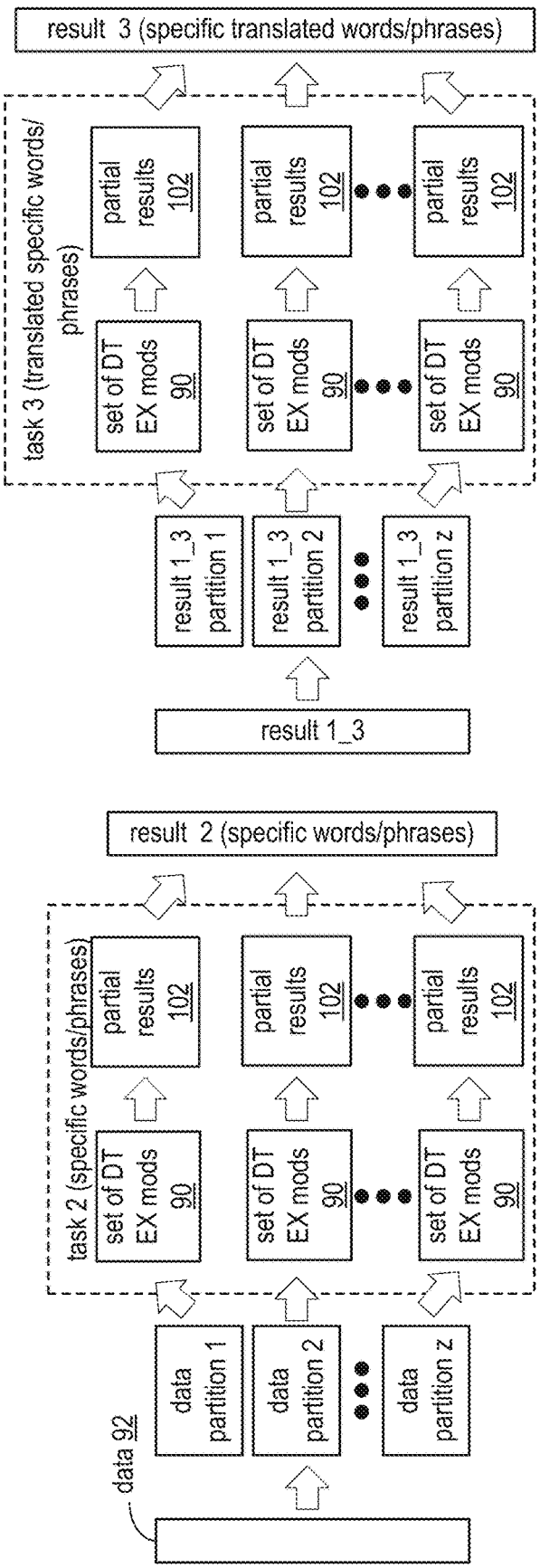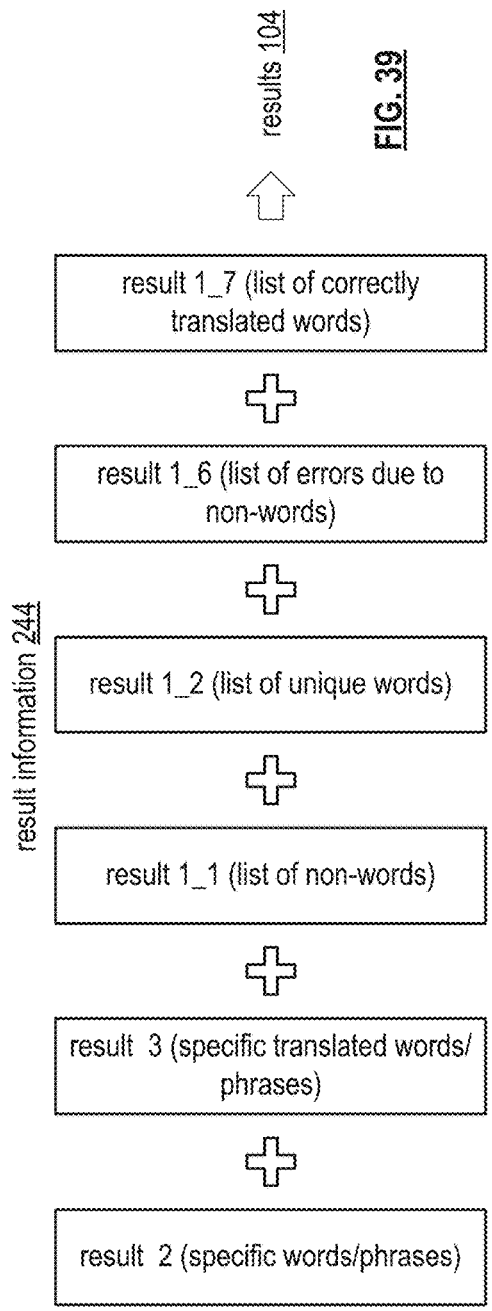

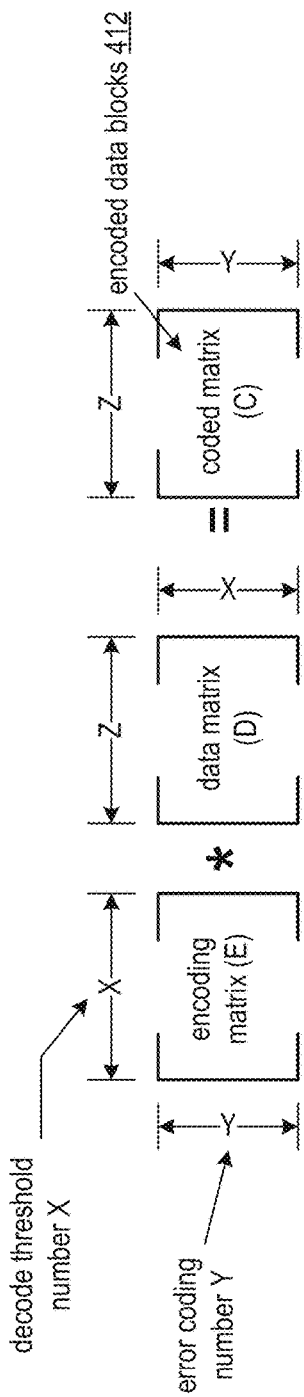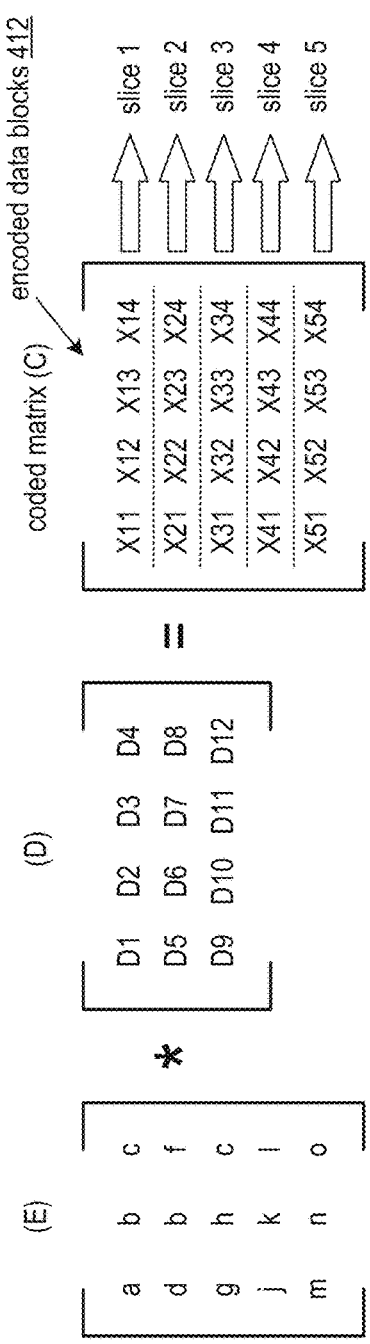
FIG. 41B
FIG. 41C
FIG. 41D

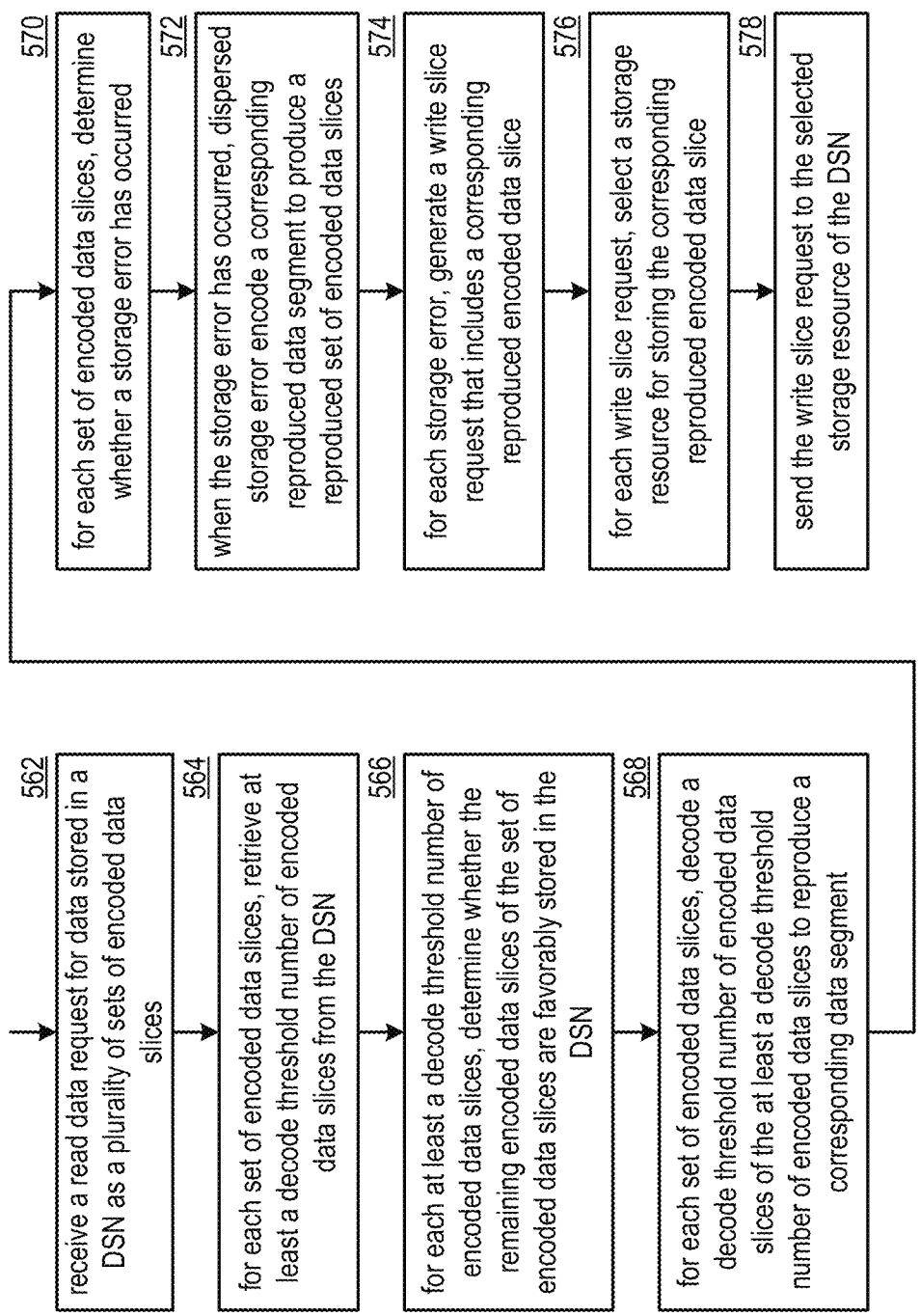

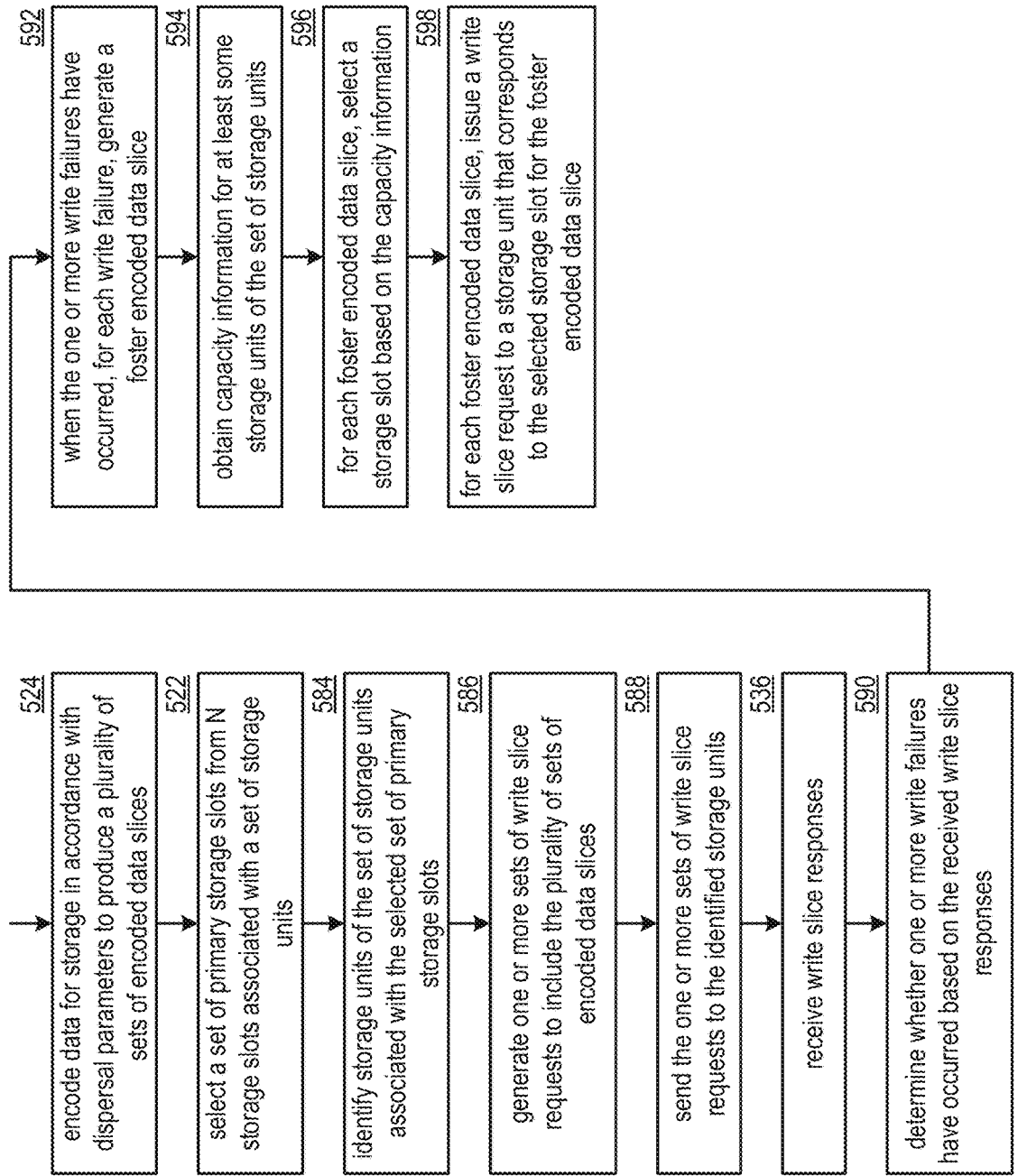

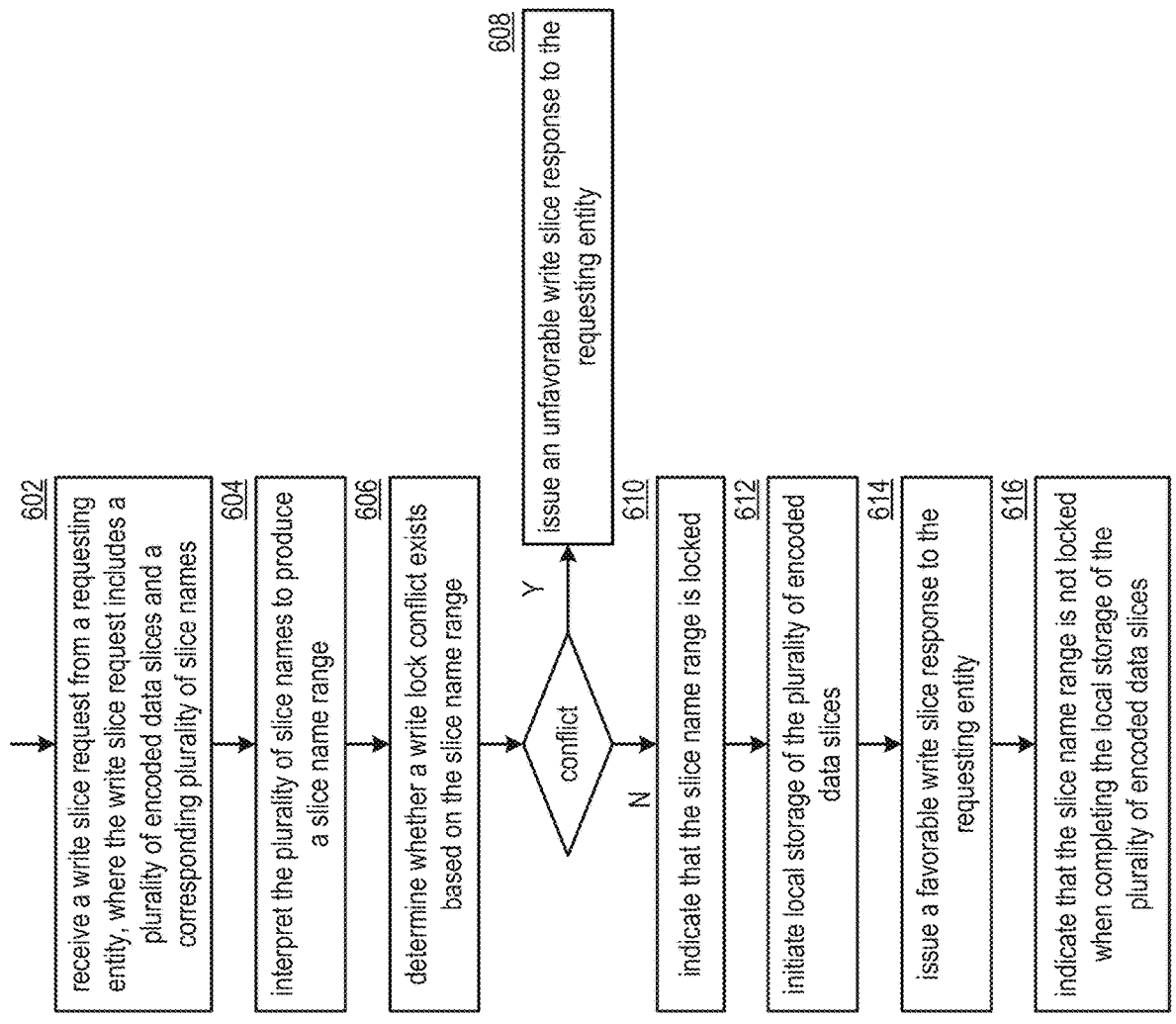

RETRIEVAL OF DATA OBJECTS WITH A COMMON TRAIT IN A STORAGE NETWORK

CROSS REFERENCE TO RELATED PATENTS

The present U.S. Utility Patent Application claims priority pursuant to 35 U.S.C. § 120 as a continuation of U.S. Utility application Ser. No. 17/195,150, entitled "Combining Data Objects in a Vast Data Storage Network", filed Mar. 8, 2021, which is a continuation of U.S. Utility application Ser. No. 17/081,056, entitled "Concatenating Data Objects in a Vast Data Storage Network", filed Oct. 27, 2020, issued as U.S. Pat. No. 10,977,127 on Apr. 13, 2021, which is a continuation of U.S. Utility application Ser. No. 16/988,247, entitled "Concatenating Data Objects For Storage In A Vast Data Storage Network", filed Aug. 7, 2020, issued as U.S. Pat. No. 10,853,172 on Dec. 1, 2020, which is a continuation of U.S. Utility application Ser. No. 16/171,794, entitled "Concatenating Data Objects for Storage in a Dispersed Storage Network", filed Oct. 26, 2018, issued as U.S. Pat. No. 10,776,204 on Sep. 15, 2020, which is a continuation of U.S. Utility application Ser. No. 15/679,569, entitled "Concatenating Data Objects for Storage in a Dispersed Storage Network", filed Aug. 17, 2017, issued as U.S. Pat. No. 10,169,150 on Jan. 1, 2019, which is a continuation of U.S. Utility application Ser. No. 15/351,628, entitled "Concatenating Data Objects for Storage in a Dispersed Storage Network", filed Nov. 15, 2016, issued as U.S. Pat. No. 9,798,619 on Oct. 24, 2017, which is a continuation of U.S. Utility application Ser. No. 14/589,391, entitled "Concatenating Data Objects for Storage in a Dispersed Storage Network", filed Jan. 5, 2015, issued as U.S. Pat. No. 9,529,834 on Dec. 27, 2016, which claims priority pursuant to 35 U.S.C. § 119(e) to U.S. Provisional Application No. 61/944,742, entitled "Executing Tasks in a Distributed Storage and Task Network", filed Feb. 26, 2014, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc., on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

Figure 40A:
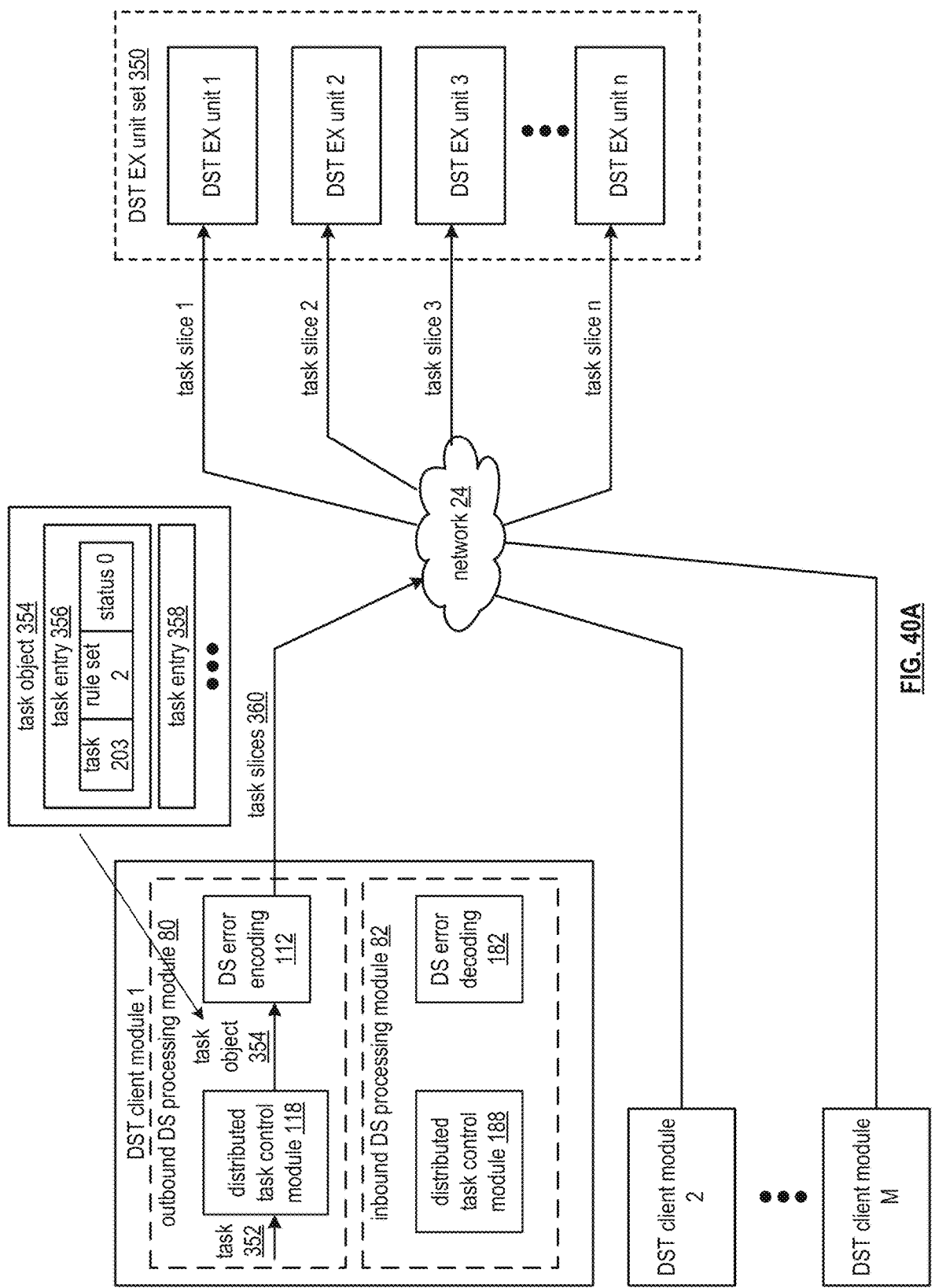
Figure 40B:
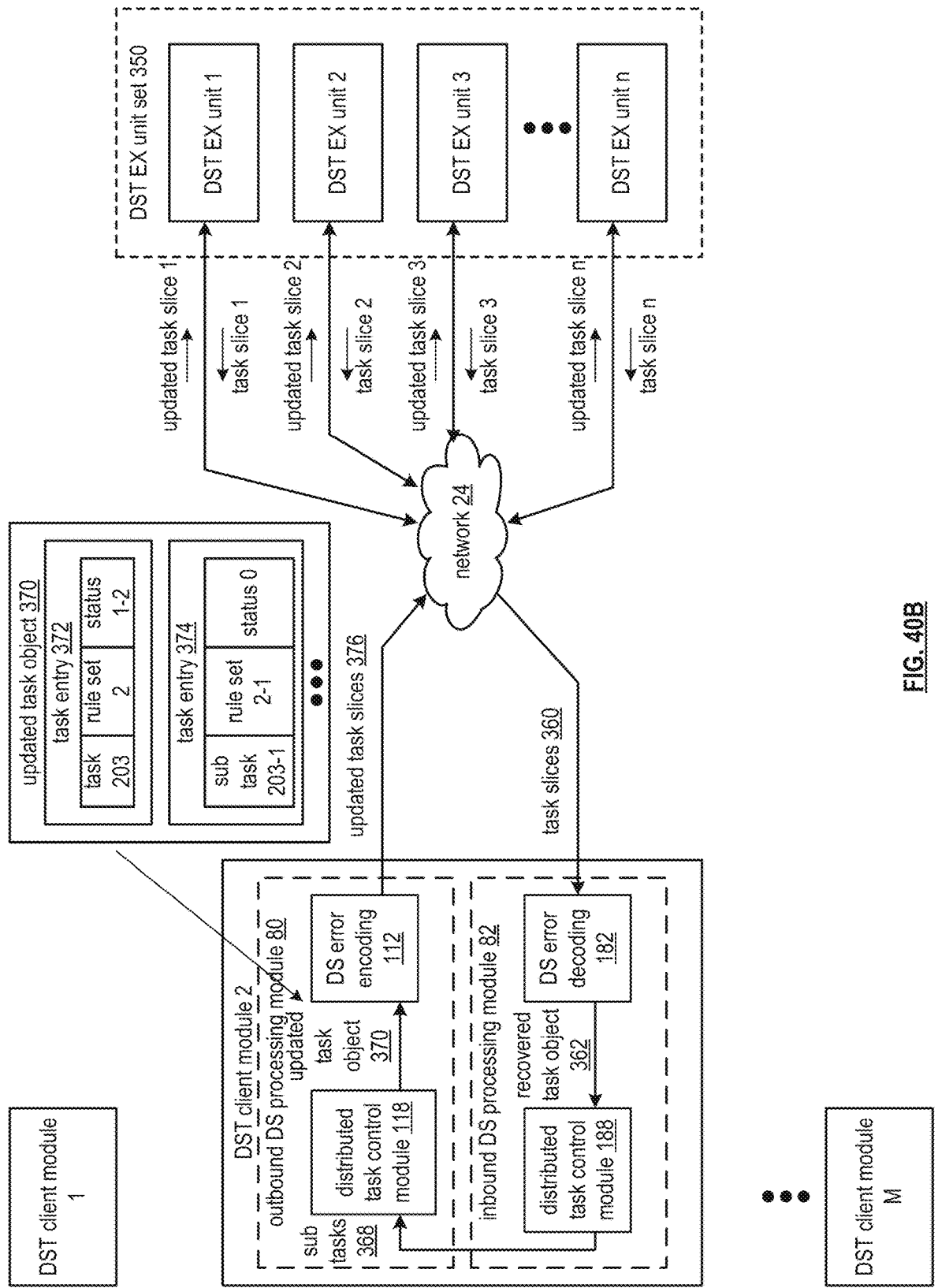
Figure 40C:
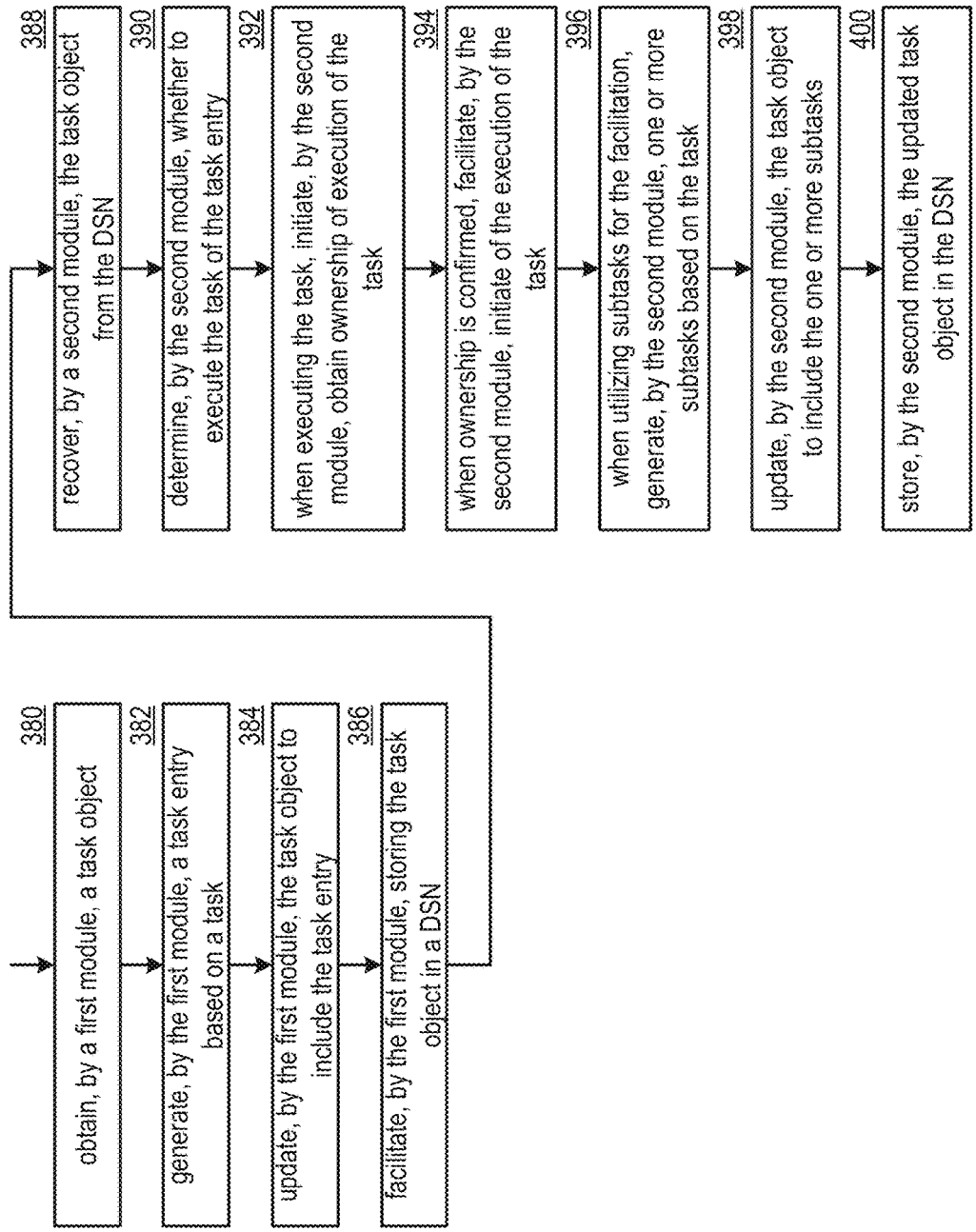
Figure 41A:
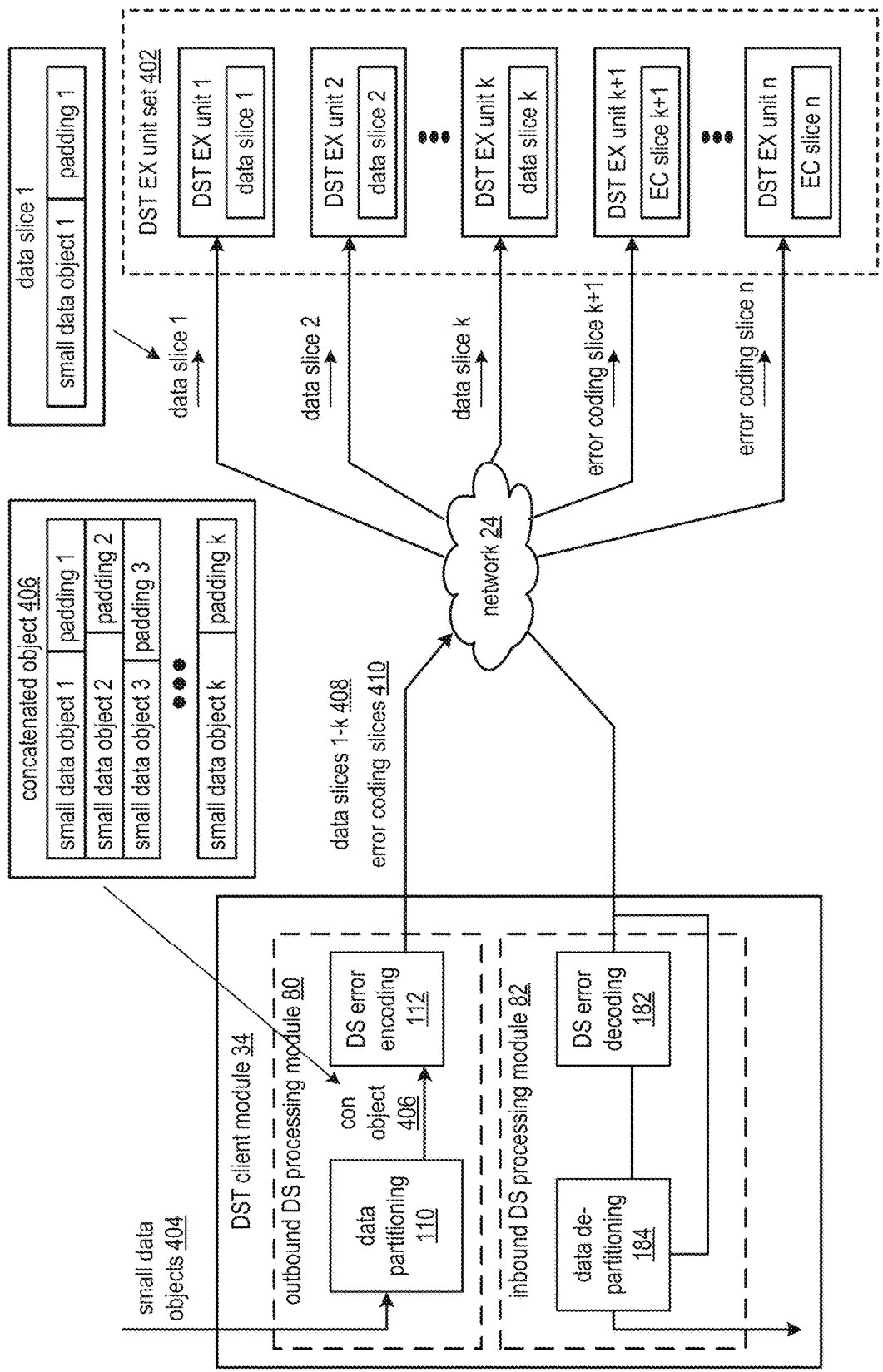
Figures 41E, 41F:
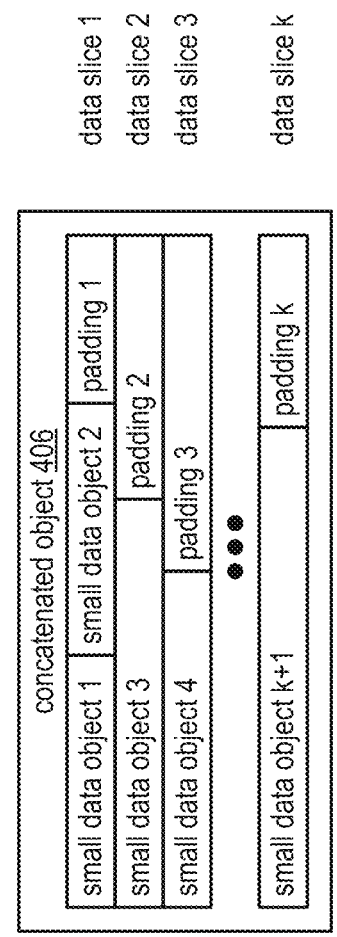
Figure 41G:
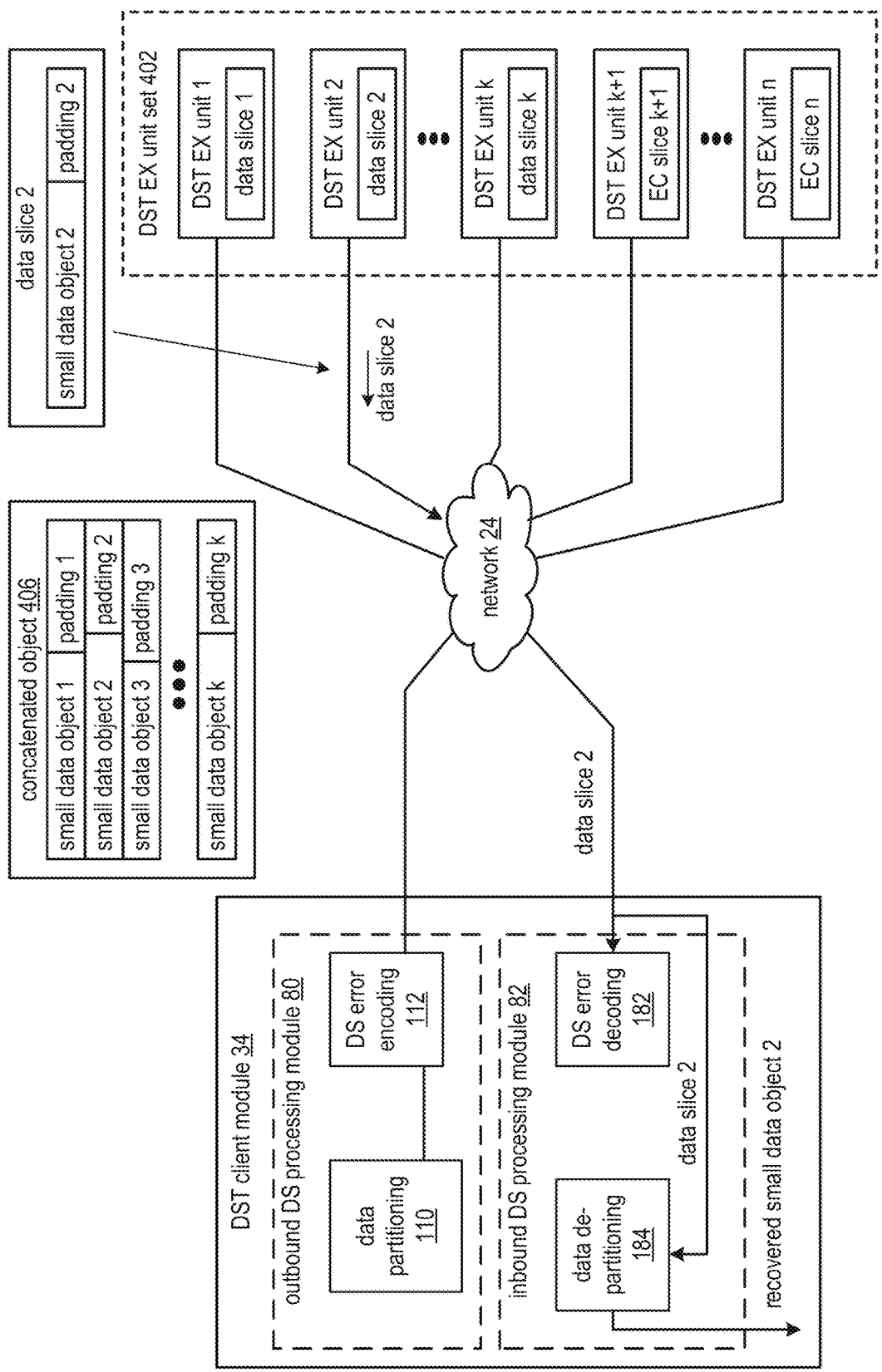
Figure 41H:
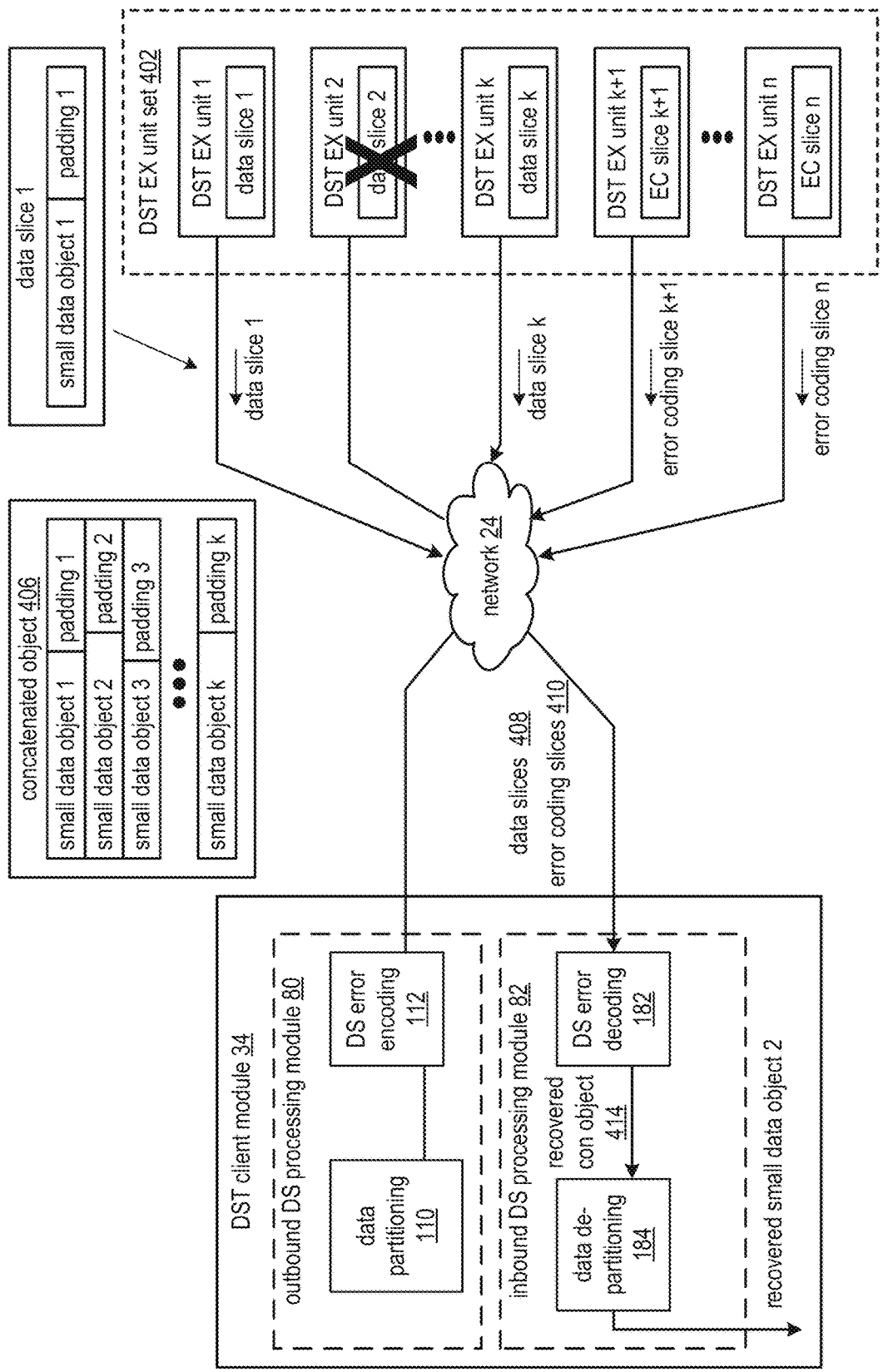
Figure 41I:
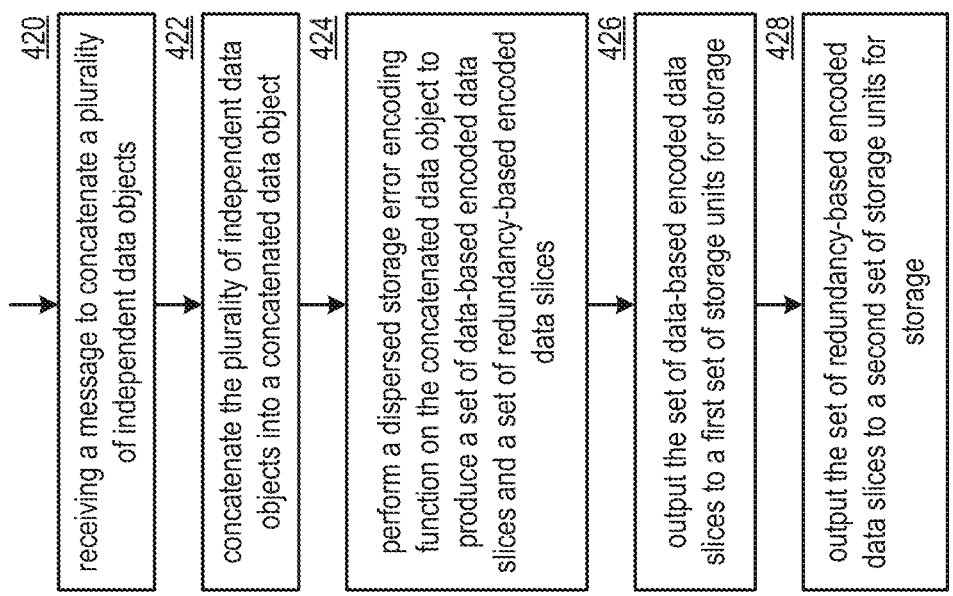
Figure 42A:
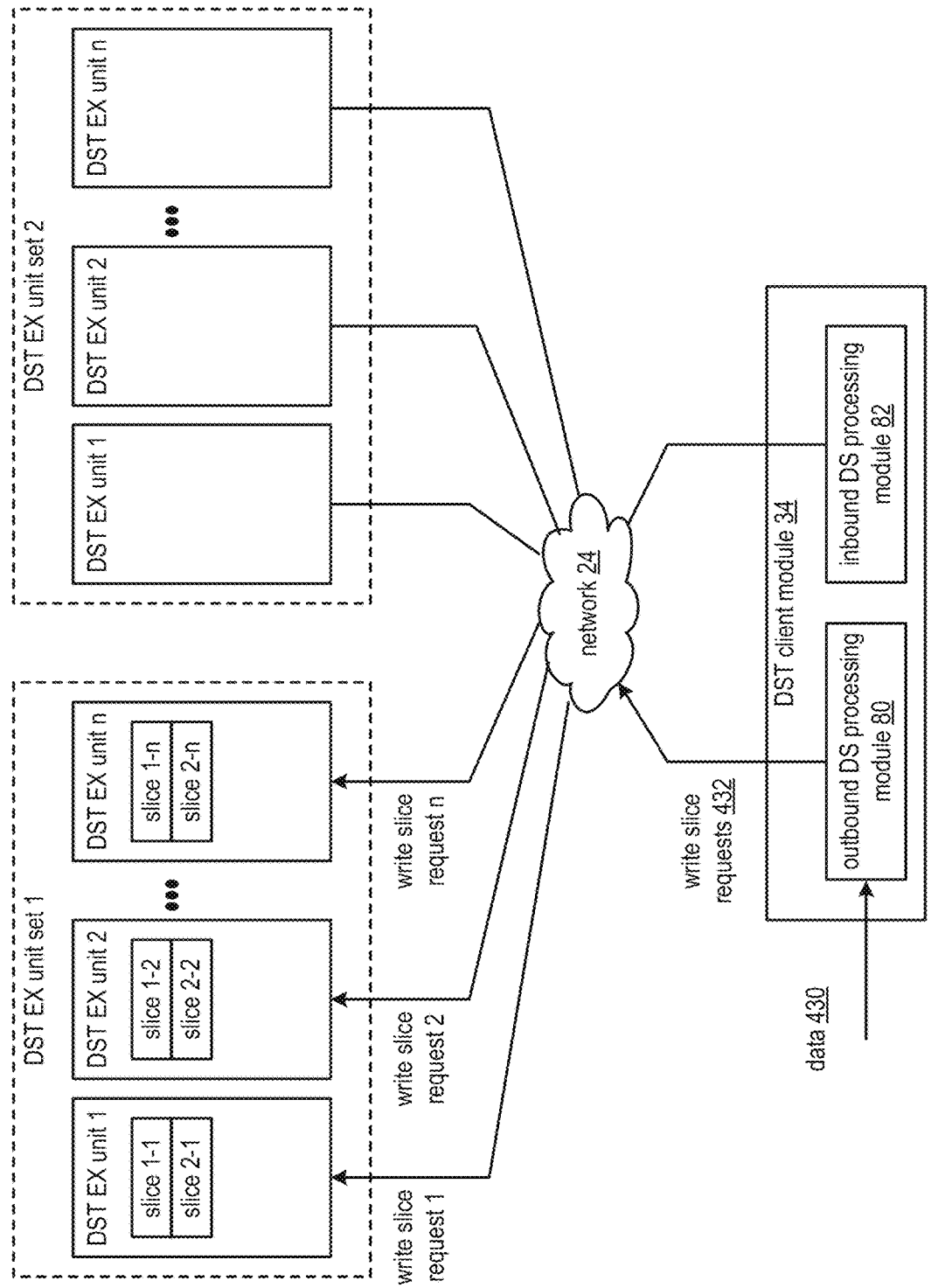
Figure 42B:
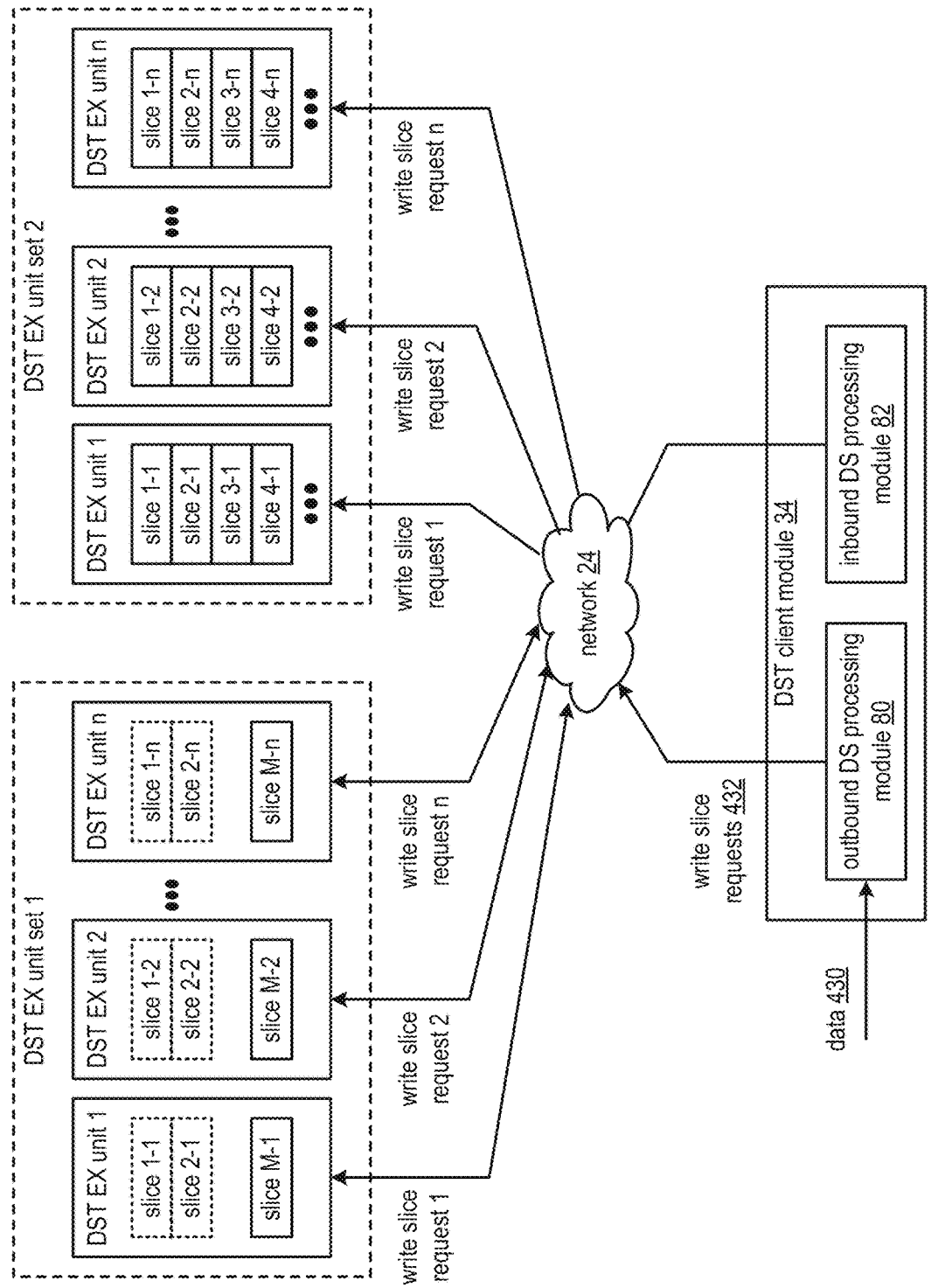
Figure 42C:
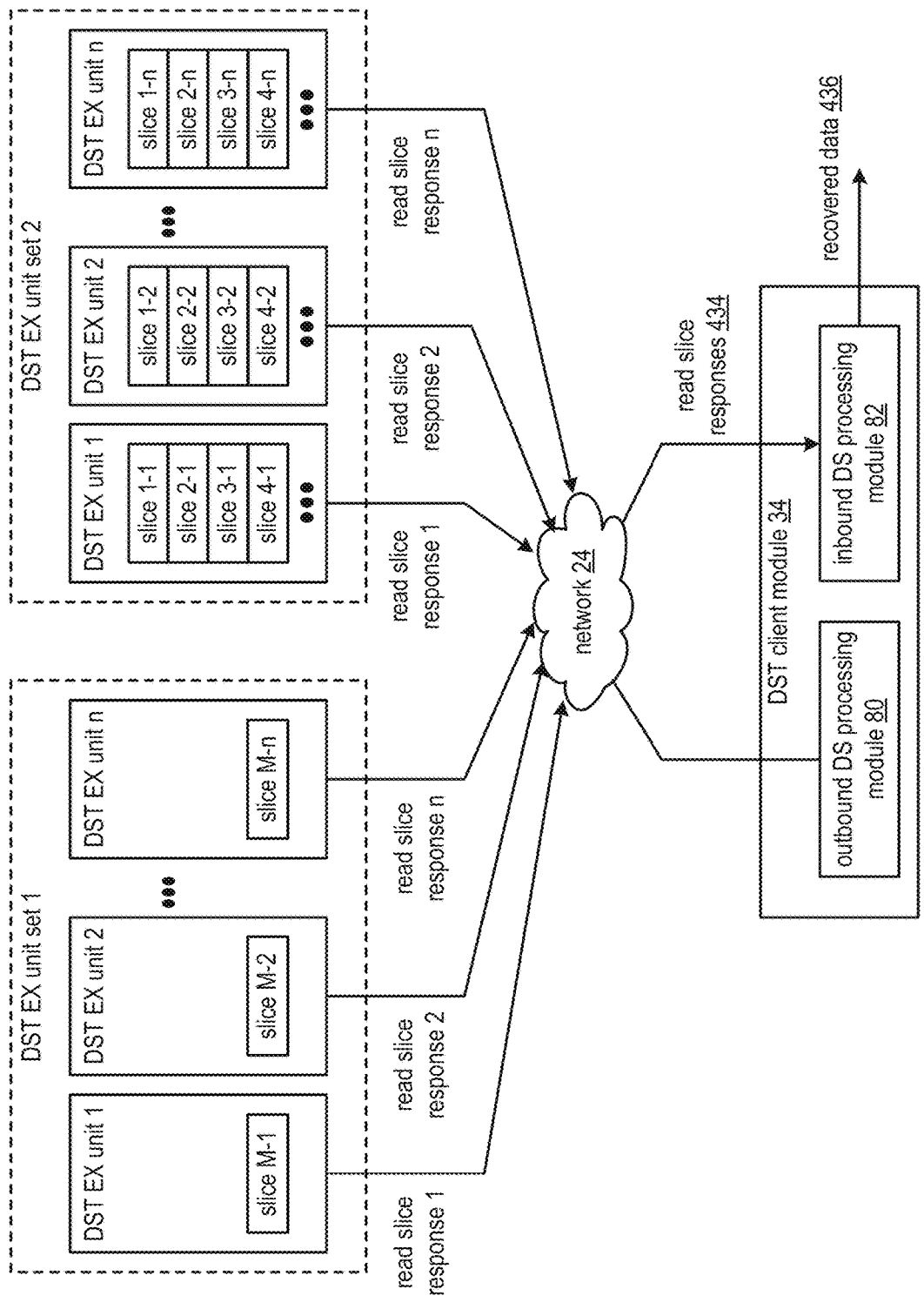
Figure 42D:
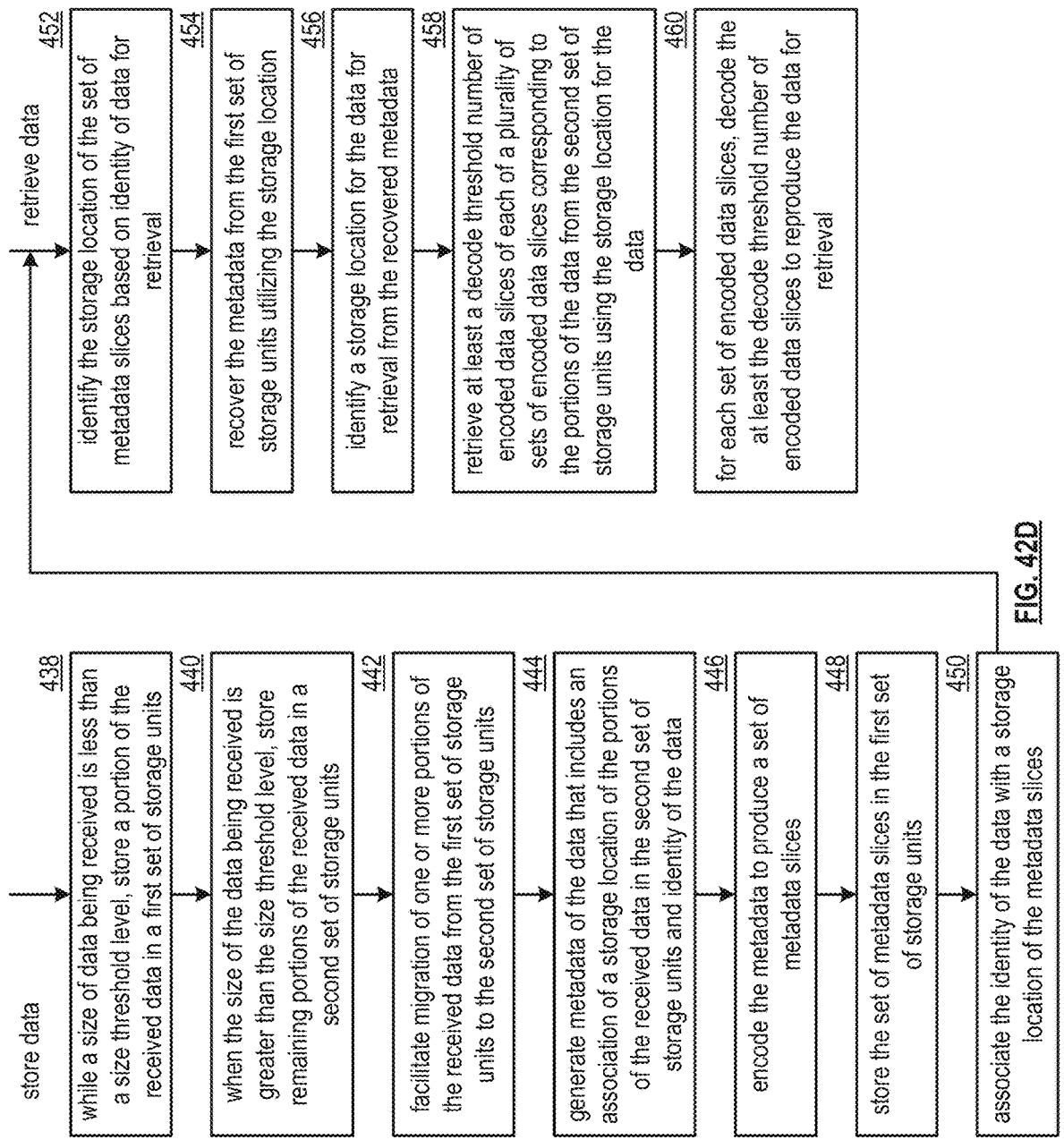
Figure 43A:
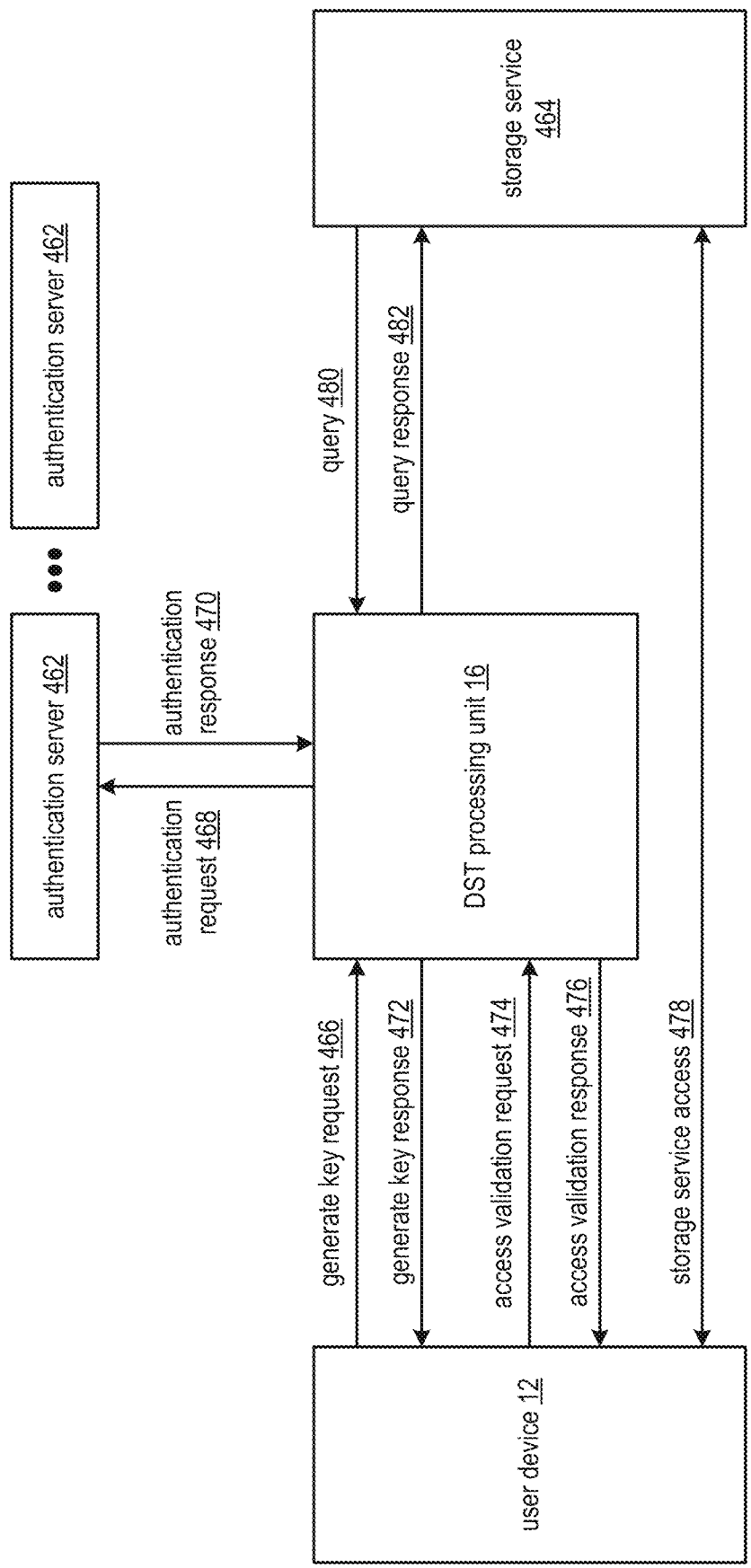
Figure 43B:
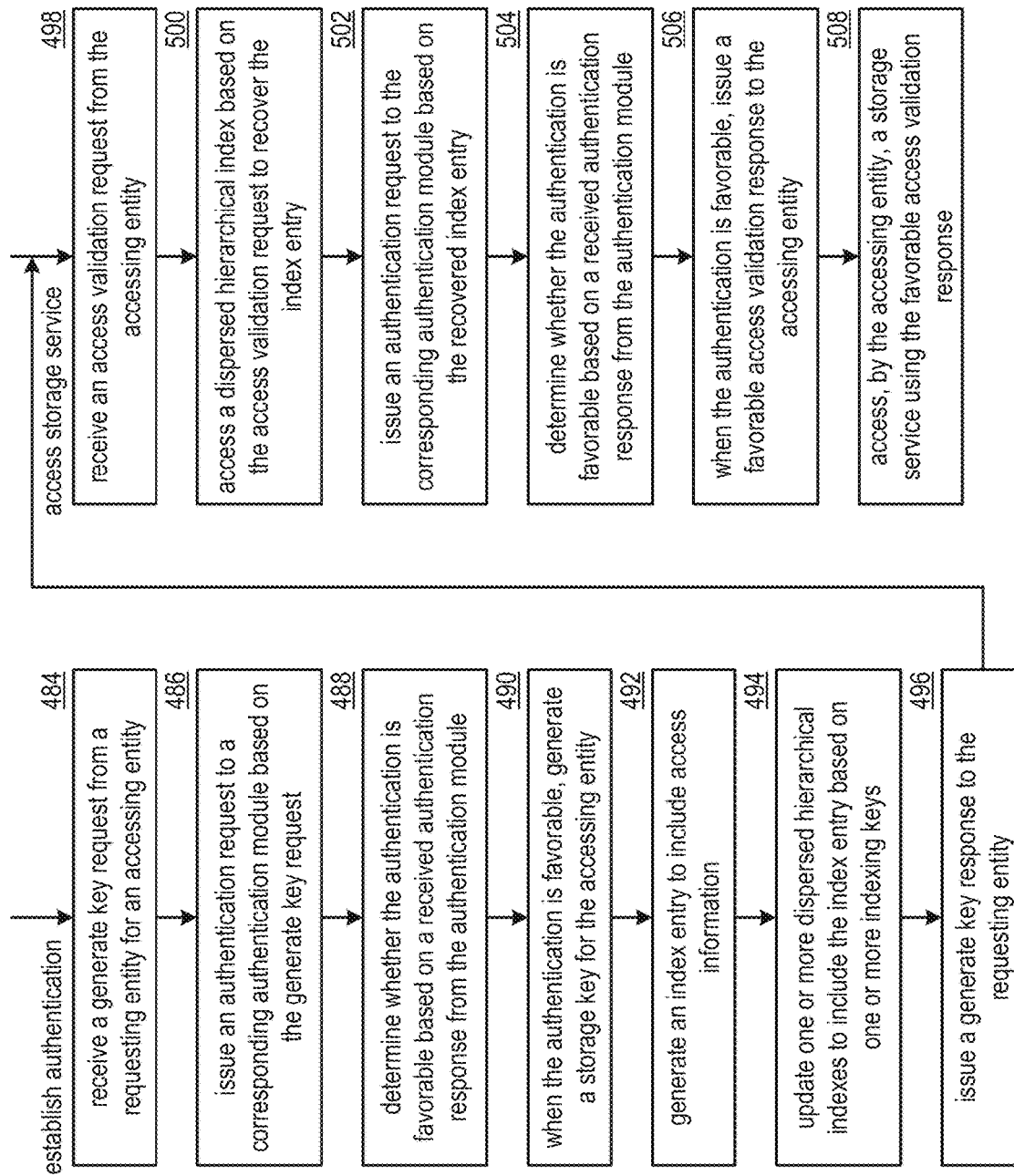
Figure 44A:
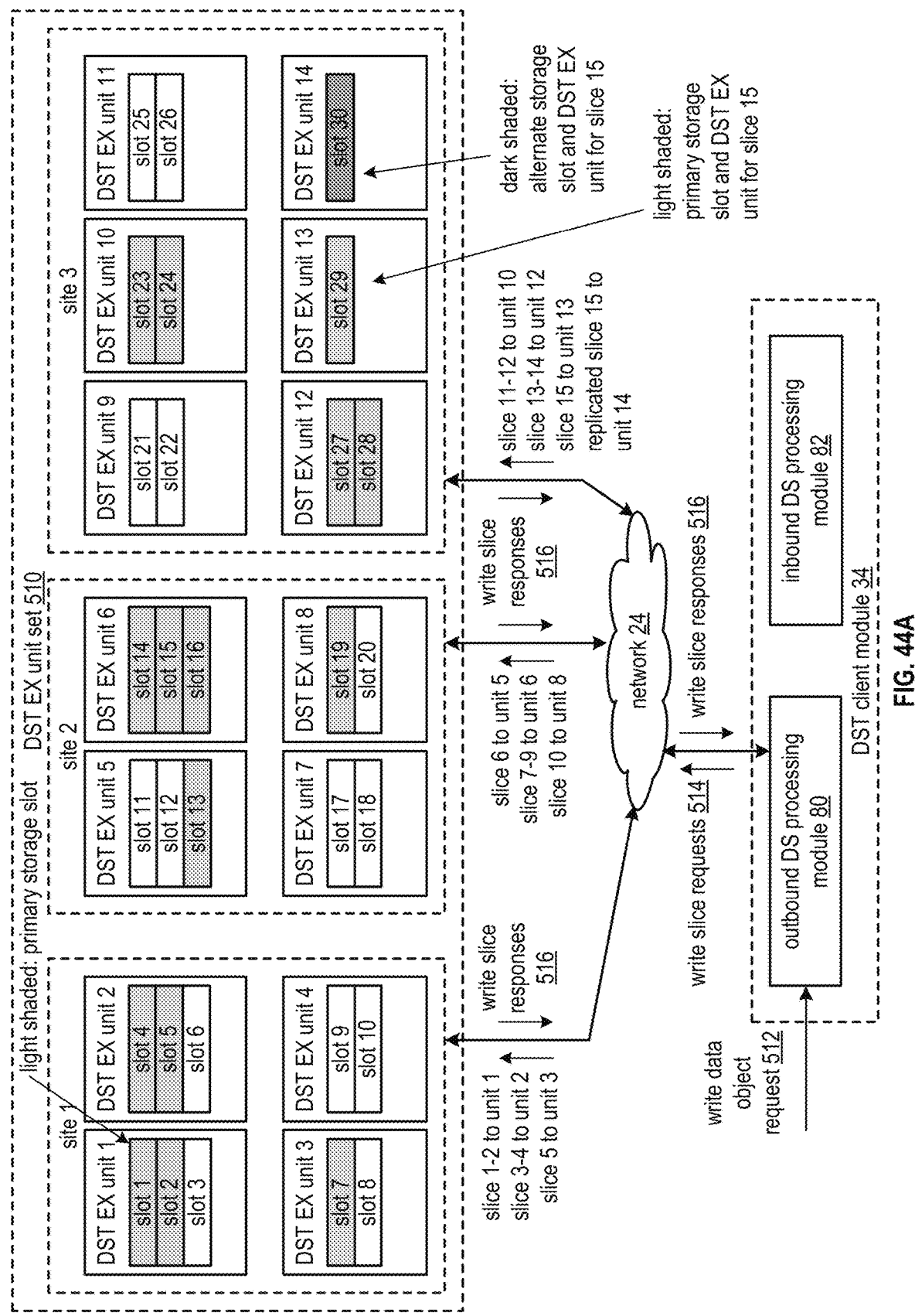
Figure 44B:
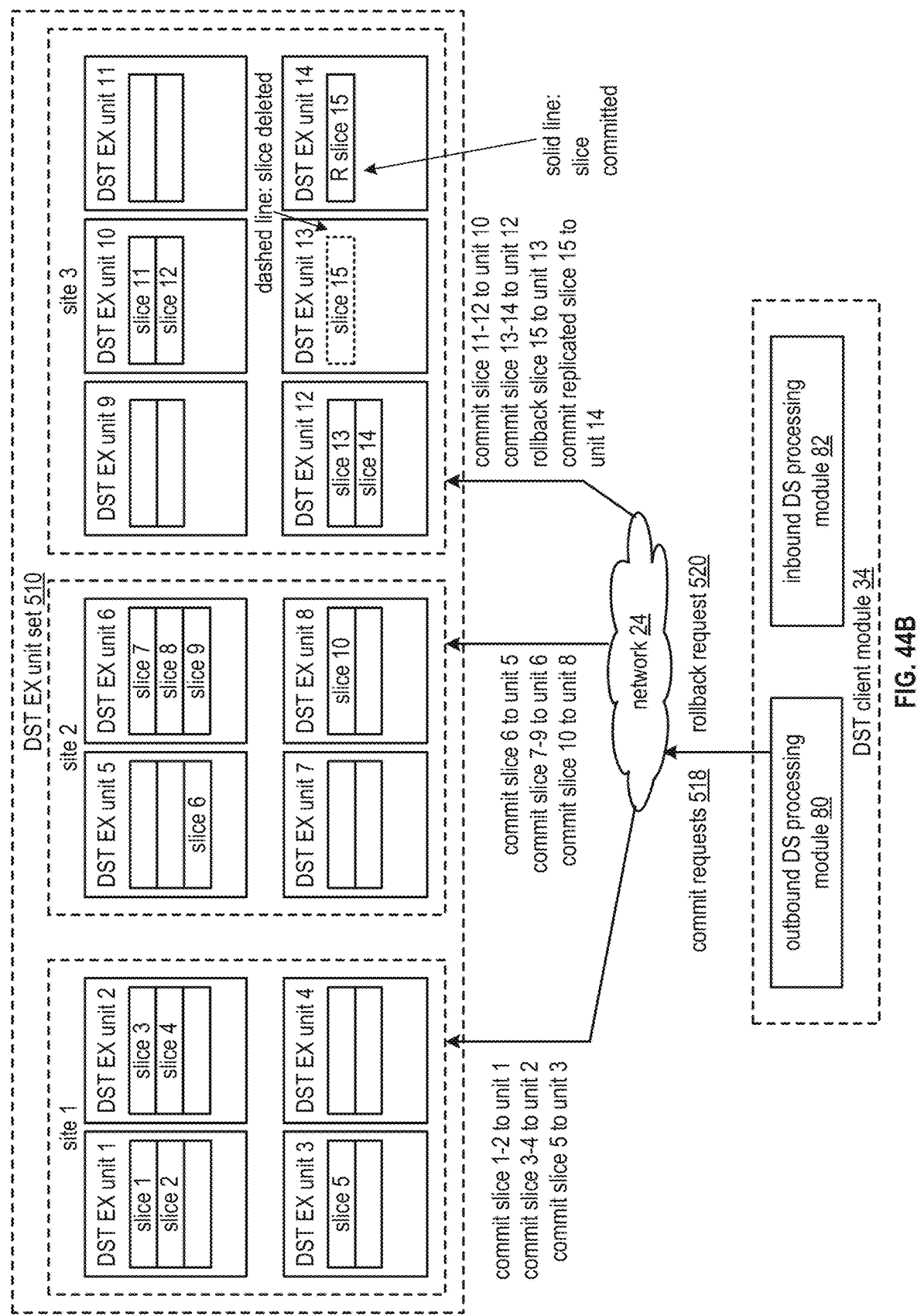
Figure 44C:
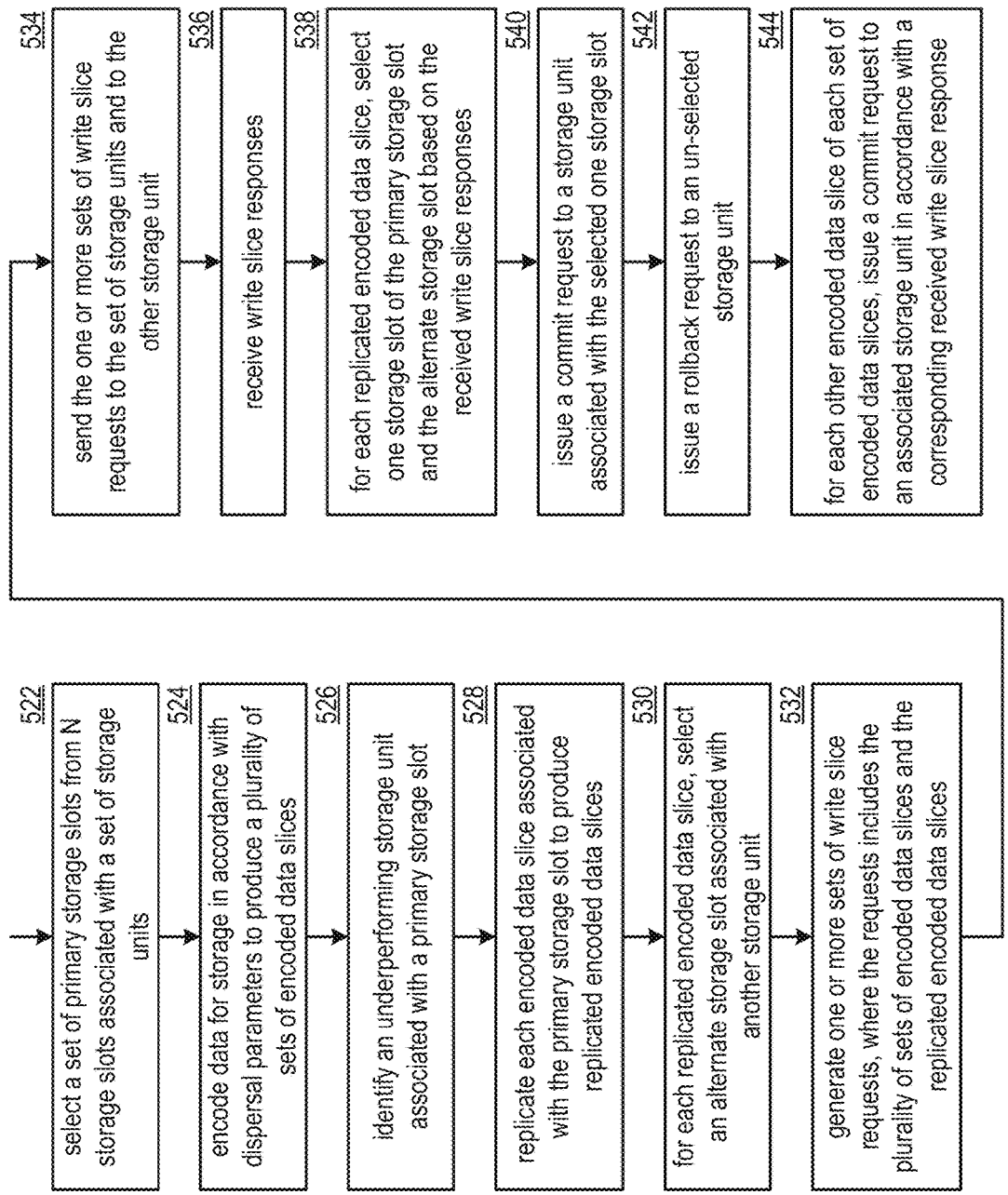
Figure 45A:
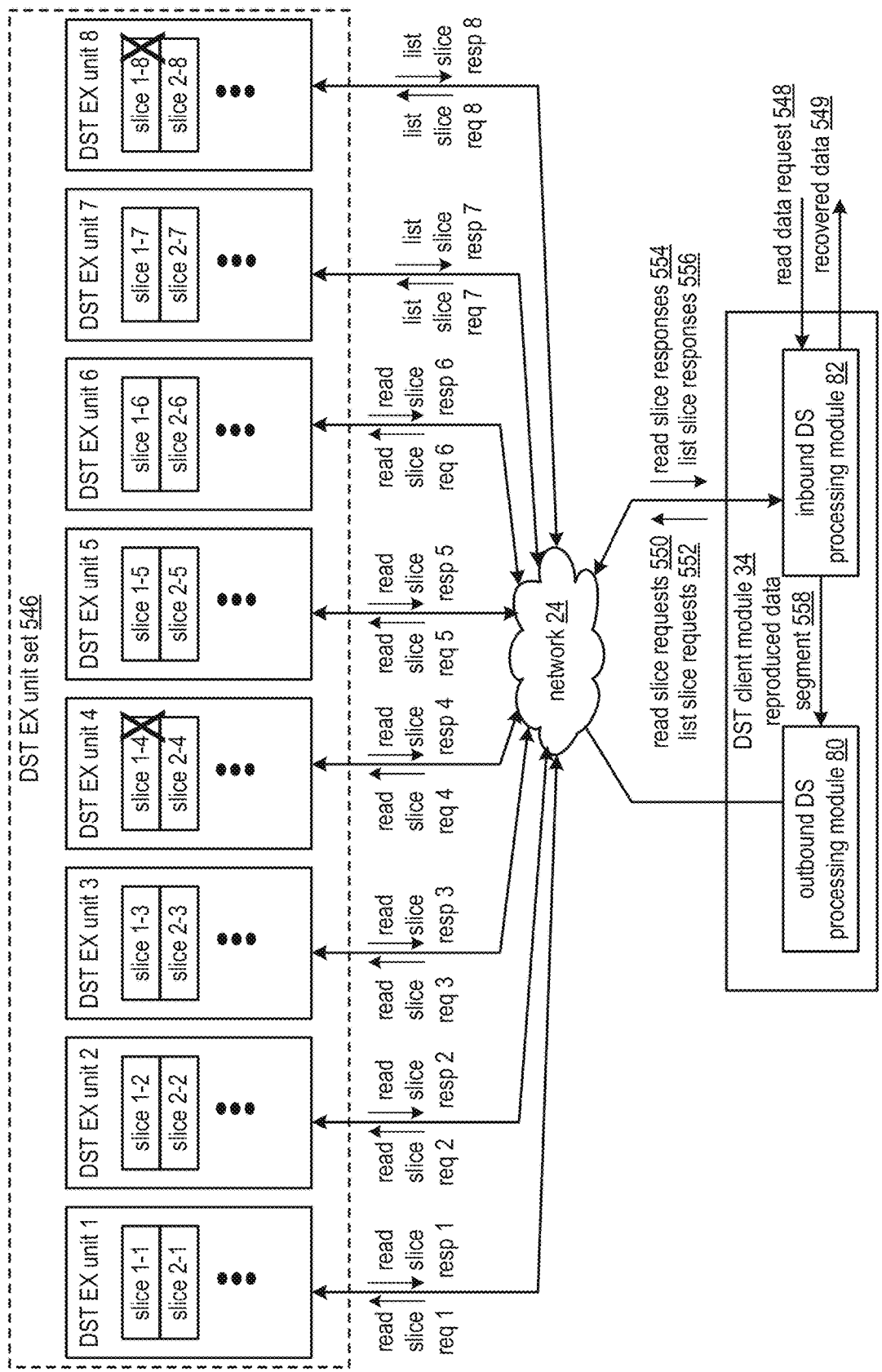
Figure 45B:
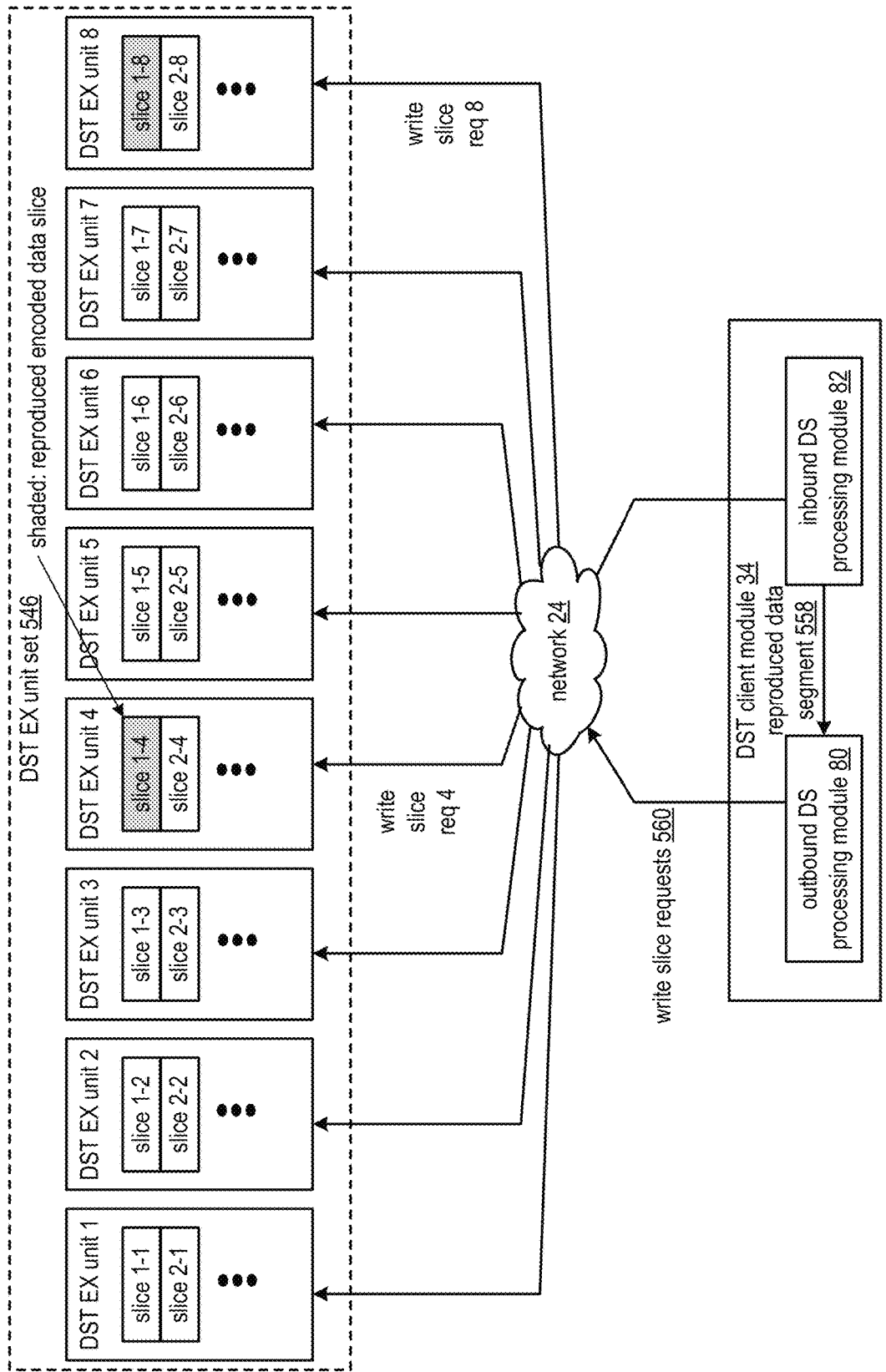
Figure 46A:
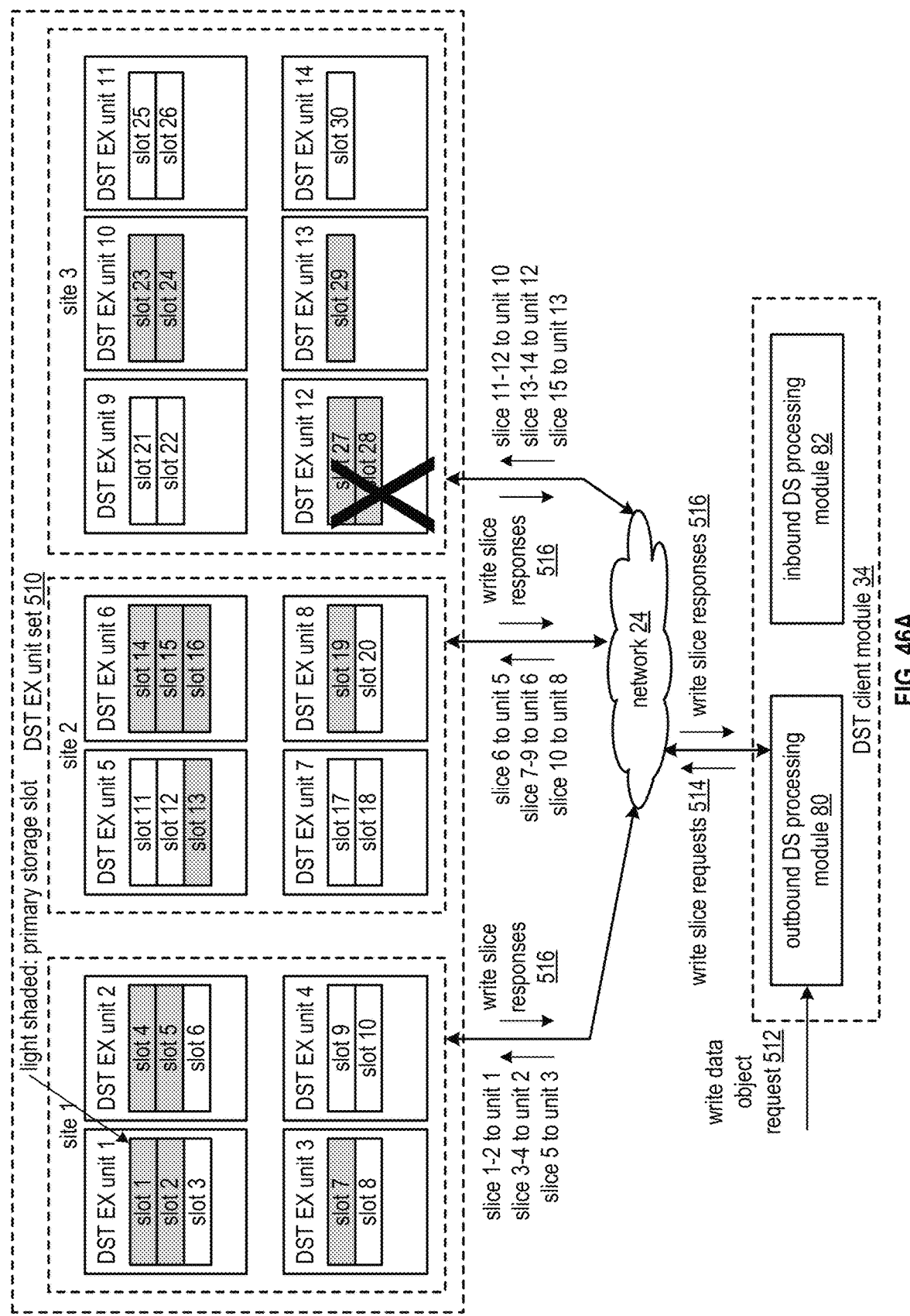
Figure 46B:
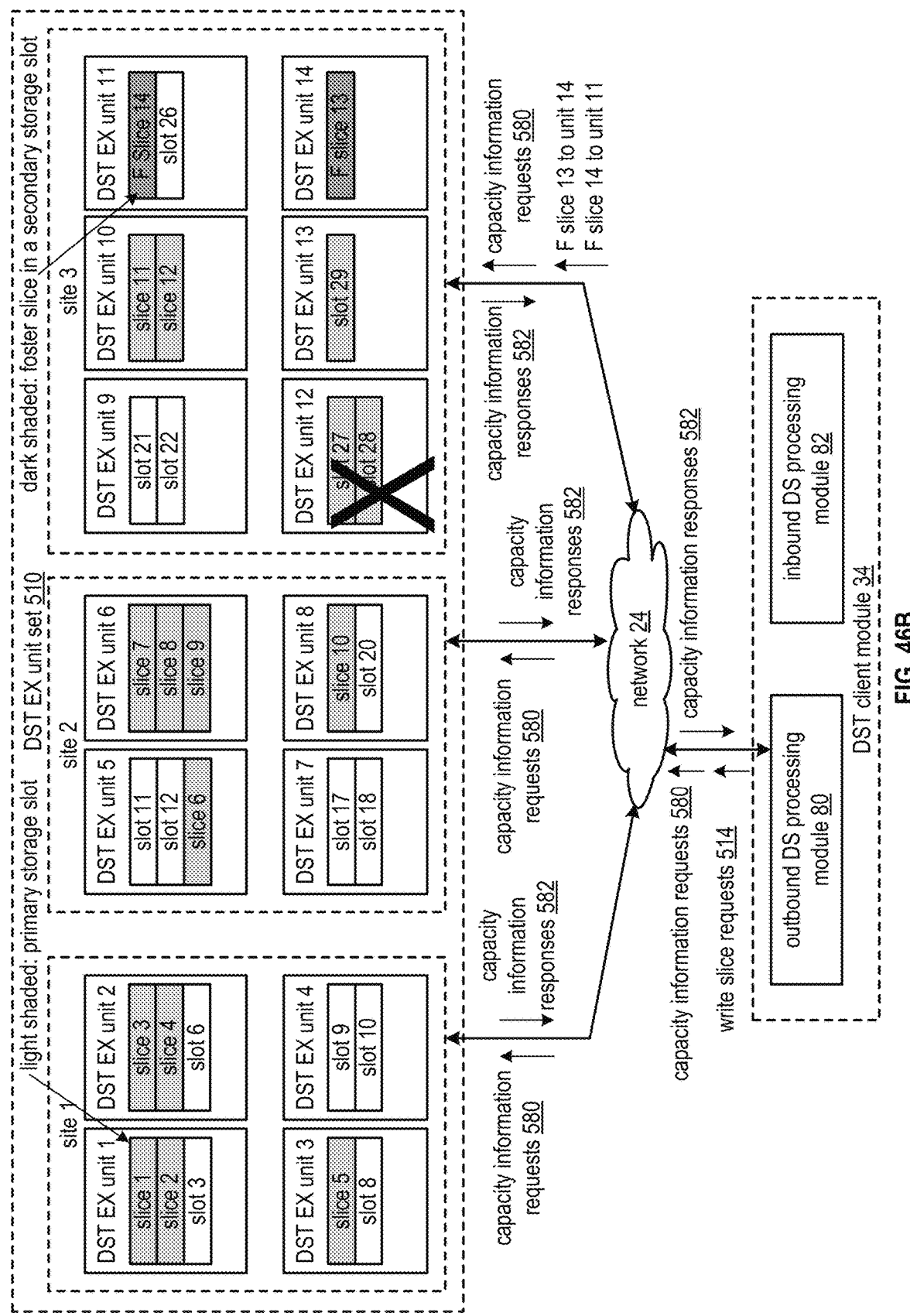
Figure 47A:
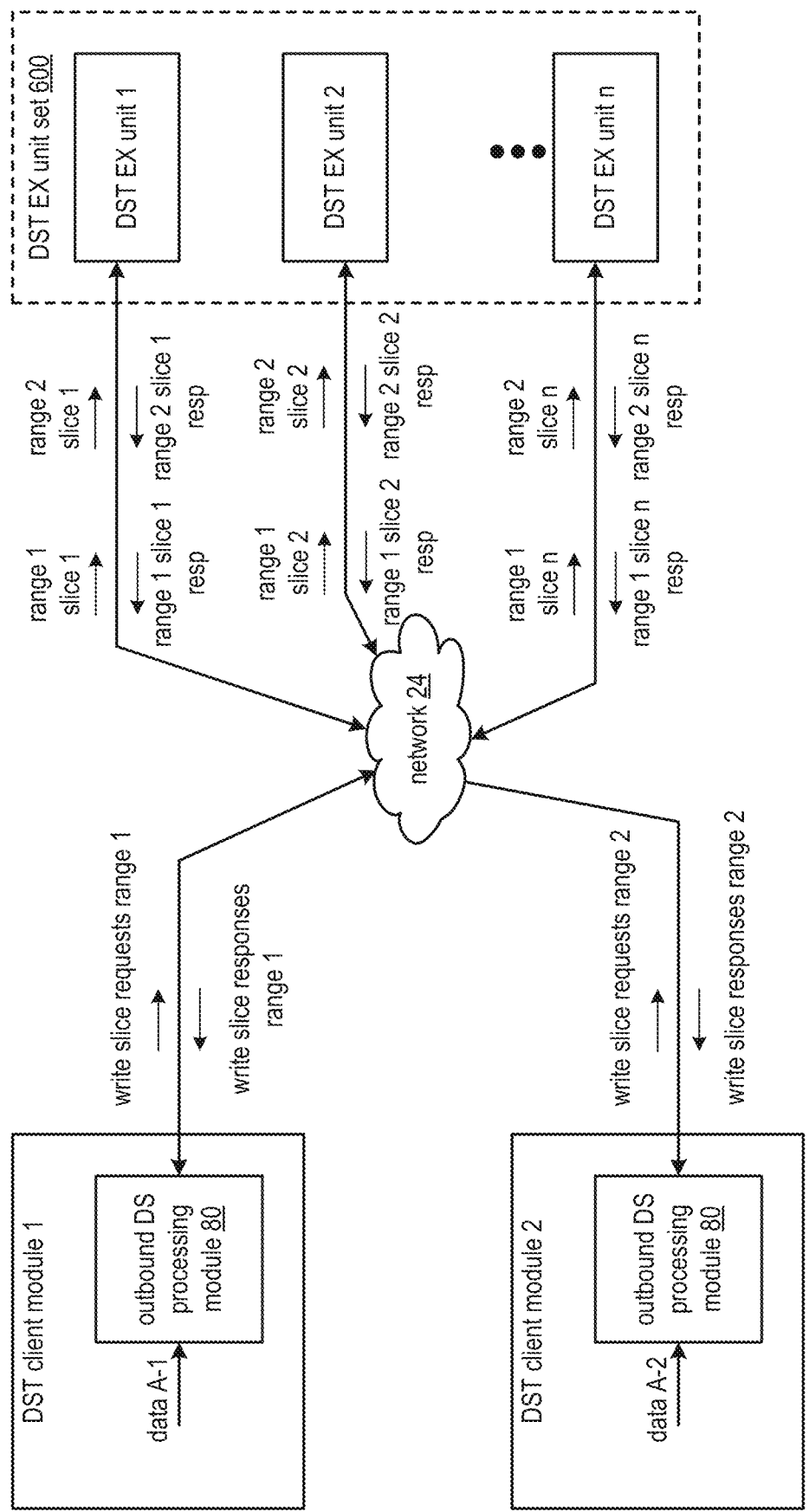
Figure 48A:
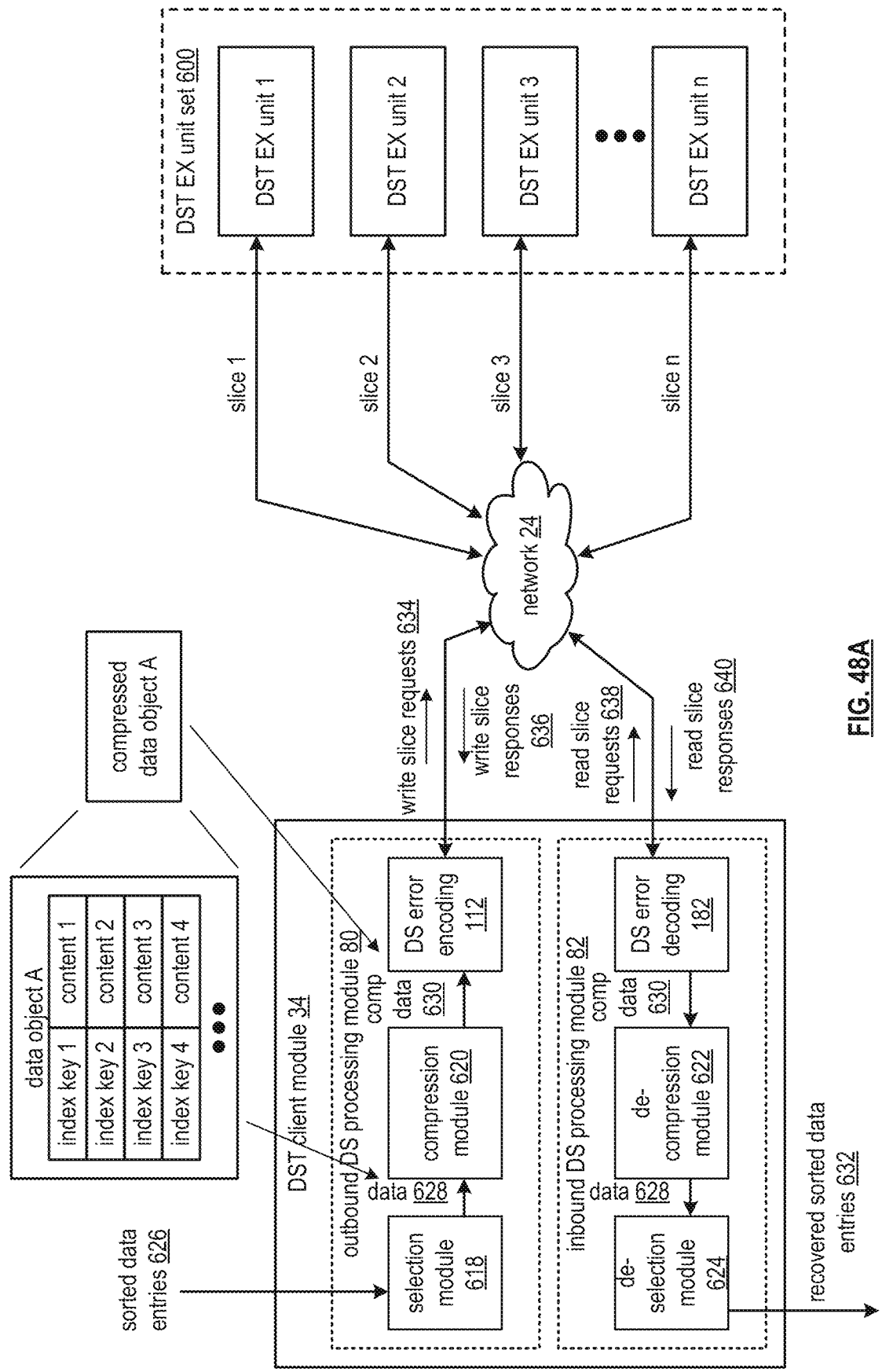
Figure 48B:
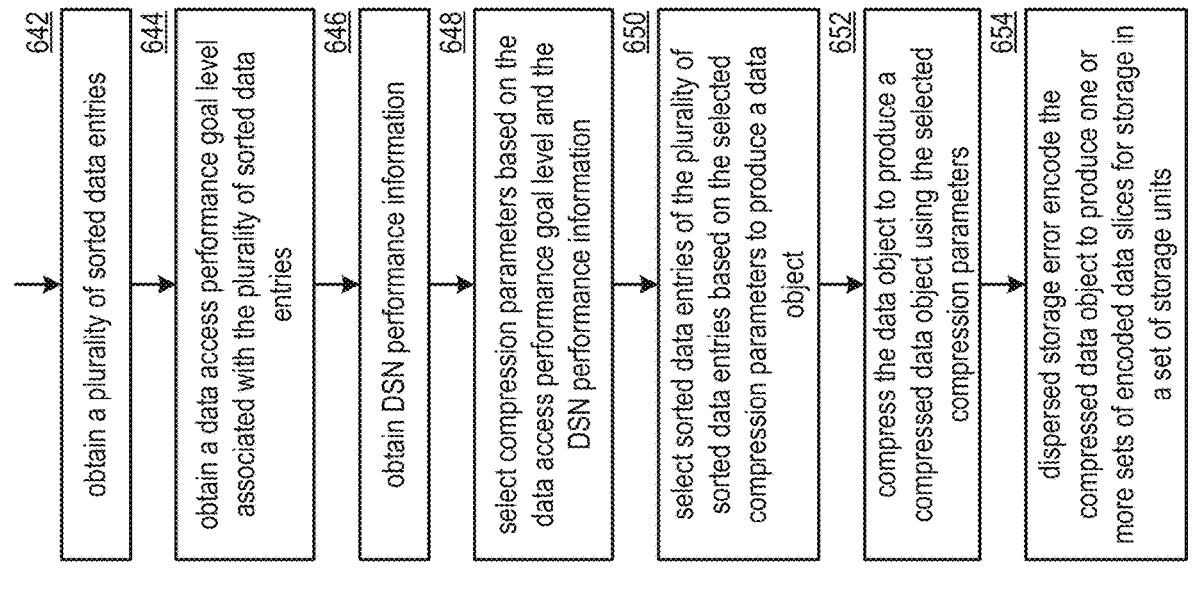

FIGS. 40A-B are schematic block diagrams of an embodiment of a dispersed storage network (DSN) illustrating an example of executing tasks in accordance with the present invention;

FIG. 40C is a flowchart illustrating an example of executing tasks in accordance with the present invention;

FIGS. 41A, G, and H are schematic block diagrams of another embodiment of a dispersed storage network (DSN) in accordance with the present invention;

FIG. 41B is a diagram illustrating an example of encoding a concatenated object into a plurality of data blocks in accordance with the present invention;

FIG. 41C is a diagram illustrating an example of matrix multiplication of an encoding matrix and a data matrix using a dispersed storage error coding function to produce a coded matrix in accordance with the present invention;

FIG. 41D is a diagram illustrating another example of matrix multiplication of an encoding matrix and a data matrix using a dispersed storage error coding function to produce a coded matrix in accordance with the present invention;

FIG. 41E is a diagram illustrating another example of matrix multiplication of an encoding matrix and a data matrix using a dispersed storage error coding function to produce a coded matrix in accordance with the present invention;

FIG. 41F is a diagram illustrating an example of mapping data objects to a concatenated object in accordance with the present invention;

FIG. 41I is a flowchart illustrating an example of concatenating data objects for storage in accordance with the present invention;

FIGS. 42A-B are schematic block diagrams of another embodiment of a dispersed storage network (DSN) illustrating an example of storing data in accordance with the present invention;

FIG. 42C is a schematic block diagram of another embodiment of a dispersed storage network (DSN) illustrating an example of retrieving data in accordance with the present invention;

FIG. 42D is a flowchart illustrating another example of accessing data in accordance with the present invention;

FIG. 43A is a schematic block diagram of an embodiment of a storage service access system in accordance with the present invention;

FIG. 43B is a flowchart illustrating an example of authentication access to a storage service in accordance with the present invention;

FIGS. 44A-B are schematic block diagrams of another embodiment of a dispersed storage network (DSN) illustrating another example of storing data in accordance with the present invention;

FIG. 44C is a flowchart illustrating another example of storing data in accordance with the present invention;

FIGS. 45A-B are schematic block diagrams of another embodiment of a dispersed storage network (DSN) illustrating an example of rebuilding stored data in accordance with the present invention;

FIG. 45C is a flowchart illustrating an example of rebuilding stored data in accordance with the present invention;

FIGS. 46A-B are schematic block diagrams of another embodiment of a dispersed storage network (DSN) illustrating another example of storing data in accordance with the present invention;

FIG. 46C is a flowchart illustrating another example of storing data in accordance with the present invention;

FIG. 47A is a schematic block diagram of another embodiment of a dispersed storage network (DSN) in accordance with the present invention;

FIG. 47B is a flowchart illustrating an example of resolving write conflicts in accordance with the present invention;

FIG. 48A is a schematic block diagram of another embodiment of a dispersed storage network (DSN) in accordance with the present invention; and FIG. 48B is a flowchart illustrating an example of storing a plurality of correlated data in accordance with the present invention.

DETAILED DESCRIPTION OF THE INVENTION

Figure 1:
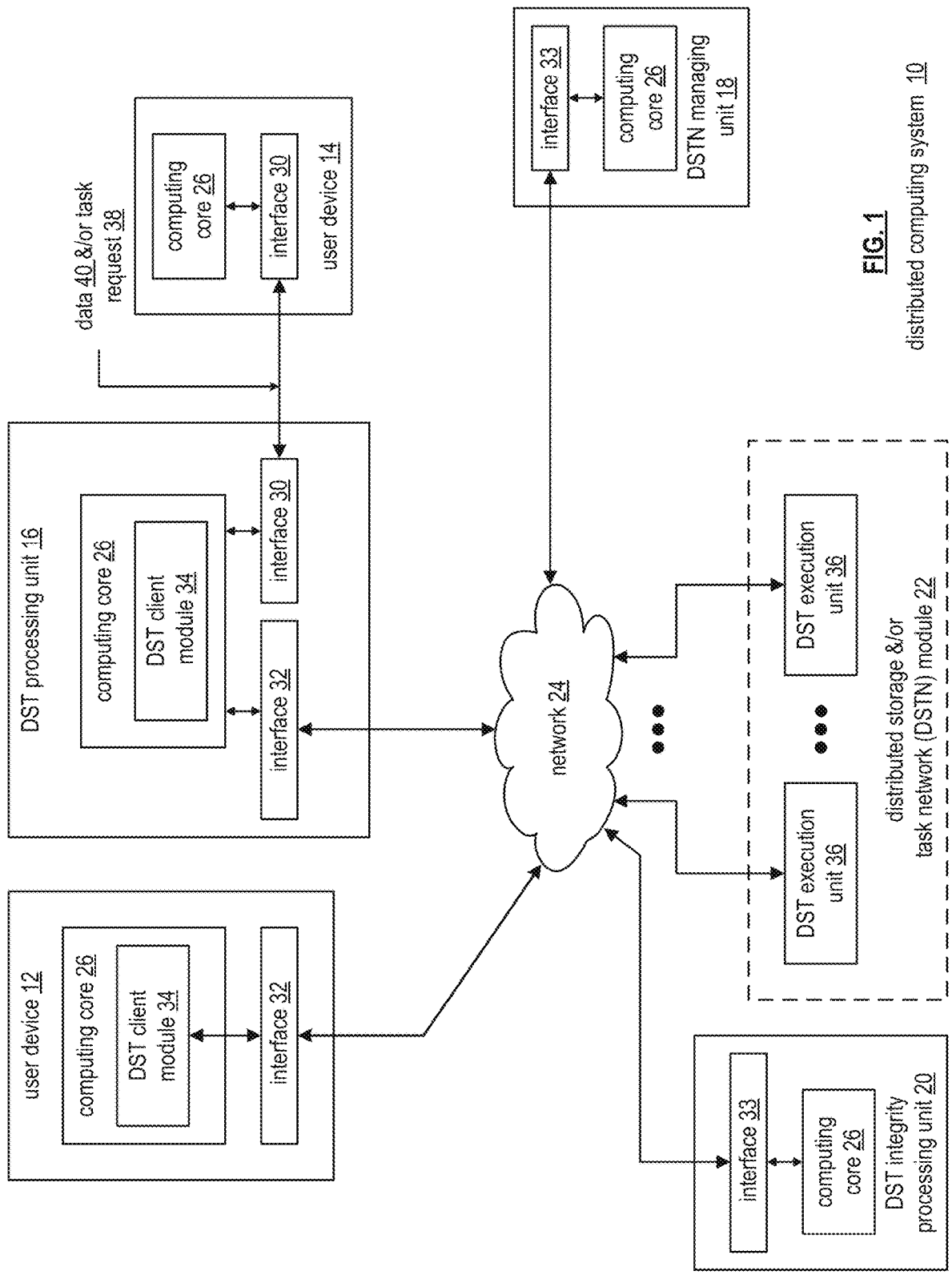
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public intern& systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
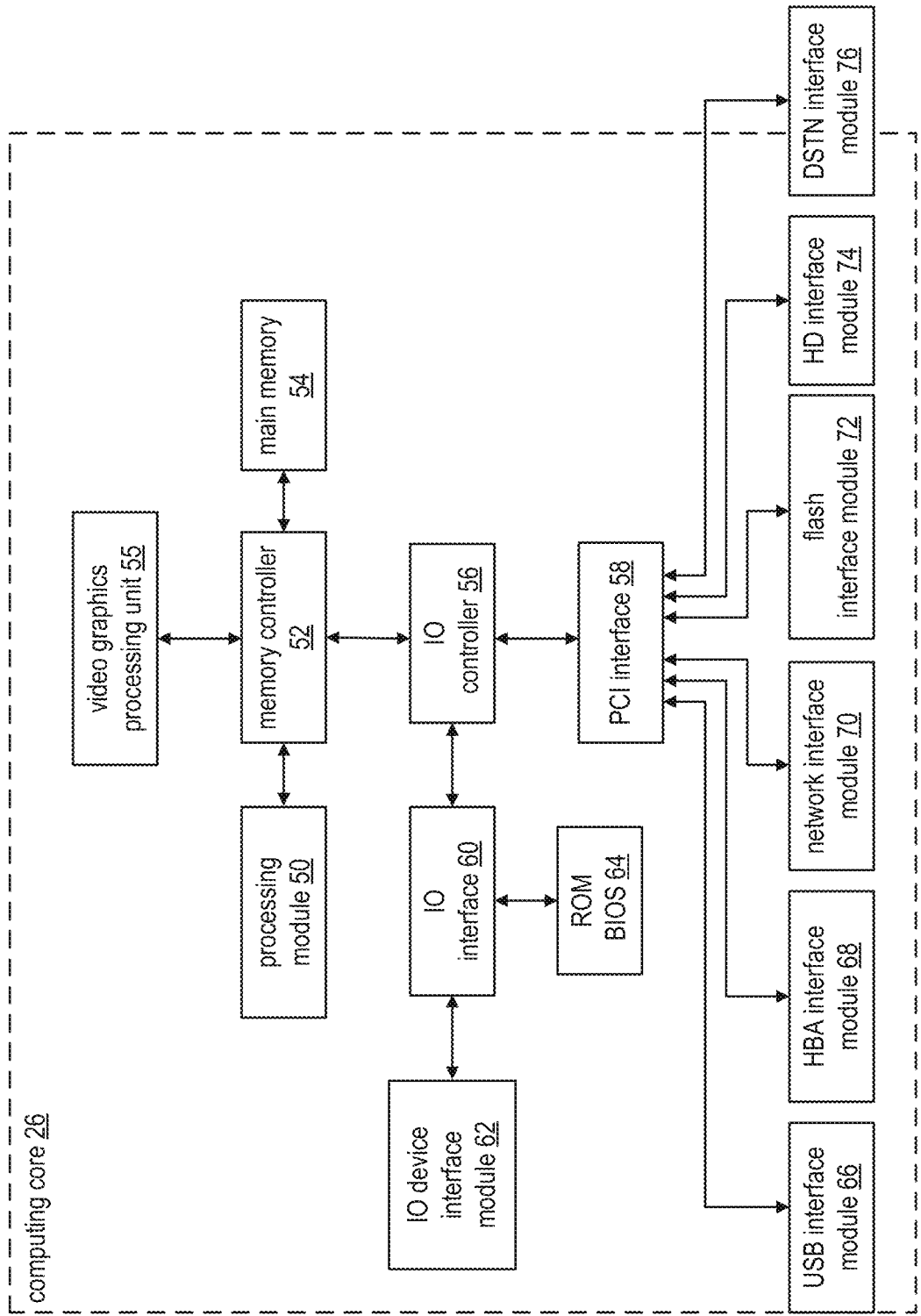
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an 10 interface module 60, at least one 10 device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the 10 device interface module 62 and/or the memory interface modules may be collectively or individually referred to as 10 ports.

Figure 3:
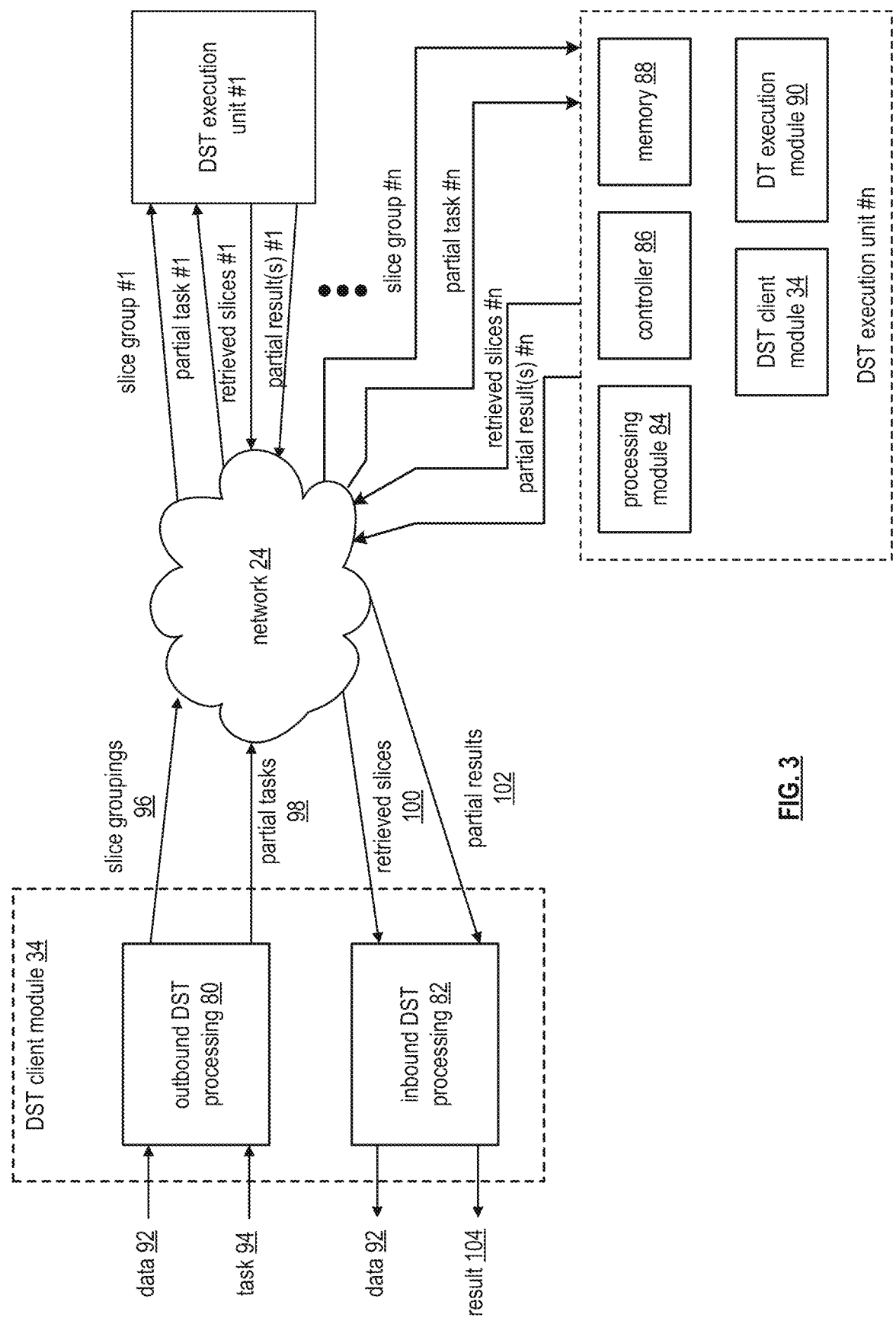
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-*n* that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
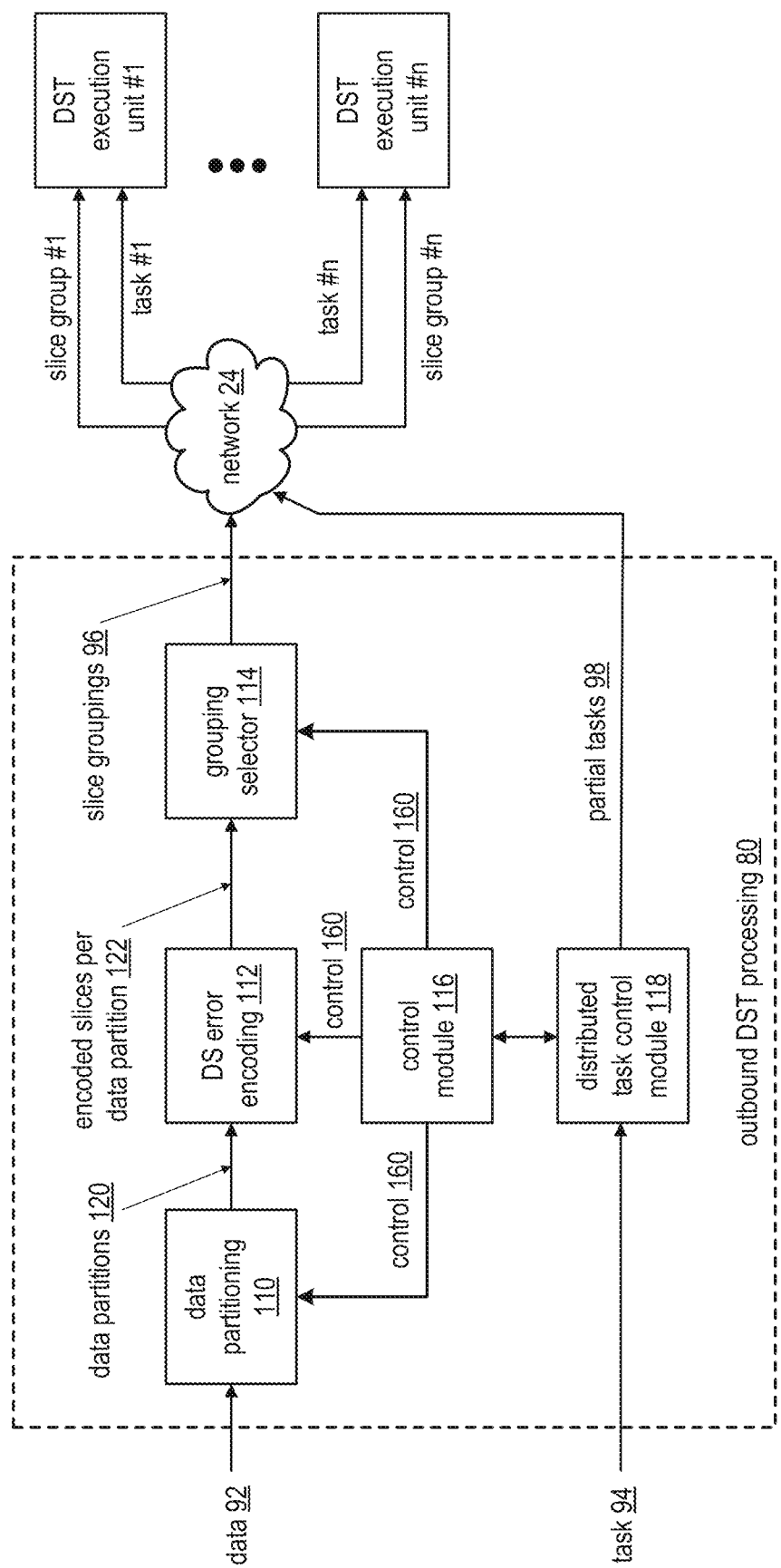
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
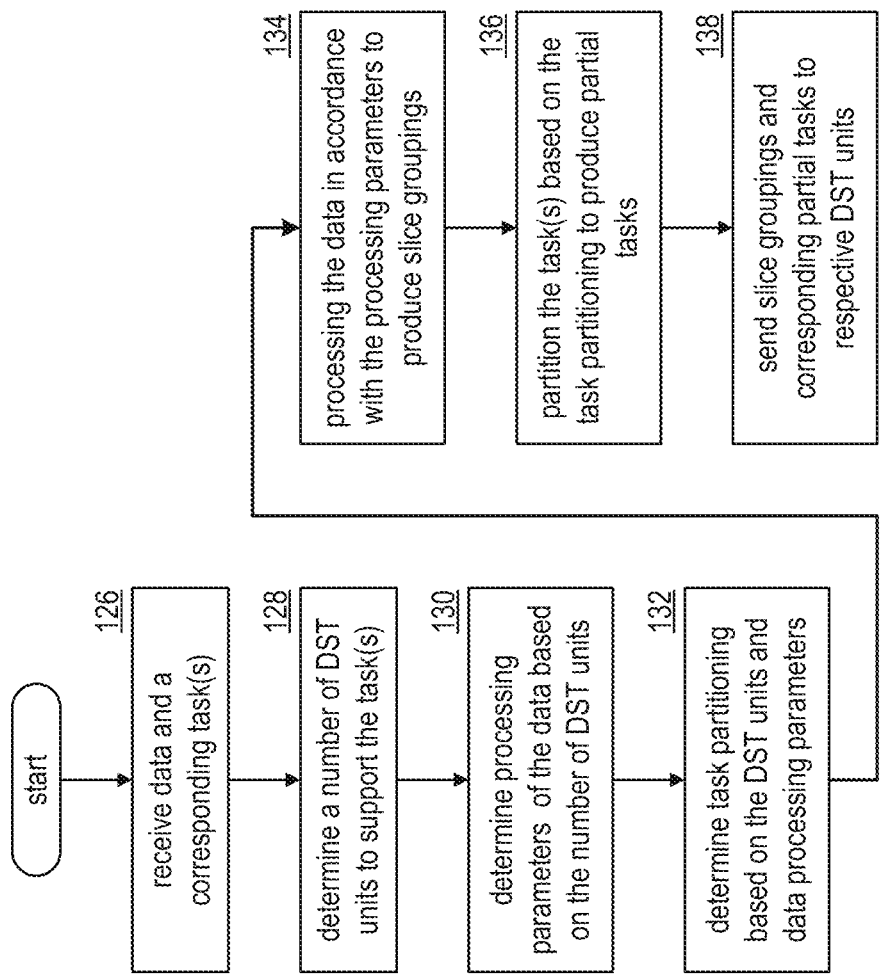
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
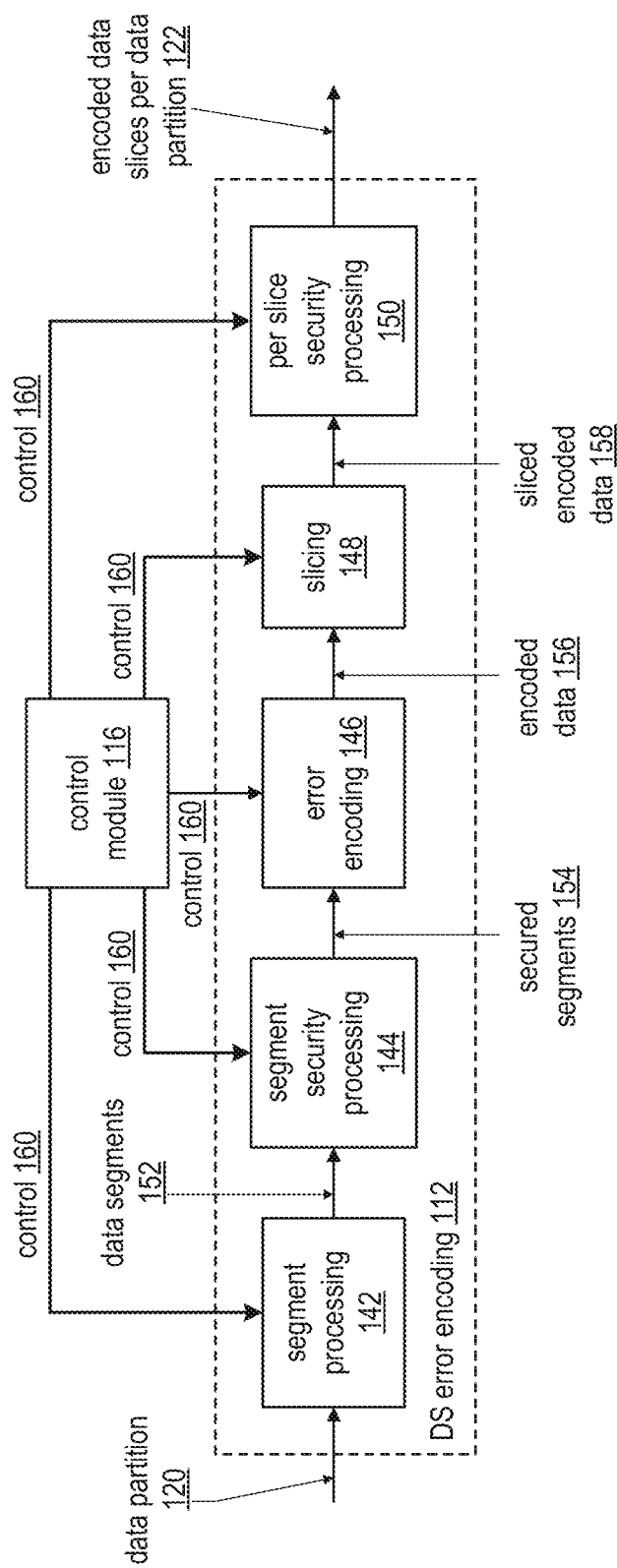
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158. The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
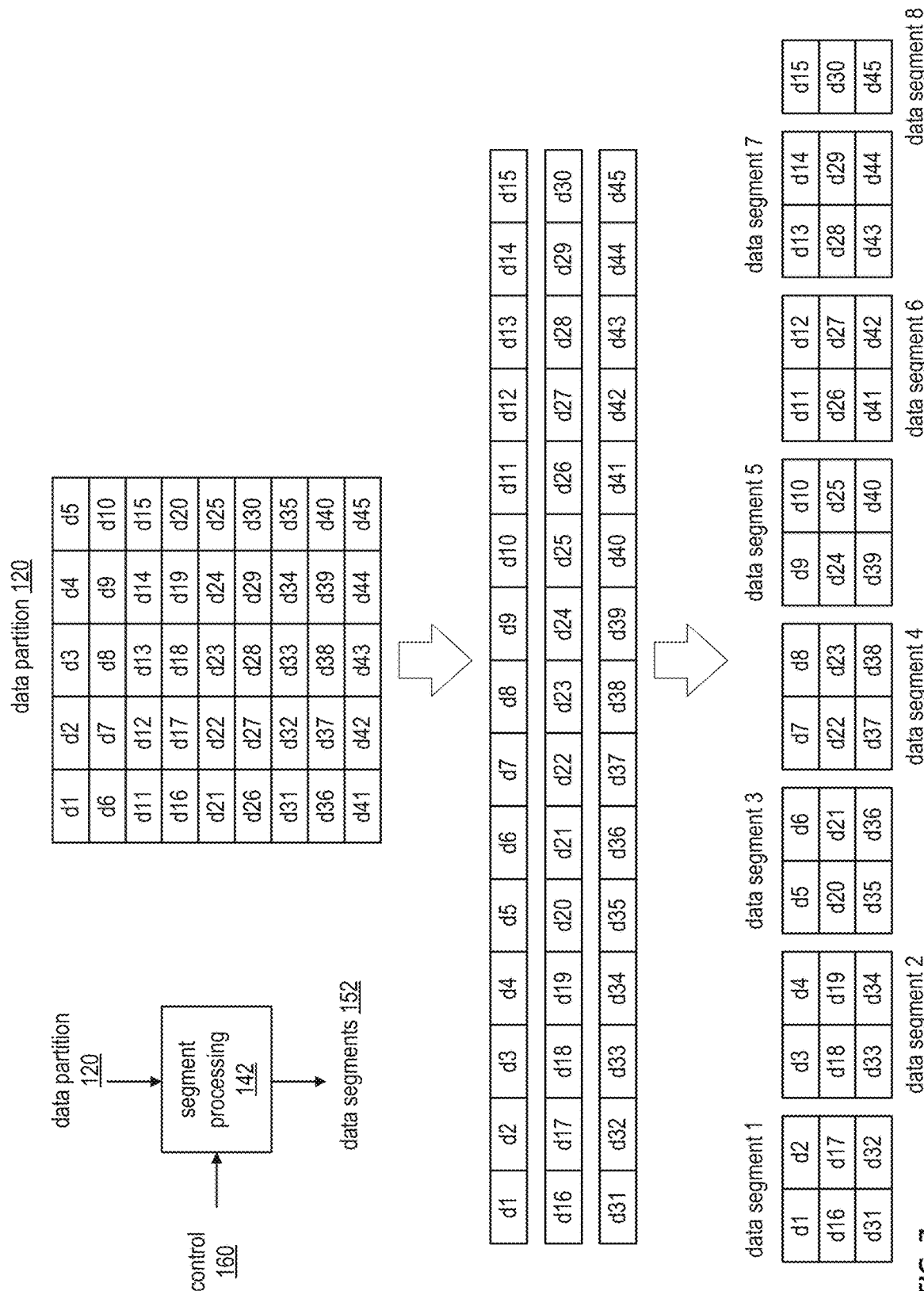
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
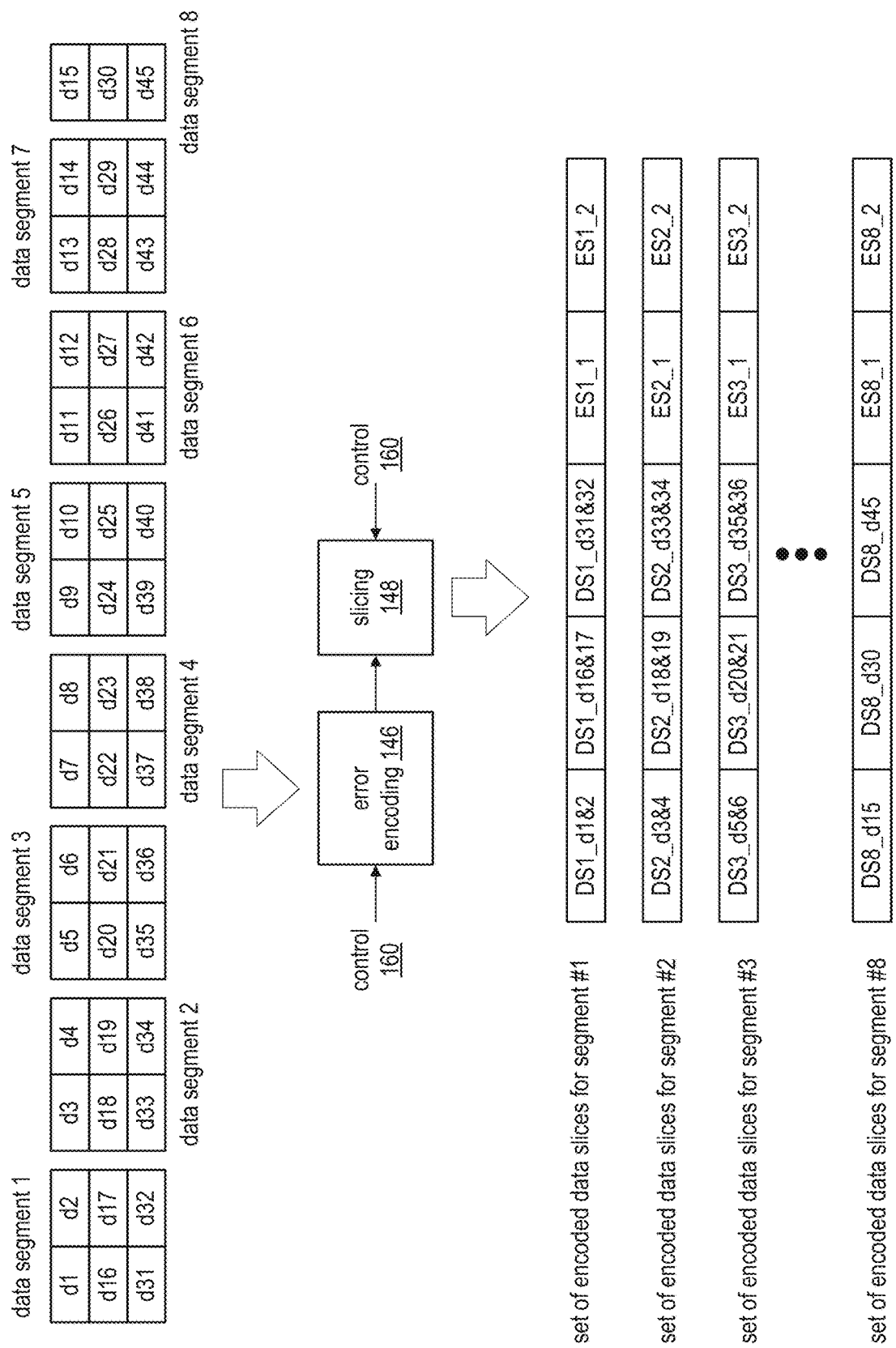
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
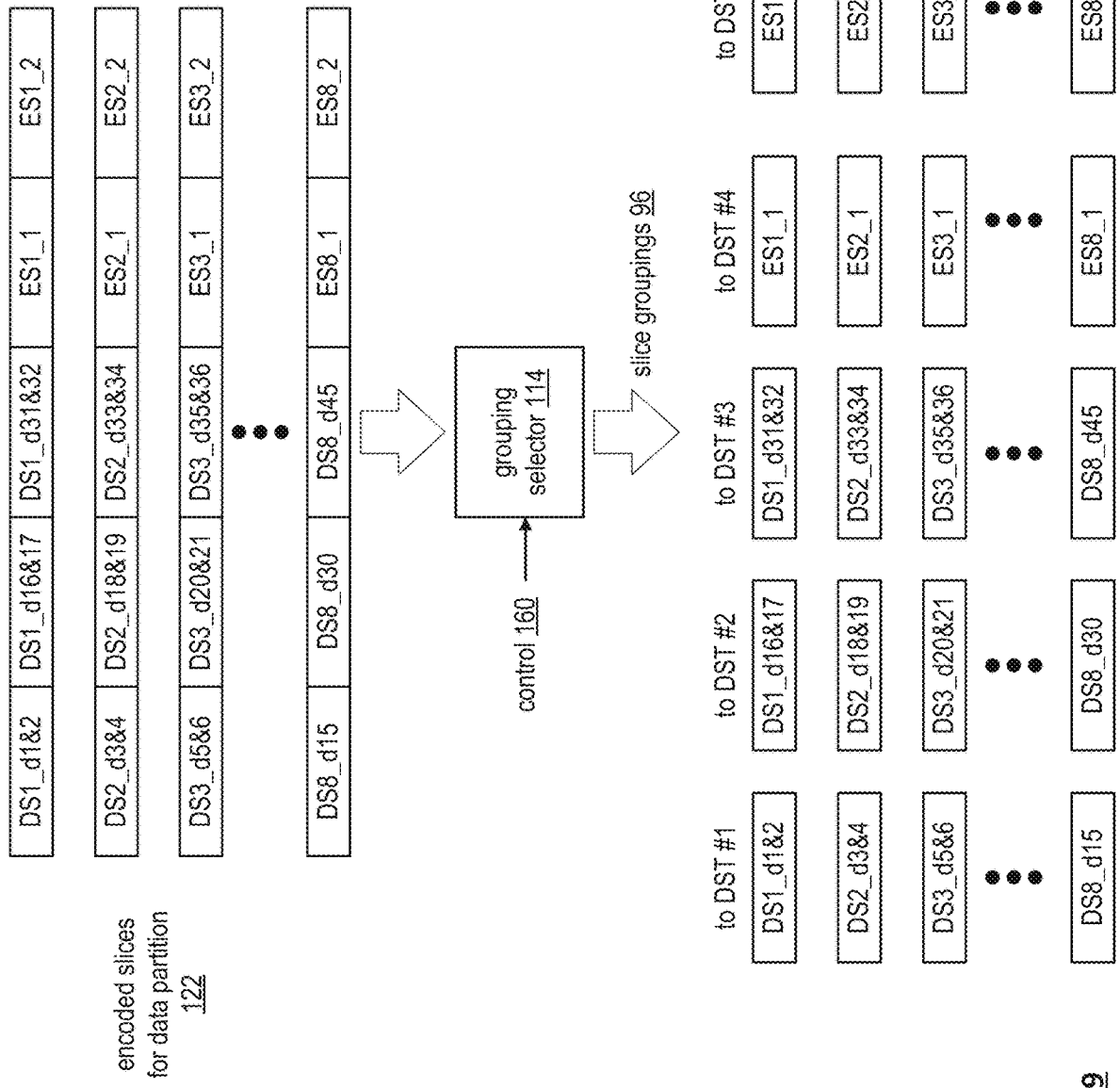
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with grouping selector information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
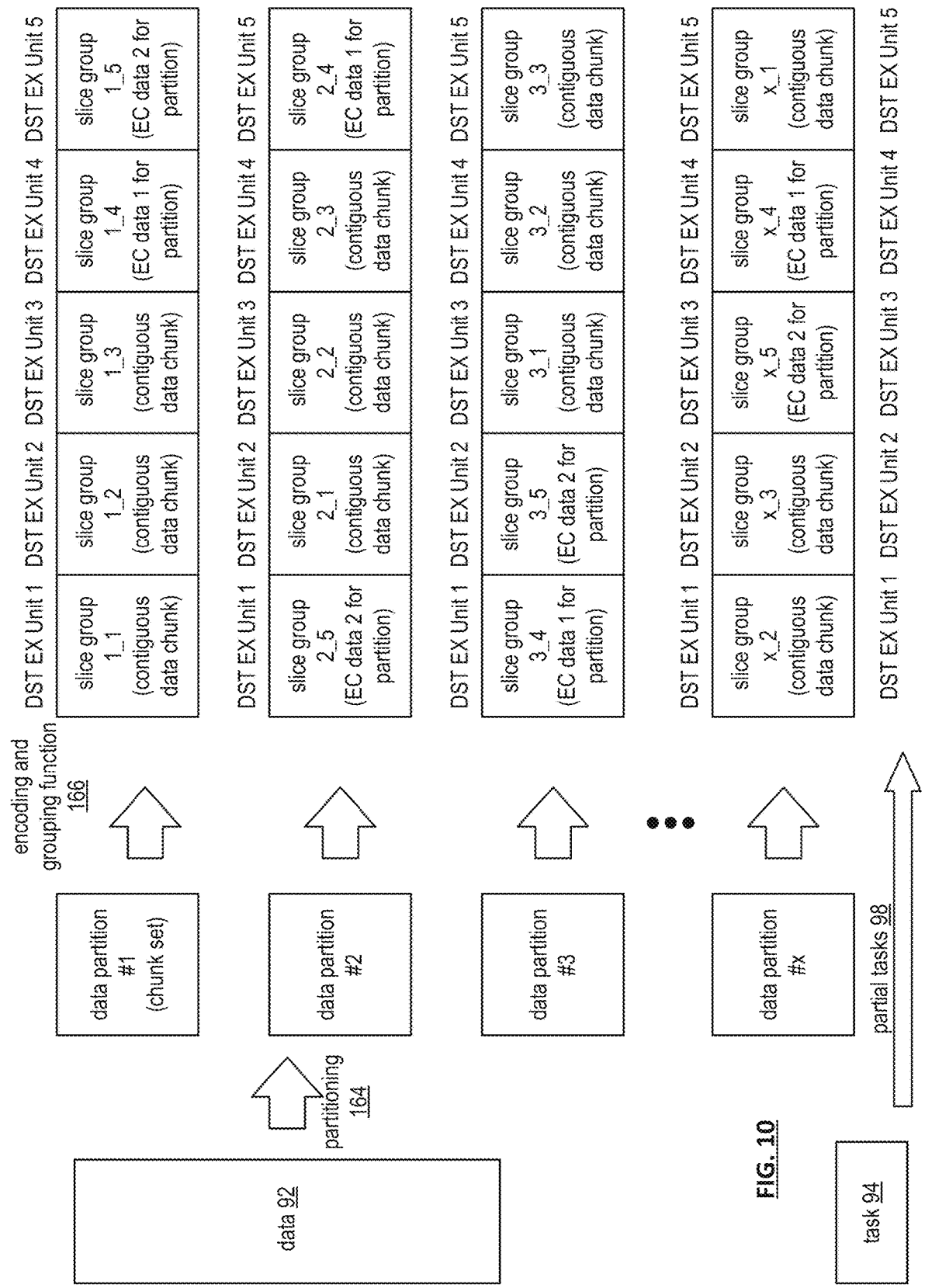
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
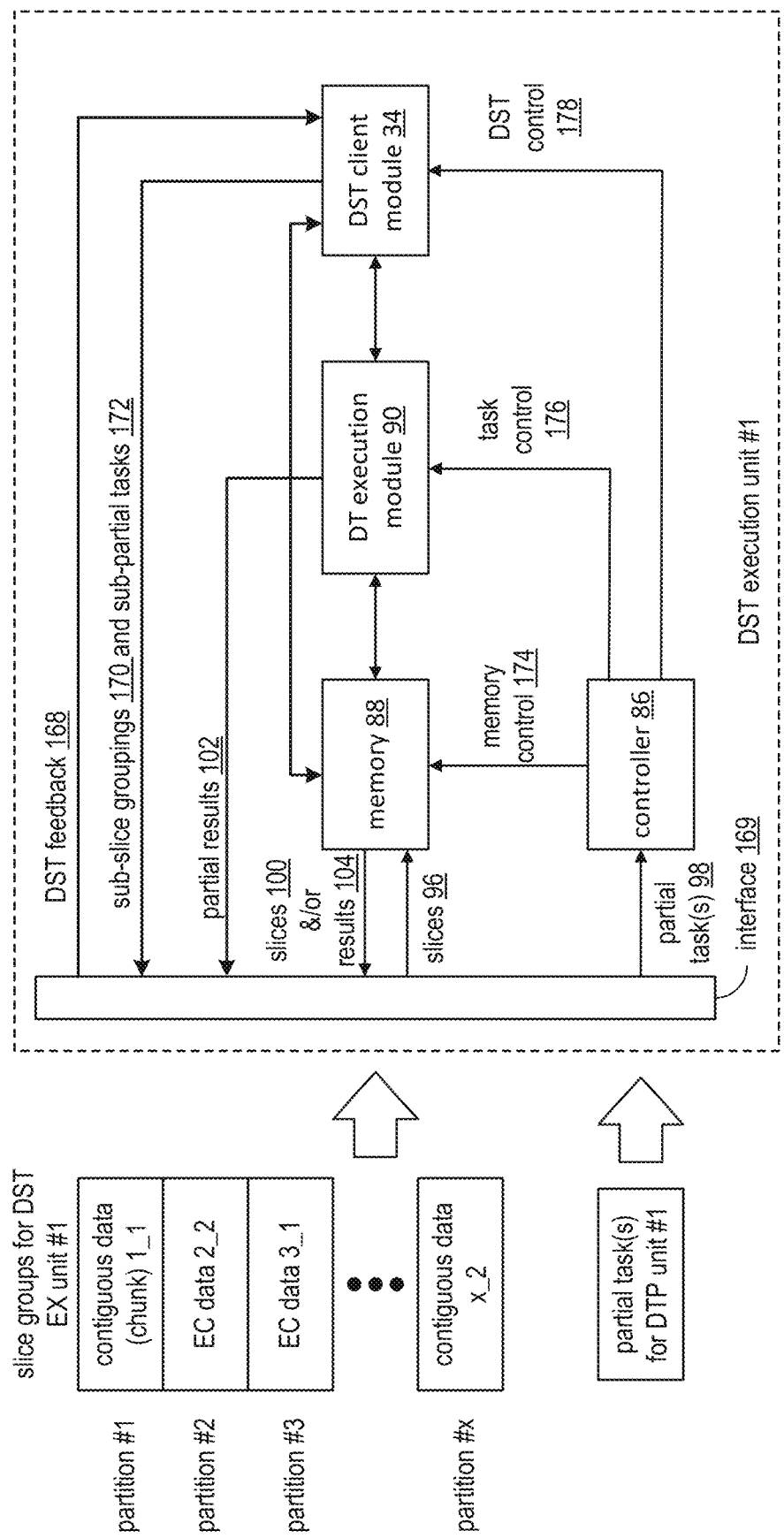
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
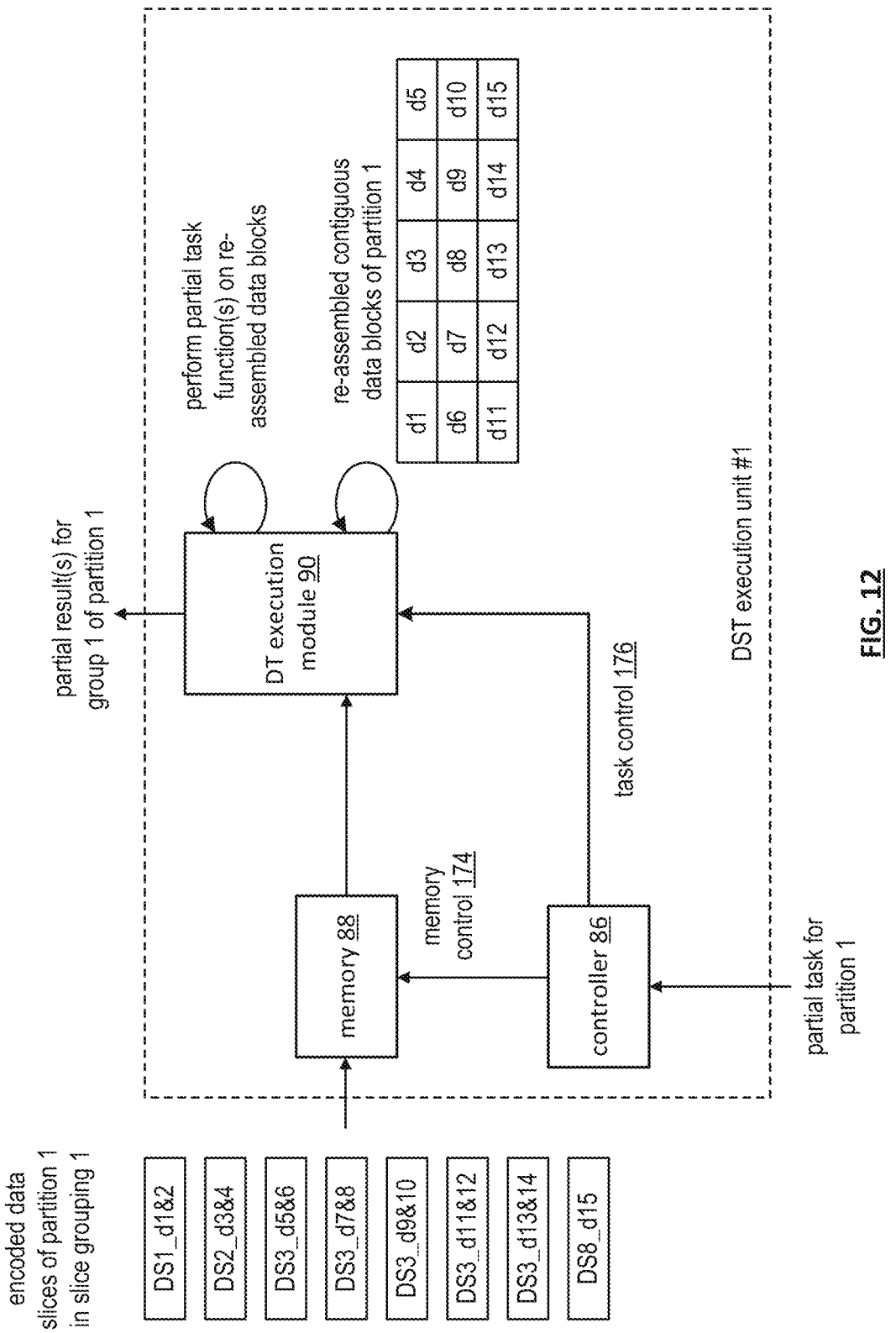
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
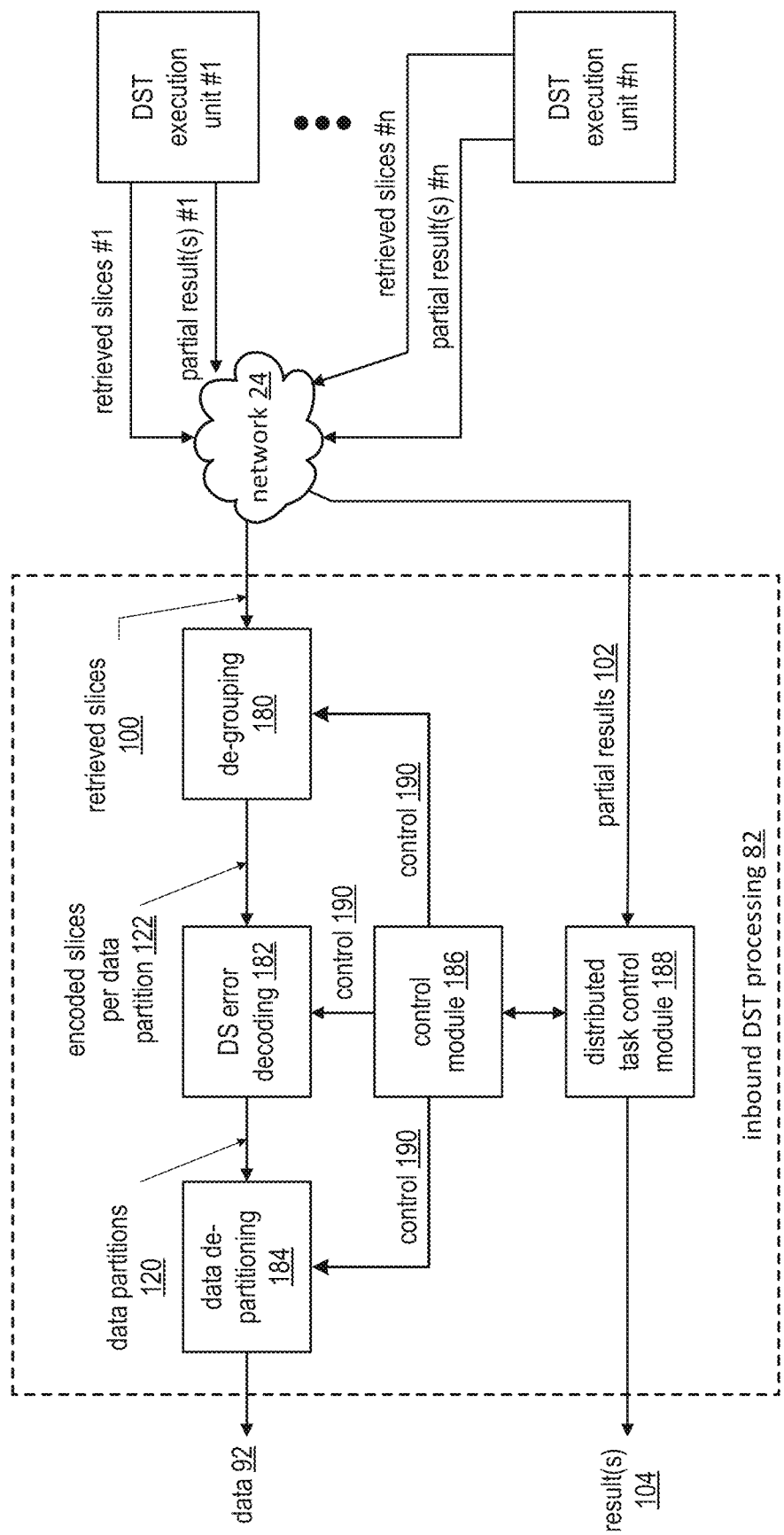
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
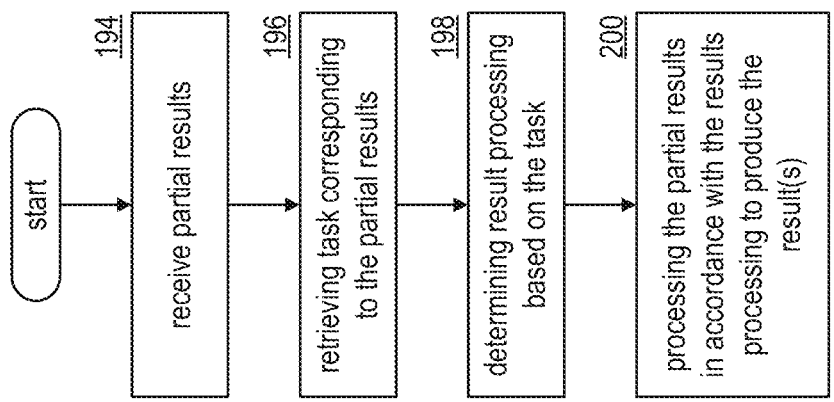
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
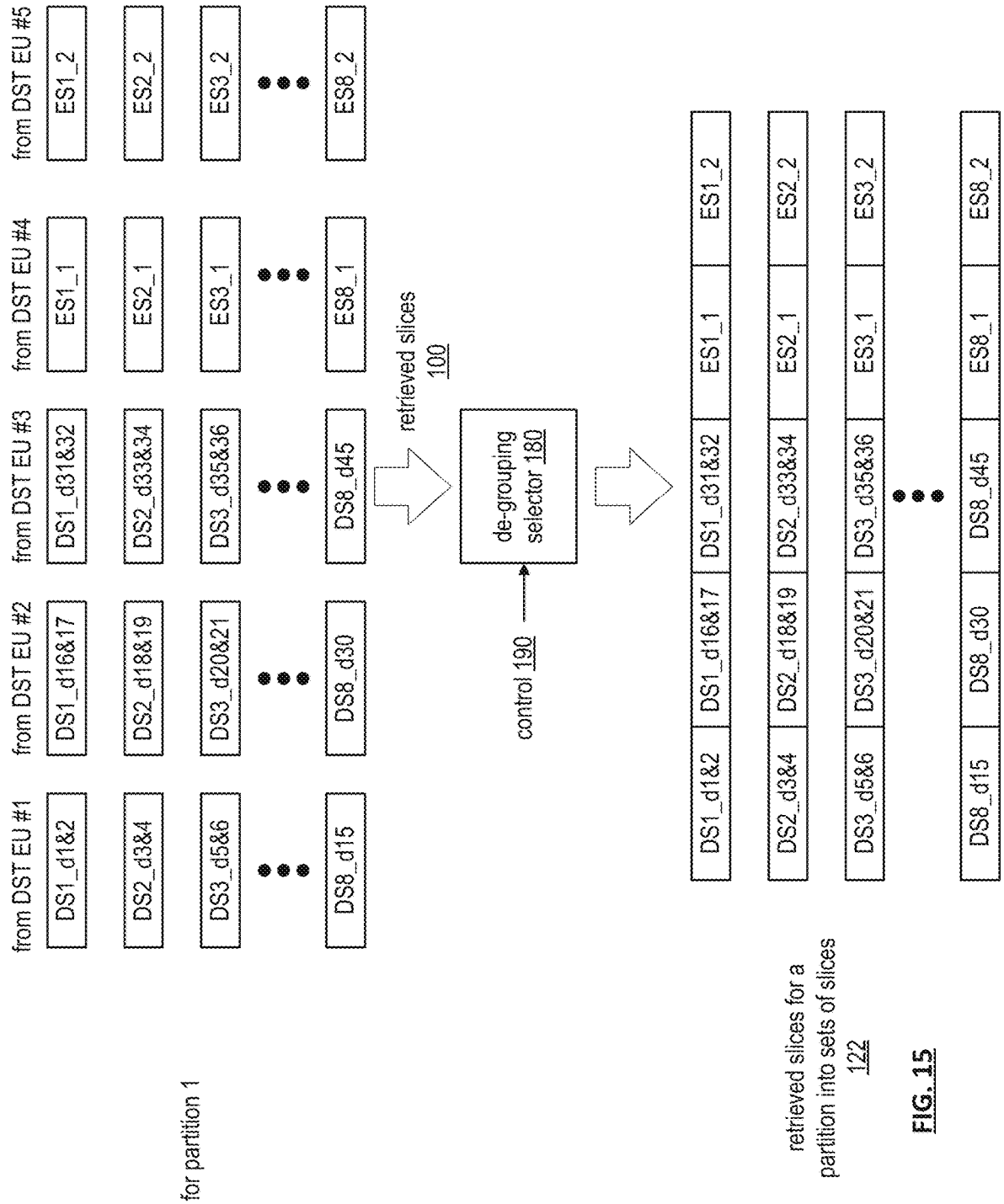
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
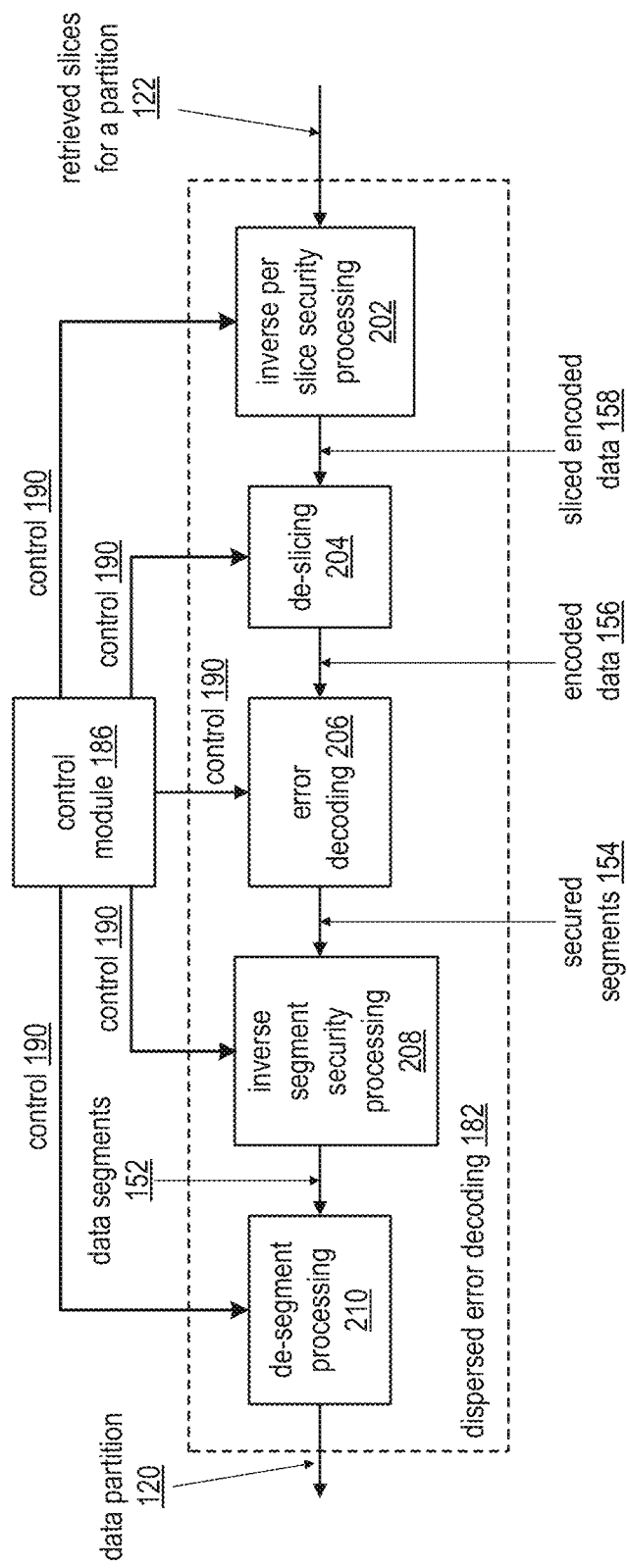
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is by-passed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
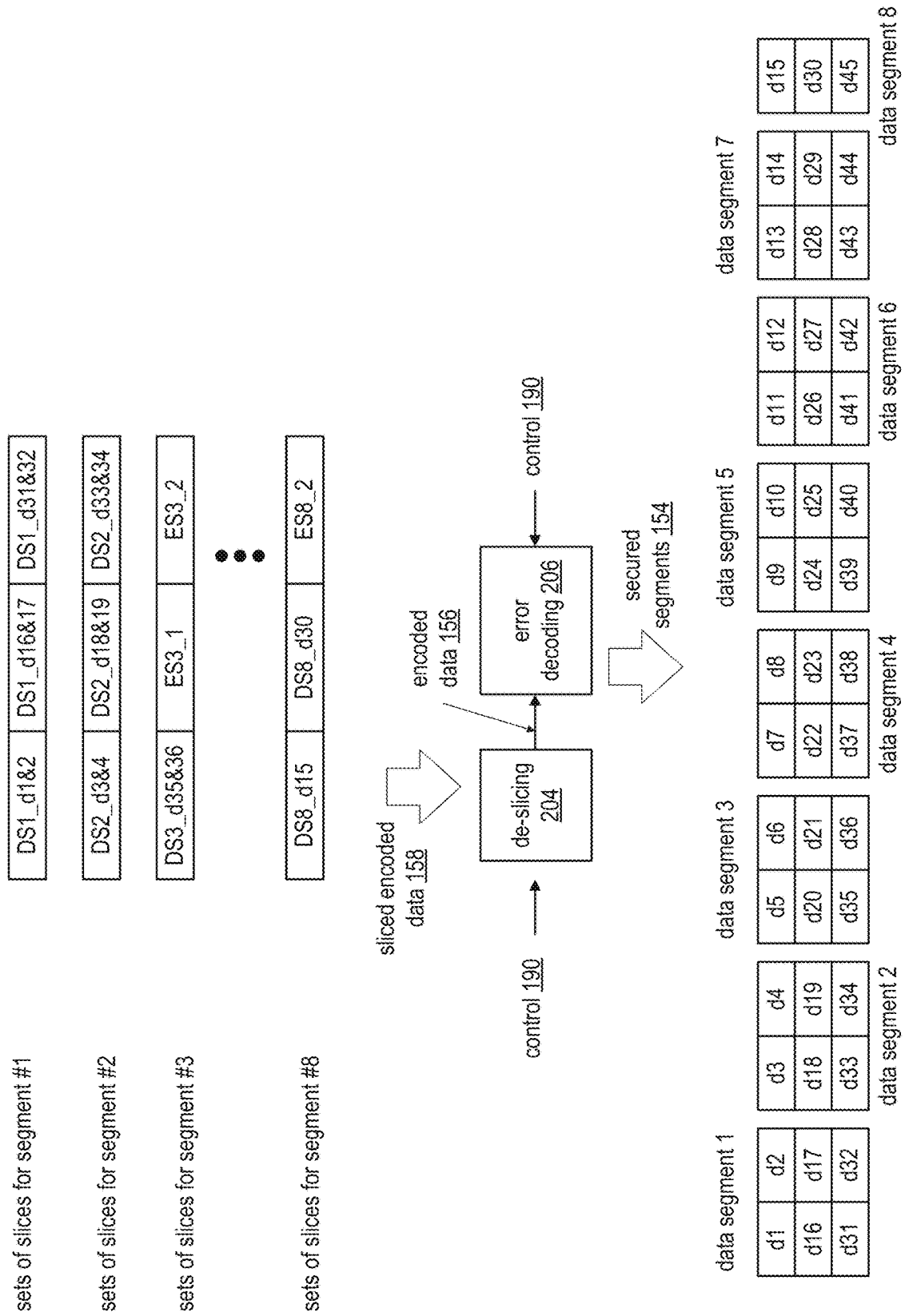
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
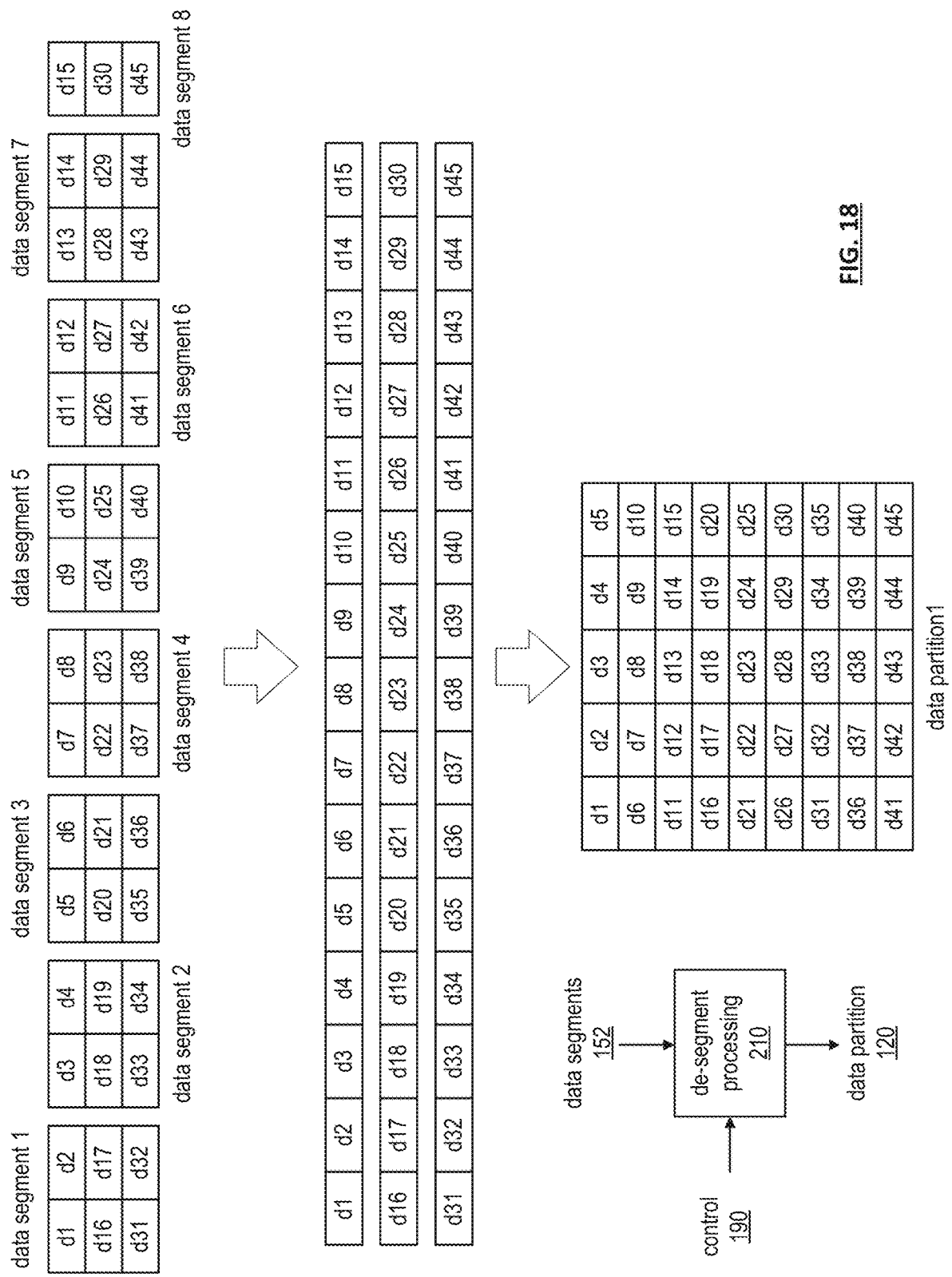
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
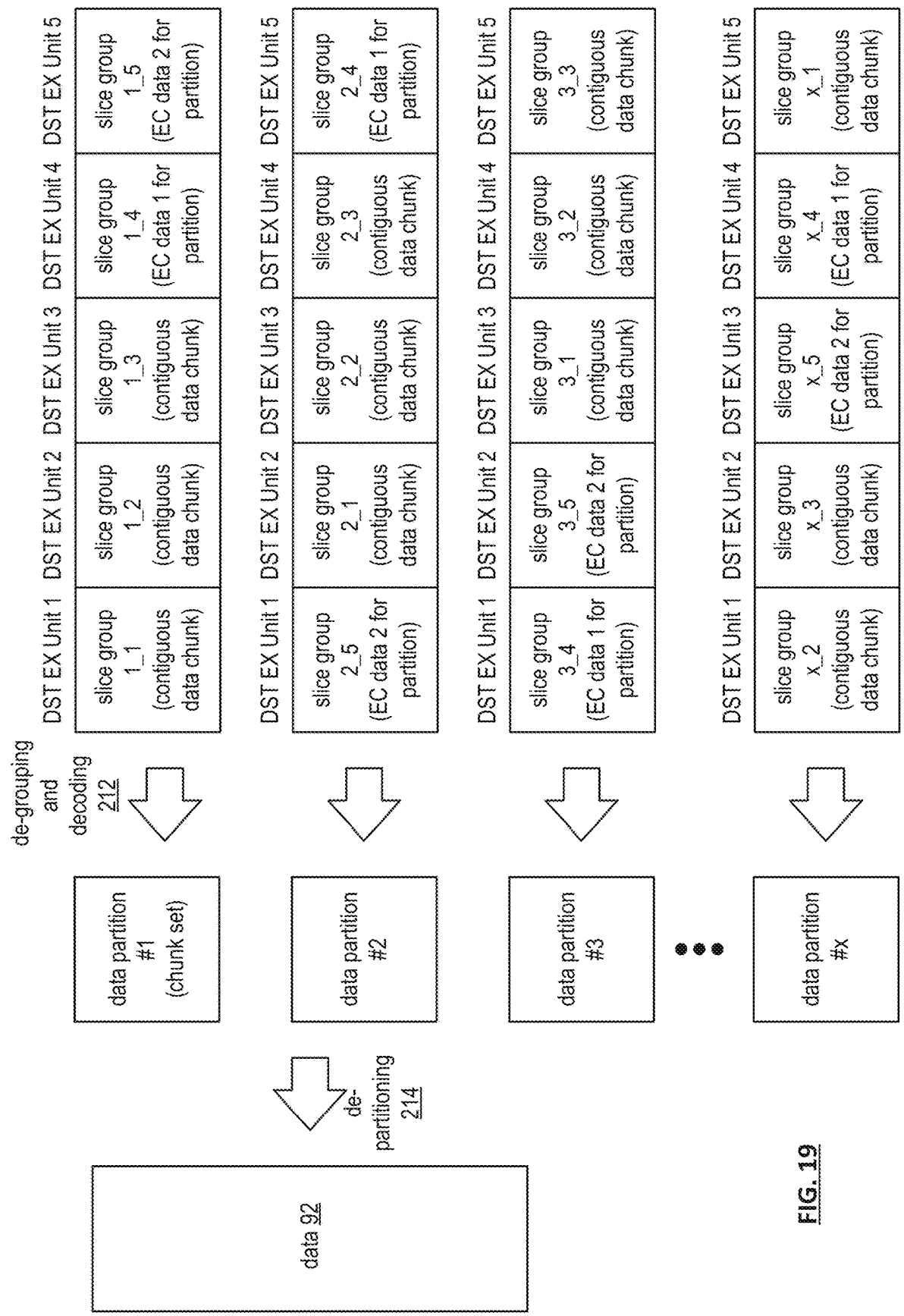
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
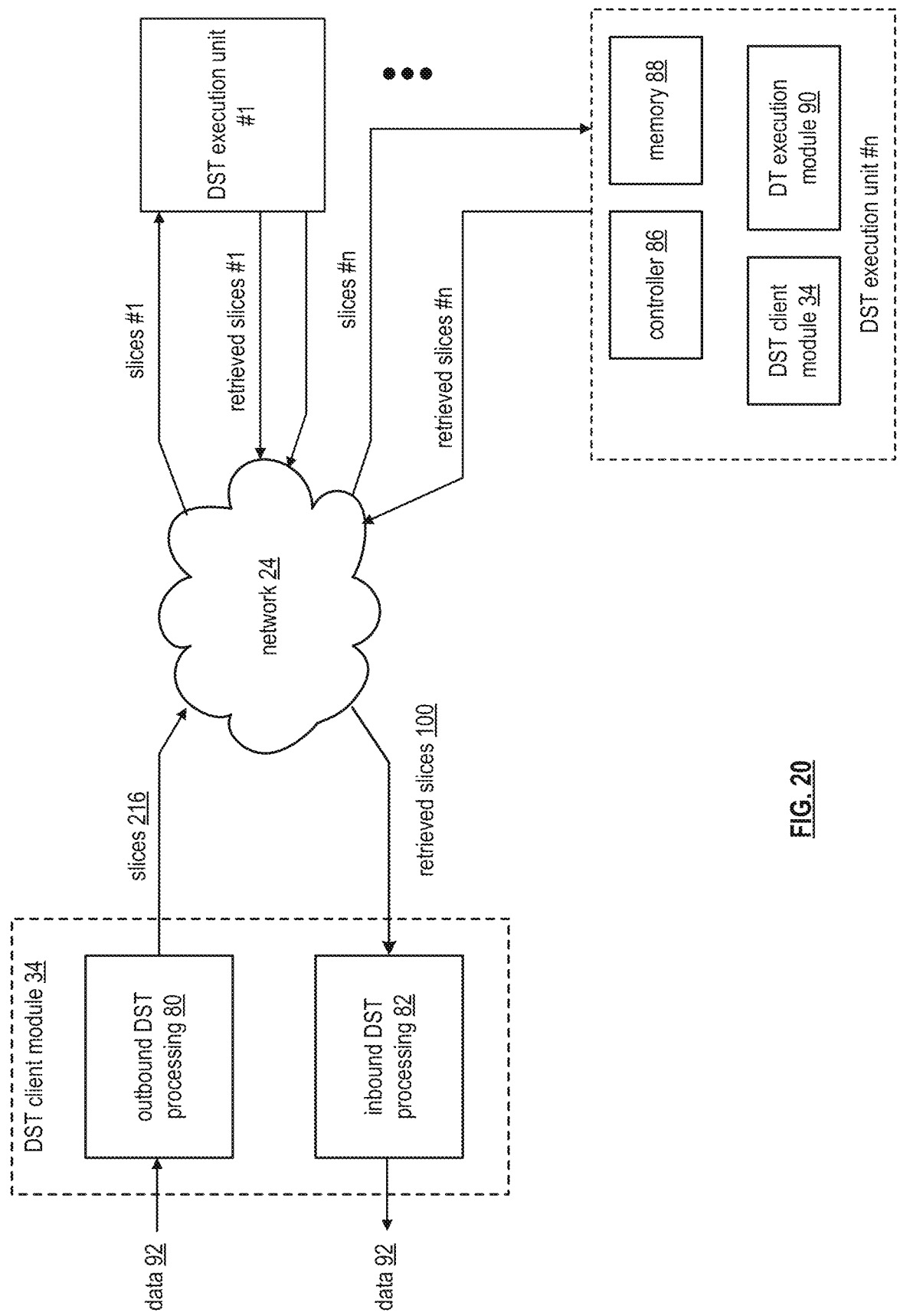
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
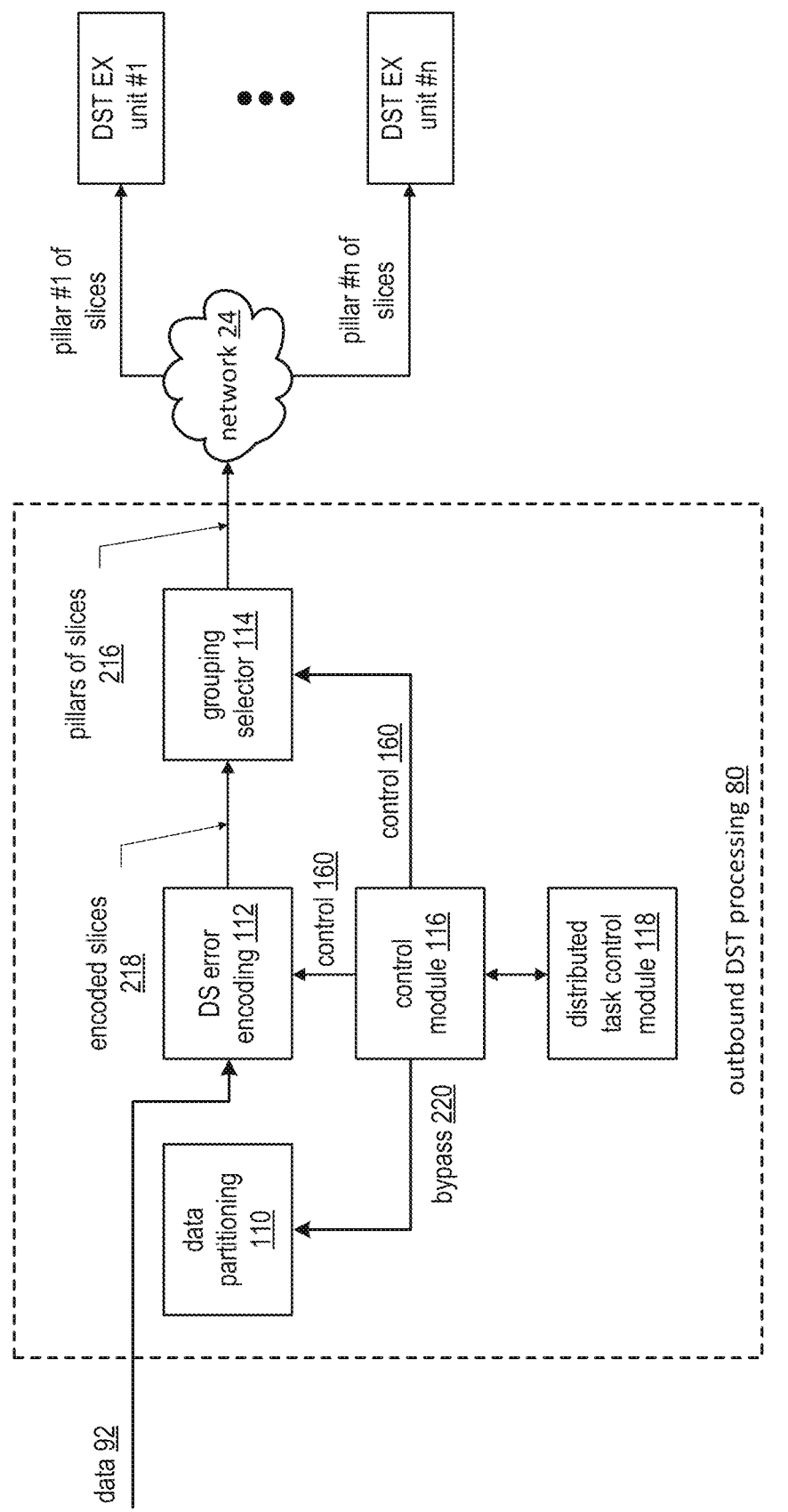
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
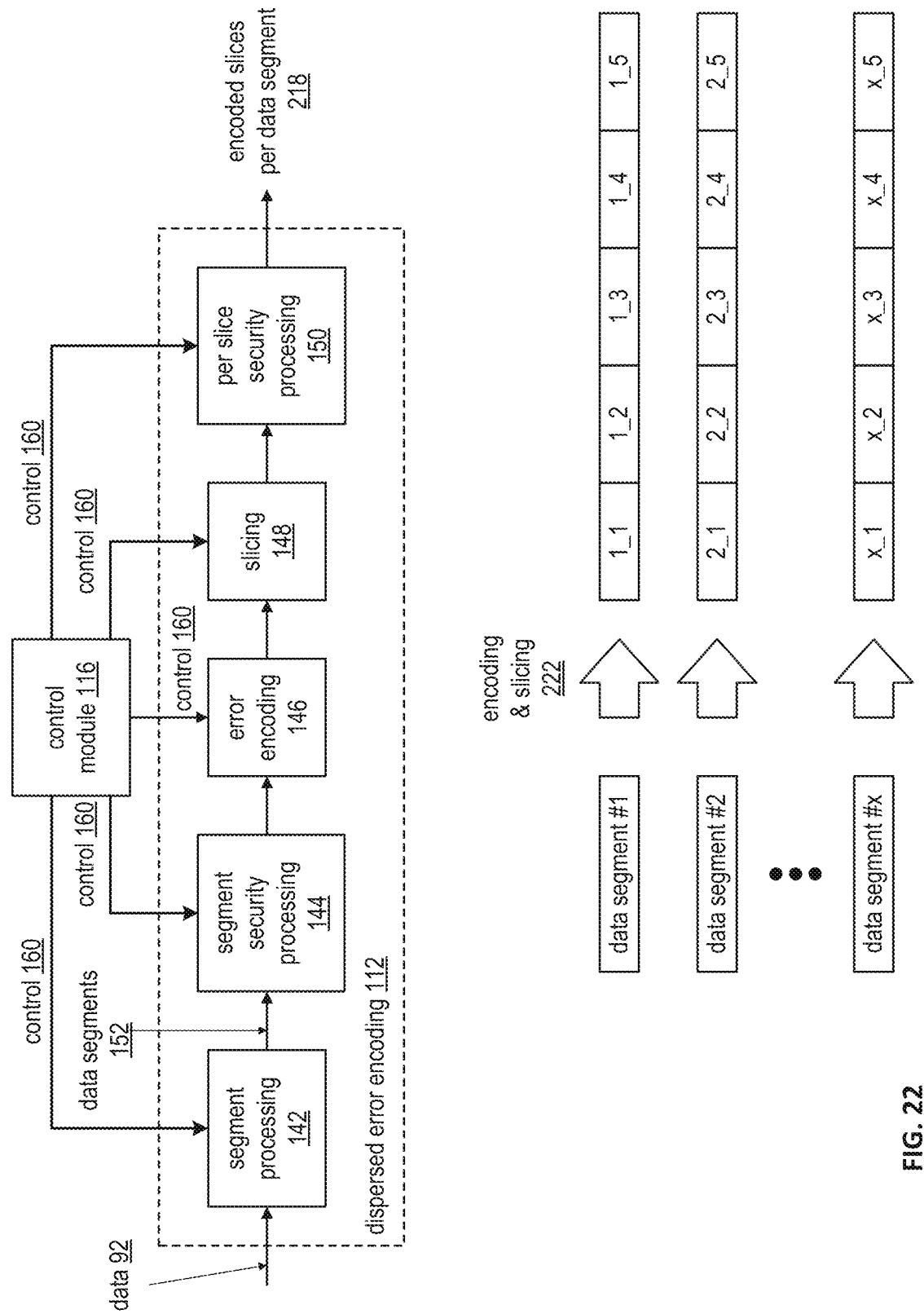
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
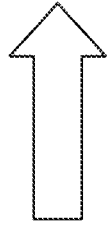
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

Figure 24:
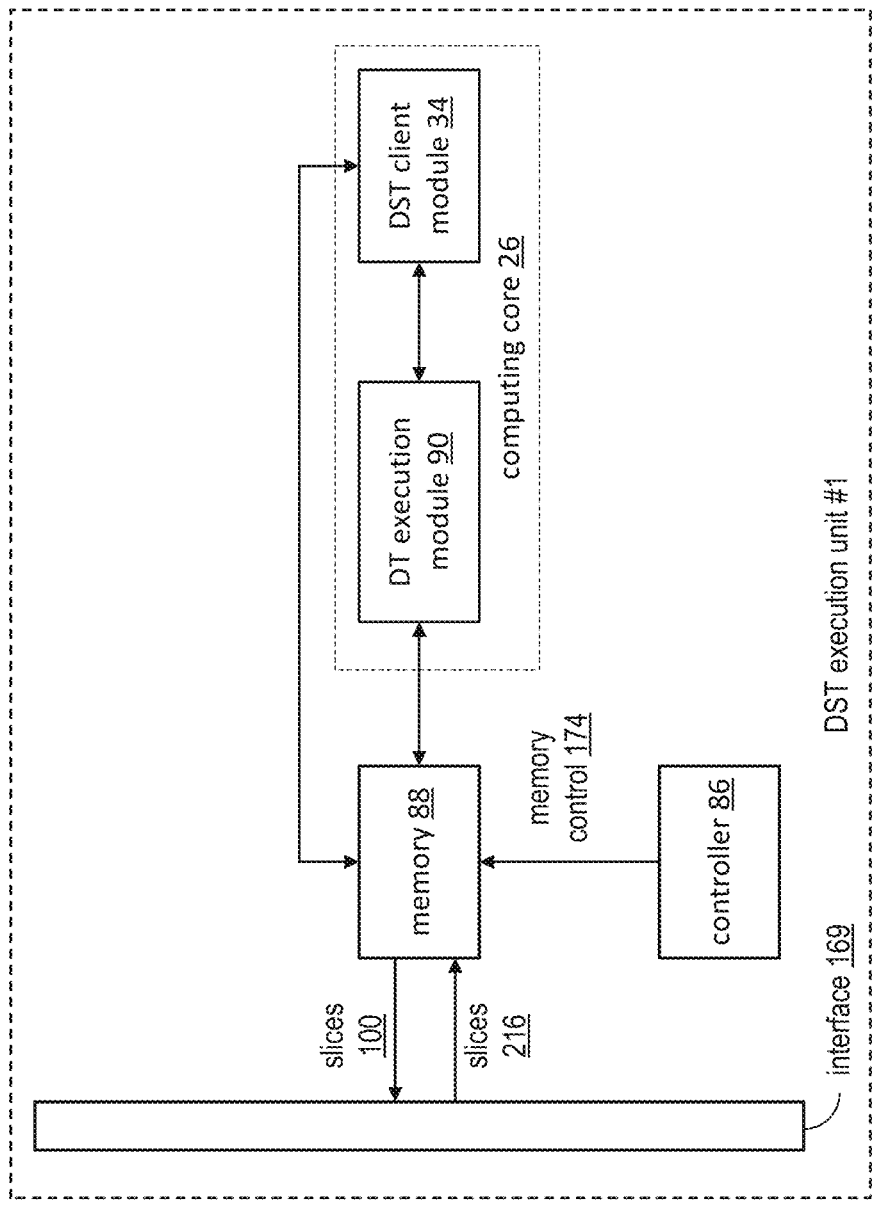
FIG. 24 is a schematic block diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
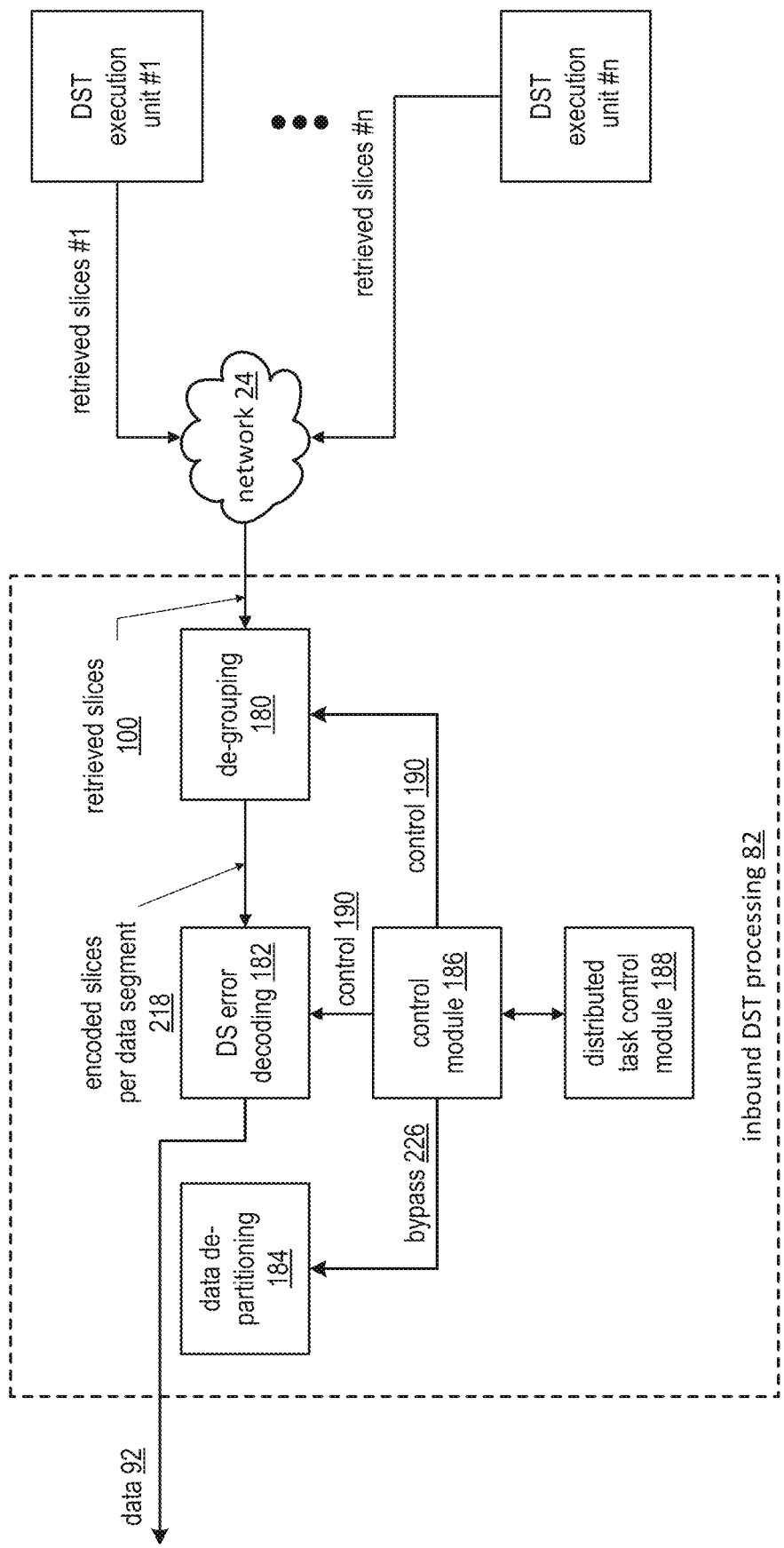
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
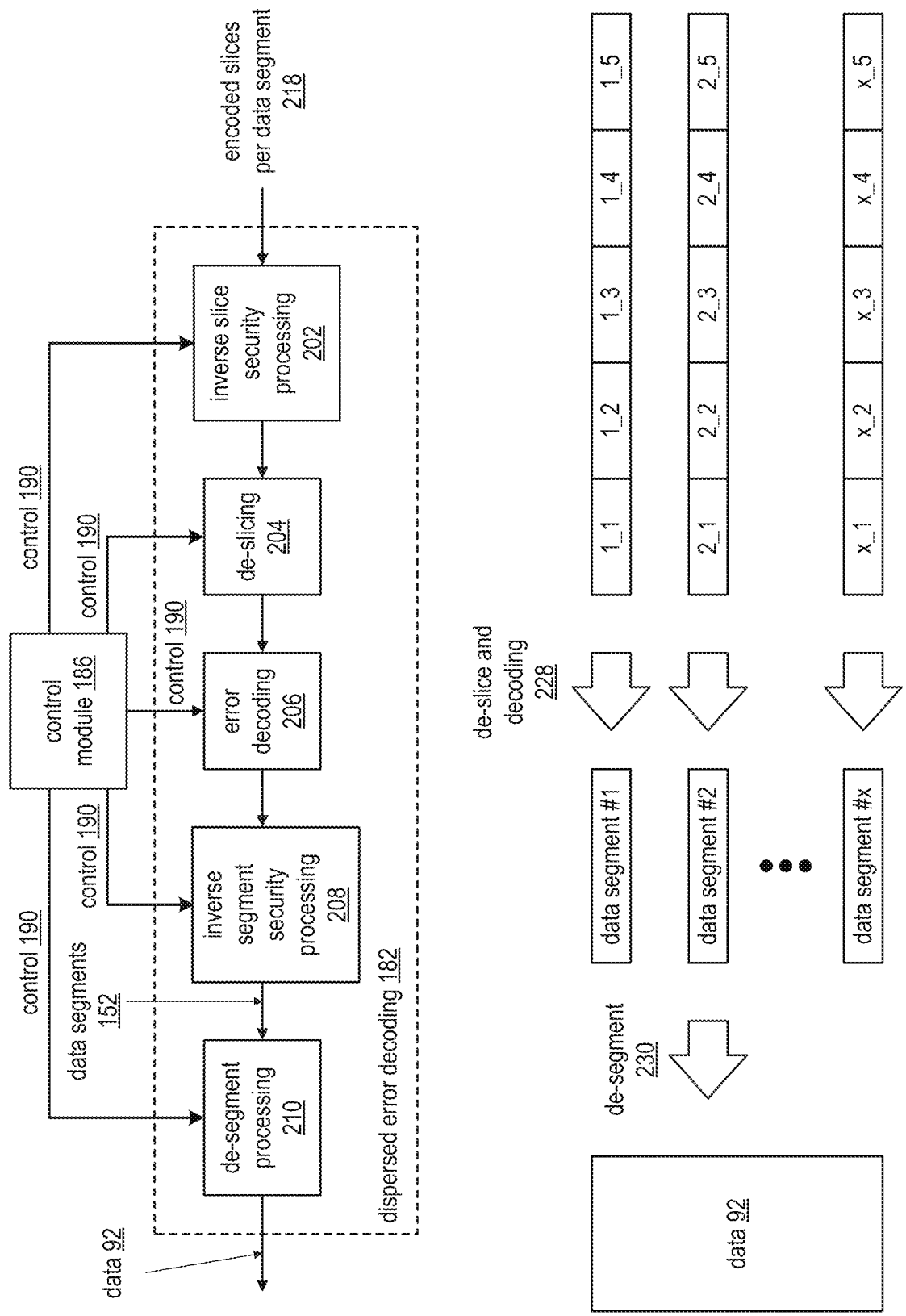
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
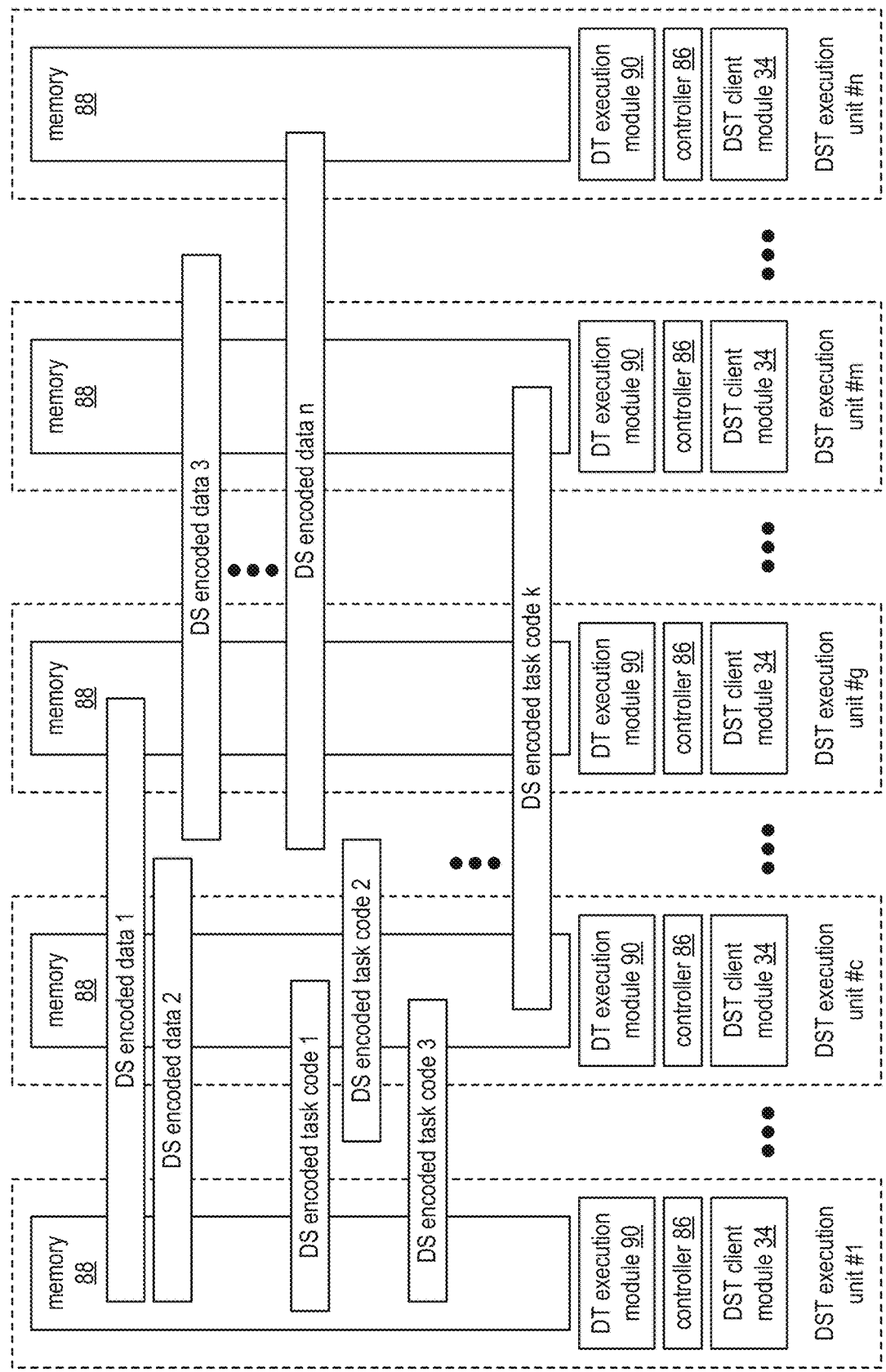
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
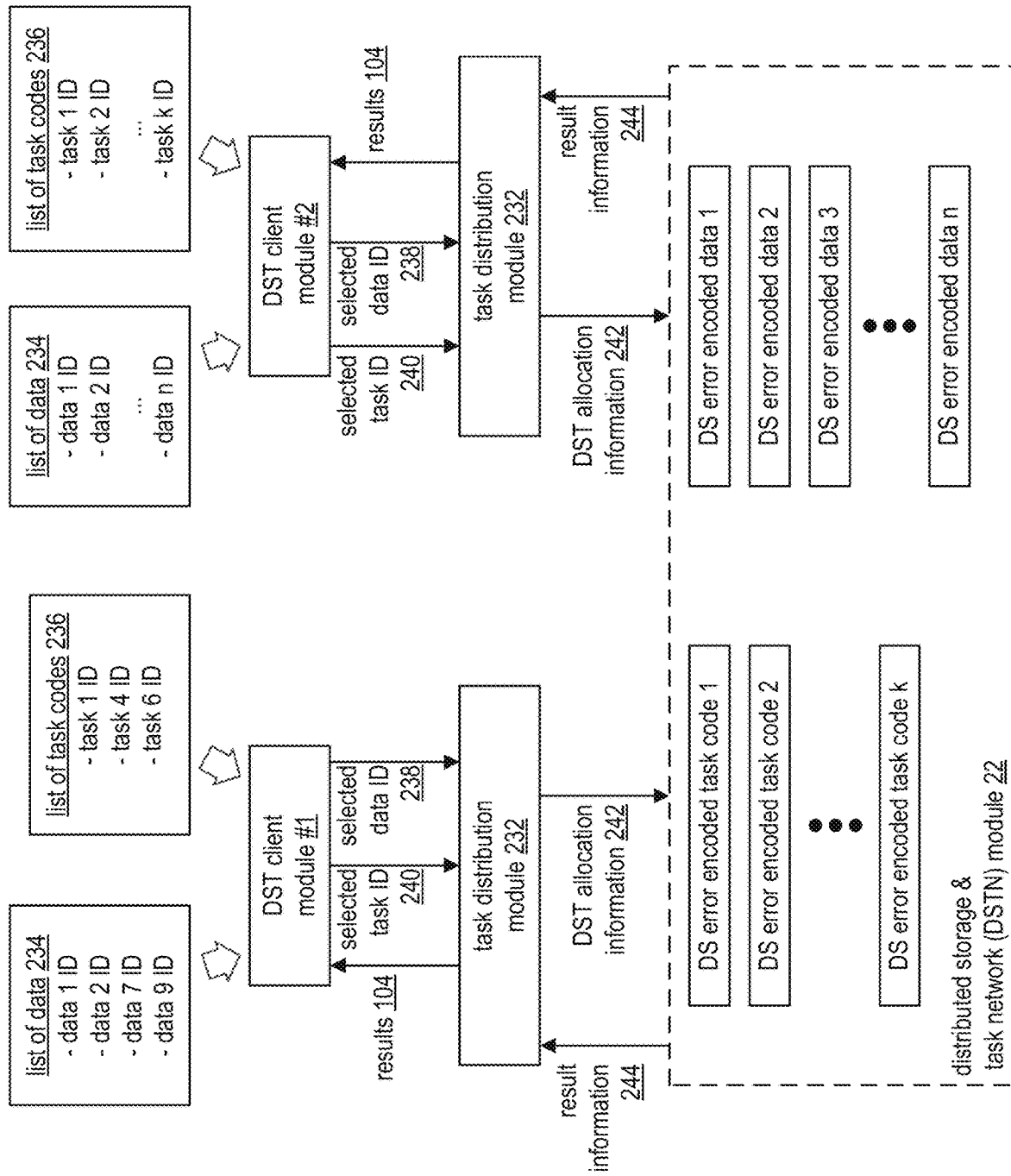
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
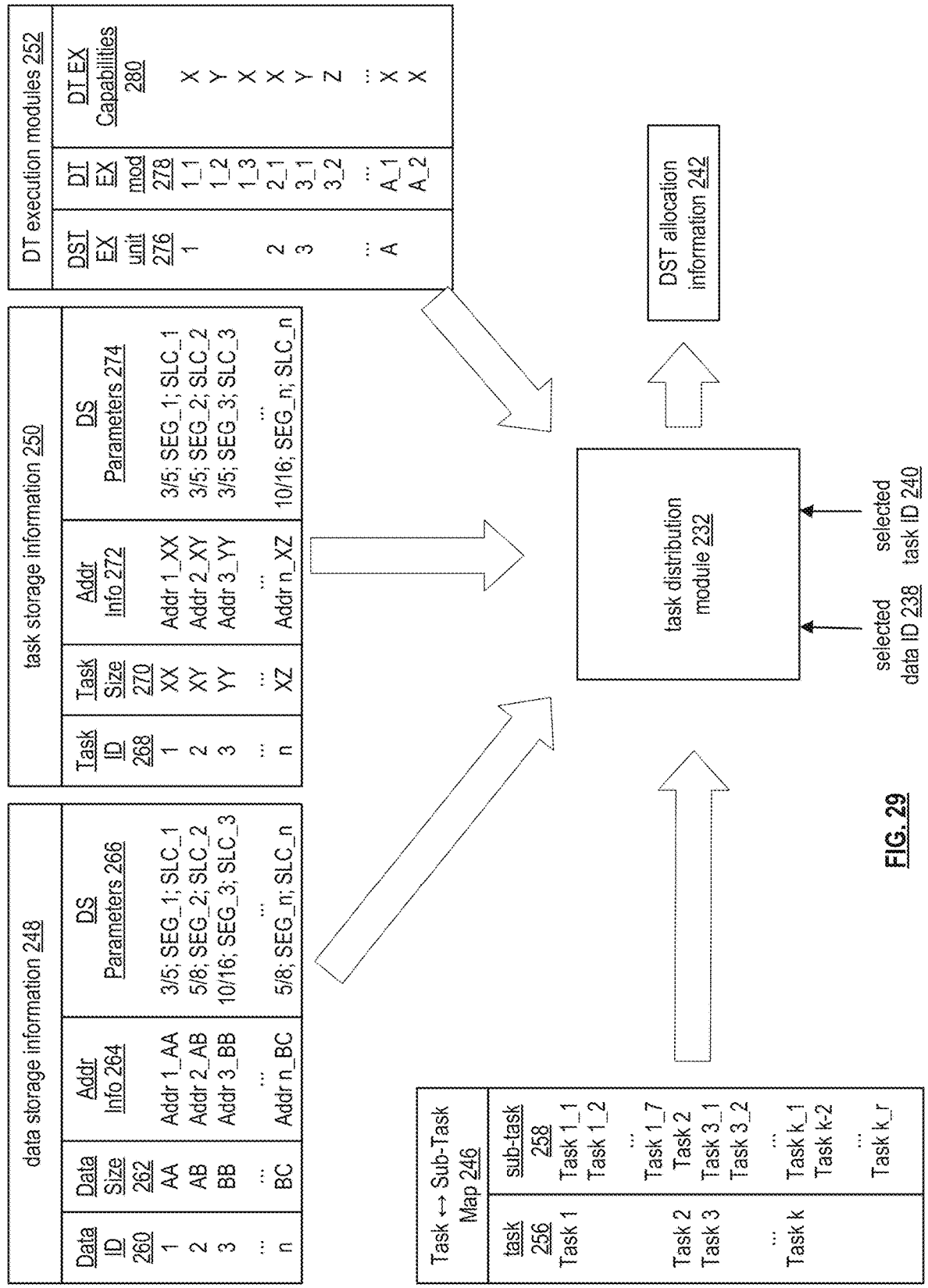
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task⇔sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task⇔sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task⇔sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
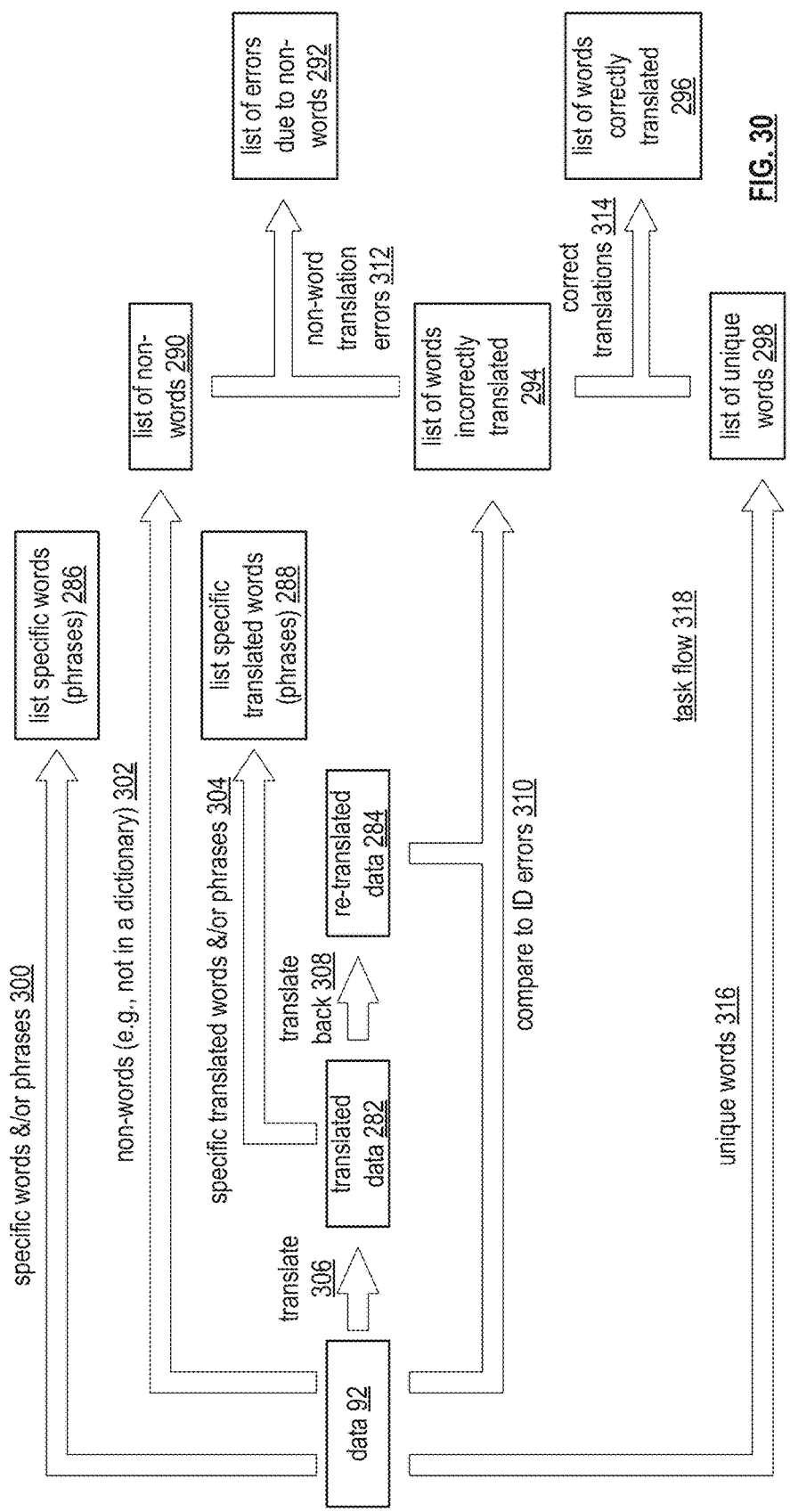
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
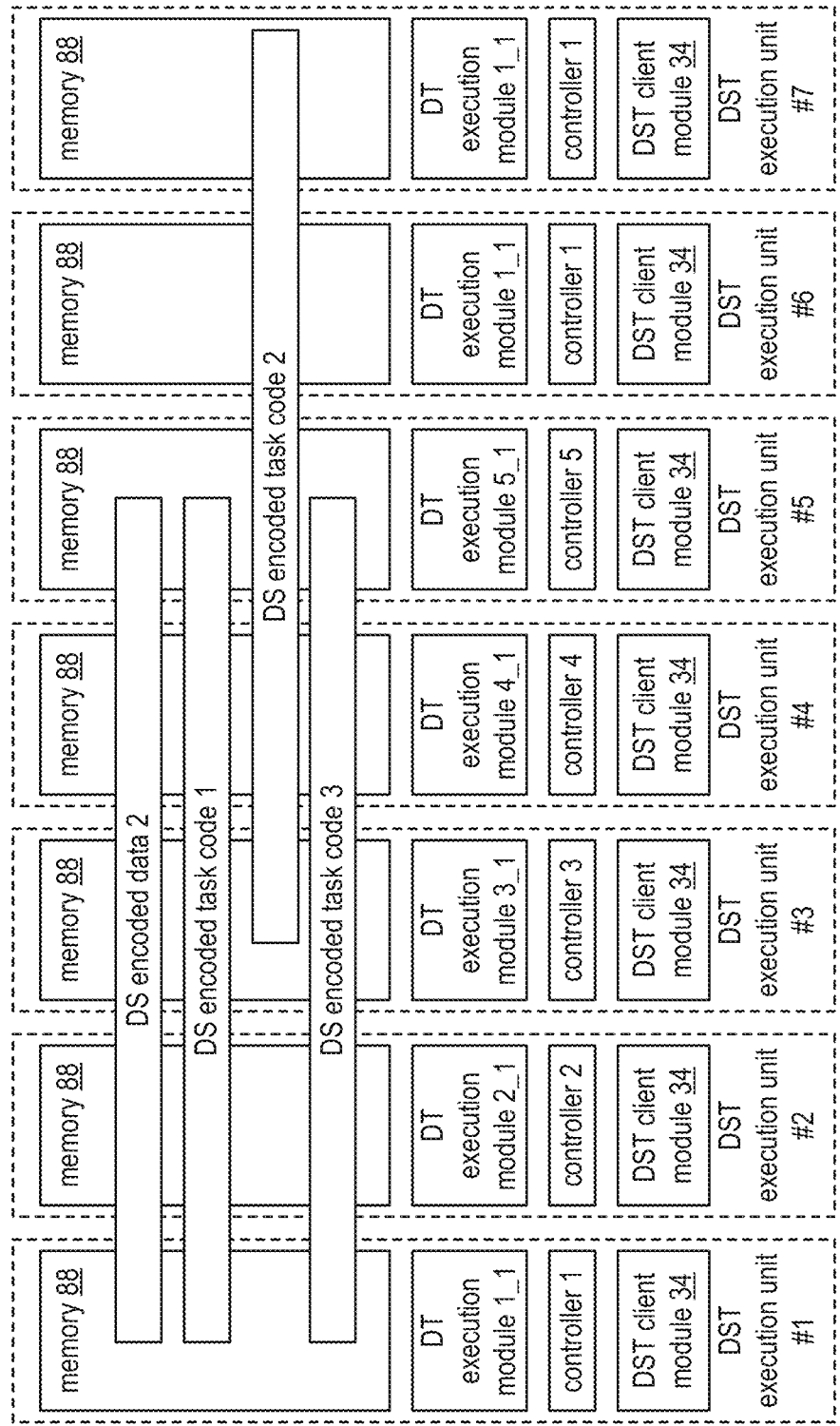
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., 1$^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
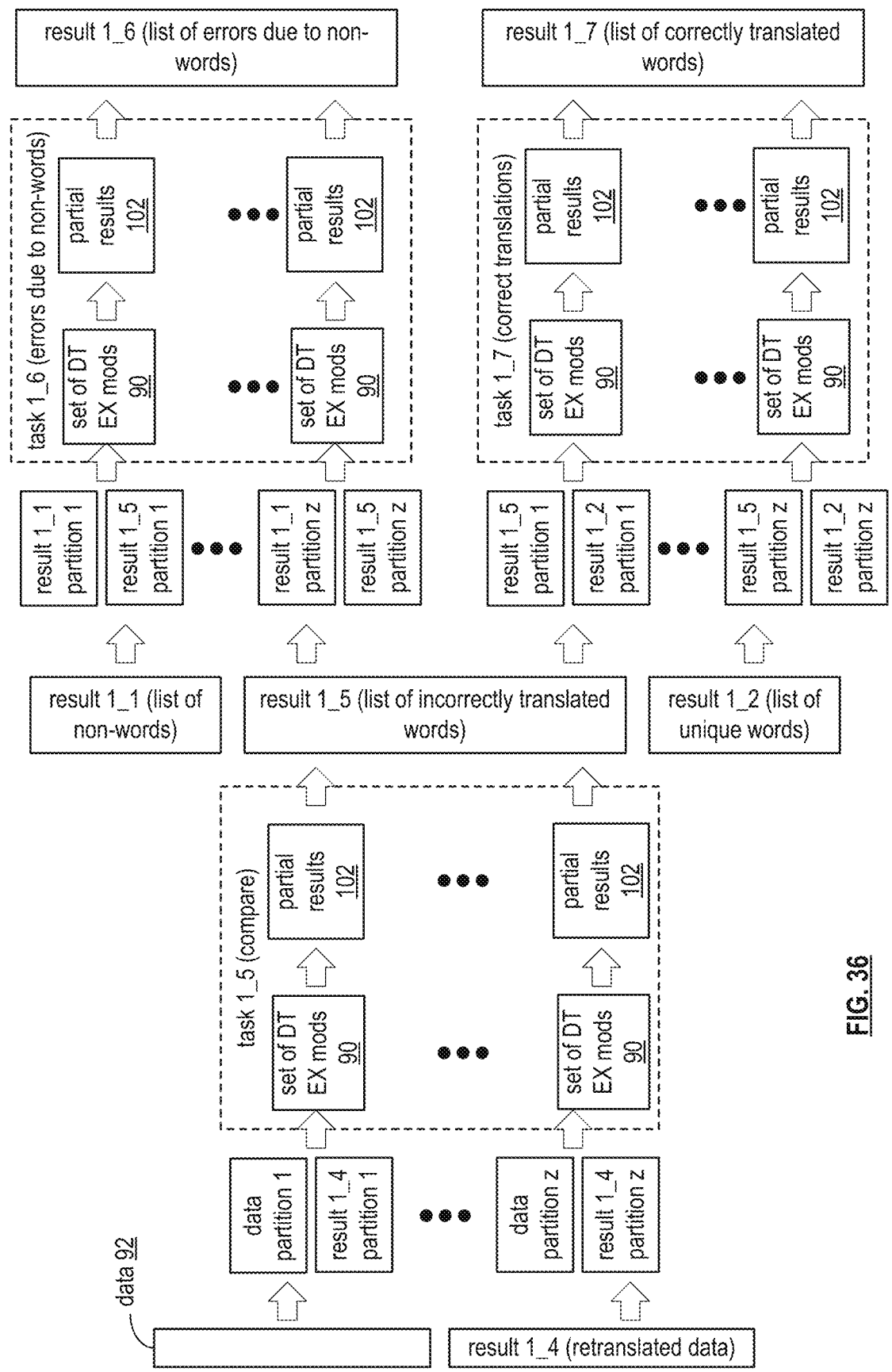

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., Rt-5_1 through R1-5_$z$). For each partition of the fifth intermediate result, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition Rt-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., Rt-6_1 through R1-6_$z$). For each partition of the sixth intermediate result, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_$z$). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-$z$ in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_$m$). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_$m$). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

FIGS. 40A-B are schematic block diagrams of an embodiment of a dispersed storage network (DSN) illustrating an example of executing tasks. The DSN includes distributed storage and task (DST) client modules 1-M, the network 24 of FIG. 1, and a DST execution unit set 350. Each DST client module may be implemented utilizing the DST client module 34 of FIG. 1. Each DST client module includes the outbound dispersed storage (DS) processing module 80 and the inbound DS processing module 82 of FIG. 3. The outbound DS processing module 80 includes the distributed task control module 118 of FIG. 4 and the DS error encoding 112 of FIG. 4. The inbound DS processing module 82 includes the distributed task control module 188 and the DS error decoding 182 of FIG. 13. The DST execution unit set 350 includes a set of DST execution units 1-$n$. Each DST execution unit may be implemented using the DST execution unit 36 of FIG. 1.

FIG. 40A illustrates initial steps of the executing of the tasks. In an example of operation, the distributed task control module 118 of the DST client module 1 obtains a task 352. The obtaining includes at least one of receiving and generating. The task 352 includes one or more of a task description, a task identifier, subtask descriptions, and subtask identifiers. The task description may include one or more of read data, process data, perform a selection, perform an identification, write data, retrieve data, manipulate data, store data, etc. The subtask description may include one or more of identifying a storage address, generate a retrieval request, send a retrieval request, receive retrieval responses, decode the retrieval responses, etc., when an associated task of the subtask includes the read data task.

Having obtained the task 352, the distributed task control module 118 obtains a task object 354. The obtaining includes retrieving an existing task object, retrieving an entry of a dispersed hierarchical index, and generating a new task object as the obtained task object. Having obtained the task object 354, the distributed task control module 118 generates a task entry 356-358 etc., for the task object 354 based on the task. Each task object 354 includes one or more task entries. Each task entry 356 etc., includes a task, a rule set, and status. The rule set includes one or more of a precondition for task execution, a condition to maintain task execution, and one or more condition parameters. For example, the rule set indicates to execute the task after a certain time frame has elapsed. The status may include an execution owner identifier (ID) and a state of processing of the task. The state of the processing of the task includes at least one of a pending execution state, an active execution state, and an execution complete state.

The generating of the task entry includes generating the task entry in accordance with a task entry generation approach based on the task. As a specific example of generating the task entry, the distributed task control module 118 generates the task entry to indicate task 203, rule set 2, and the status to include the pending execution state (e.g., state 0) when the task entry generation approach indicates to utilize rule set 2 for task 203. The distributed task control module 118 adds the generated task entry 356, 358, etc., to the obtained task object 354 to produce the task object 354 for further processing.

The DS error encoding 112 dispersed storage error encodes the task object 354 to produce task slices 360, where the task slices 360 includes a set of task slices 1-$n$. Having produced the task slices 360, the outbound DS processing module 80 sends, via the network 24, the task slices 360 to the DST execution unit set 350 such that each of the DST execution units 1-$n$ store a corresponding task slice of the set of task slices 1-$n$. For example, the task slices are stored as a new object in the DST execution unit set. As another example, the task slices 360 are stored as a new entry within an index node of a dispersed hierarchical index structure stored in the DST execution unit set 350. Having stored the task slices 360, the task has been queued.

FIG. 40B illustrates further steps of the executing of the tasks. Having one or more tasks queued in the DST execution unit set 350, the inbound DS processing module 82 of DST client module 2 retrieves at least a decode threshold number of task slices 360 from the DST execution unit set 350. For example, the DS error decoding 182 issues a read threshold number of read slice requests to a read threshold number of the DST execution units 1-*n* to recover at least one of the data object associated with the task object and the index node of the dispersed hierarchical index that includes the index node entry associated with the task object. Having issued the read threshold number of read slice requests, the DS error decoding 182 receives at least a decode threshold number of read slice responses that includes the at least a decode threshold number of task slices 360.

Having received the at least a decode threshold number of task slices 360, the DS error decoding 182 dispersed storage error decodes the at least a decode threshold number of task slices 360 to produce a recovered task object 362. The distributed task control module 188 determines whether to execute a task of the recovered task object. For example, the distributed task control module 188 selects a task entry of the recovered task object 362, interprets the status to determine that the task is pending execution, analyzes the rule set to determine that the rule set has been satisfied begin execution, and that the DST client module 2 has sufficient available resources to execute the task of the task entry.

When the distributed task control module 188 determines to execute the task, the distributed task control module 188 initiates obtaining ownership of the task. For example, the distributed task control module 118 updates the status of the task entry to indicate ownership by DST client module 2 to produce an updated task object 370. The DS error encoding 112 dispersed storage error encodes the updated task object 370 to produce a set of updated task slices 376. The outbound DS processing module 80 issues, via the network 24, a set of write slice requests that includes the set of updated task slices 376 to the DST execution units 1-*n* for storage of the set of updated task slices 376, and receives, via the network 24, at least a write threshold number of favorable write slice responses confirming ownership by the DST client module 1 of the task and storage of the updated task object in the DST execution unit set.

When receiving confirmation of ownership, the distributed task control module 188 facilitates initiation of execution of the task. The initiation of the execution of the task includes determining whether to utilize subtasks 368. For example, the distributed task control module 188 determines to utilize the subtasks when the DST client module 2 does not have enough resources to fully execute the task. As another example, the distributed task control module 188 determines to utilize the subtasks when the rule set of the task entry indicates to utilize sub-tasks.

When utilizing the subtasks 368, the distributed task control module 188 generates one or more subtasks 368 in accordance with the rule set and based on the task. The distributed task control module 118 further updates the updated task object 370 to produce a further updated task object 370 where the task entry 374 of the further updated task object 370 includes the sub-tasks. The DS error encoding 112 dispersed storage error encodes the further updated task object to produce further updated task slices 376. The outbound DS processing module 80 facilitates storage of the further updated task slices 376 in the set of DST execution units 1-*n*. The above process may continue where yet another DST client module accesses the further updated task object to retrieve a subtask, obtain ownership of the subtasks, execute a selected subtask and/or create further subtasks from the selected sub-task.

FIG. 40C is a flowchart illustrating an example of executing tasks. The method begins or continues at step 380 where a first module (e.g., of a first distributed storage and task (DST) client module) obtains a task object. For example, the first module searches a dispersed hierarchical index to identify an entry that includes the task object. The method continues at step 382 where the first module generates a task entry based on a task (e.g., a new task to be queued for subsequent execution). The method continues at step 384 where the first module updates the task object to include the task entry. The method continues at step 386 where the first module facilitates storing the task object in a dispersed storage network (DSN). For example, the first module dispersed storage error encodes the task object to produce a set of task slices for storage in an entry of the dispersed hierarchical index in a set of storage units of the DSN.

The method continues at step 388 where a second module (e.g., of a second distributed storage and task (DST) client module) recovers the task object from the DSN. For example, the second module searches the dispersed hierarchical index to identify the entry that includes the task object. The method continues at step 390 where the second module determines whether to execute the task of the task entry. For example, the processing module indicates to execute the task when status of the task indicates that ownership no longer exists, a rule set has been satisfied, and required resources are available.

When executing the task, the method continues at step 392 where the second module initiates obtaining ownership of the execution of the task. For example, the second module updates the status of the task entry to indicate ownership by the second module, updates the task object to include the updated task entry, dispersed storage error encodes the updated task object to produce a set of updated task slices, and issues a set of write slice requests to the set of storage units of the DSN, where the set of write slice requests includes the set of updated task slices.

When ownership is confirmed, the method continues at step 394 where the second module facilitates initiation of the execution of the task. The second module indicates that the ownership is confirmed when receiving at least a write threshold number of favorable write slice responses from the set of storage units with regards to the storage of the set of updated task slices. As an example of execution of the task, the second module determines whether to utilize sub-tasks. For instance, the second module indicates to utilize subtasks when available resources of the second module compare unfavorably (e.g., not enough) to required resources to fulfill execution of the task. As another instance, the second module executes the task when the available resources of the second module compare favorably to the required resources to fulfill the execution of the task.

When utilizing subtasks for the facilitation, the method continues at step 396 where the second module generates one or more subtasks in accordance with a subtask list and a rule set based on one or more of the subtask and available resources. For example, the second module generates two subtasks for execution by the second module and one more subtask for execution by another module. The method continues at step 398 where the second module updates the task object to include at least some of the one or more subtasks. For example, the second module generates a subtask entry for each subtask to be included in the task object. The method continues at step 400 where the second module stores the updated task object in the set of storage units of the DSN. For example, the second module encodes the updated task object to produce updated task slices and stores the updated task slices in the set of storage units.

FIGS. 41A, G, and H is a schematic block diagram of another embodiment of a dispersed storage network (DSN) that includes the distributed storage and task (DST) client module 34 of FIG. 1, the network 24 of FIG. 1, and a DST execution (EX) unit set 402. The DST client module 34 includes the outbound dispersed storage (DS) processing module 80 and the inbound DS processing module 82 of FIG. 3. The outbound DS processing module 80 includes the data partitioning 110 of FIG. 4 and the DS error encoding 112 of FIG. 4. The inbound DS processing module 82 includes the data de-partitioning 184 and the DS error decoding 182 of FIG. 13. Each DST execution unit set 402 includes a set of DST EX units 1-$n$. The set of DST EX units 1-$n$ includes first set of DST execution units 1-$k$ and a second set of DST EX units k+1 through n. Each DST execution unit may be implemented utilizing the DST execution unit 36 of FIG. 1.

The DSN functions to access stored data in the DSN. The accessing includes storing data in the DST execution unit set 402 as a set of encoded data slices utilizing a data concatenation approach. The accessing further includes retrieving the stored data from the DST execution unit set 402 in accordance with the data concatenation approach. The data may include a plurality of small data objects, where a size of each of a substantial number of the data objects is less than a size threshold level. Such a size threshold level may include a size of desired encoded data slice for storage in one of the DST execution units. Hereafter, the plurality of small data objects may be referred to interchangeably as a plurality of independent data objects. The plurality of independent data objects may be associated with a common trait. The common traits includes one or more of a size that is less than the size threshold level, a common subject matter, a common data types, a common time of arrival, a common data owner, a common date of creation, a common generation source, a common expected retrieving entity, etc.

FIG. 41A illustrates an example of operation of the storing of the data to produce the stored data, where the outbound DS processing module 80 receives the small data objects 404 for storage. Having received the plurality small data objects 404, the outbound DS processing module 80 determines whether to utilize the data concatenation approach. The determining may be based on one or more of a predetermination, detecting that at least a decode threshold number of the small data objects have been received, receiving a message to concatenate the independent data objects, where the message is one of a user input message to group data objects having the common trait and a system message based on dispersed storage network conditions (e.g., the message indicating that an overload condition may exist, and detecting that a number of input/output operations of the DST client module 34 is greater than an input/output operations threshold level (e.g., inferring that the overload condition may exist).

When using the data concatenation approach, the data partitioning 110 concatenates the plurality of independent data objects 404 into a concatenated data object 406, where the concatenating is based on a parameter of a dispersed storage error encoding function that indicates a number of data-based encoded data slices (e.g., a decode threshold number) resulting from performing the dispersed storage error encoding function. As a specific example, the data partitioning 110 identifies data objects 404 having the common trait and establishes the plurality of independent data objects from the data objects having the common trait. For instance, the data partitioning 110 selects a decode threshold number (e.g., k) of small data objects 404 to produce the plurality of independent data objects for concatenation.

Having selected the plurality of independent data objects for concatenation, the data partitioning 110 maps the independent data objects into "k" rows to produce the concatenated data object 406. As a specific example of the mapping, the data partitioning 110 maps independent data objects into the "k" rows to produce the concatenated data object, where the "k" rows corresponds to the number of data-based encoded data slices resulting from performing the dispersed storage error encoding function and where an independent data object of the plurality of independent data objects is mapped to more than one row of the "k" rows (e.g., an independent data object wraps from one row to an adjacent row).

As another specific example of the mapping, the data partitioning 110 maps the independent data objects such that the "k" rows corresponds to a number of data-based encoded data slices (e.g., the decode threshold number) resulting from performing the dispersed storage error encoding function and where the one or more independent data objects is mapped to a single row of the "k" rows. As a specific example of generating the concatenated object 406 where the one or more independent data objects are mapped to the single row, the data partitioning 110 generates the concatenated object 406 to include small data object 1 in a first row, small data object 2 in a second row, small data object 3 in a third row, through small data object k in a "kth" row. Having mapped one small data object to each row, the data partitioning 110 pads the single row of the "k" rows when a combined size of the one or more independent data objects is less than a row size (e.g., a size of a desired encoded data slice). For instance, the data partitioning 110 pads the first row such that a size of the small data object 1 plus a size of a padding 1 equals the row size, pads the second row such that a size of the small data object 2 plus a size of a padding 2 equals the row size, etc. Another specific example of generating the concatenated object 406 where the one or more independent data objects are mapped to the single row is discussed in greater detail with reference to FIG. 41F.

Having produced the concatenated object 406, the outbound DS processing module 80 performs the dispersed storage error coding function on the concatenated data object 406 to produce the set of encoded data slices that includes a set of data-based encoded data slices 1-$k$ 408 and a set of redundancy-based encoded data slices 410 (e.g., error coding slices). One or more independent data objects of the plurality of independent data objects is recoverable from a corresponding data-based encoded data slice of the set of encoded data slices or from a decode threshold number of encoded data slices, where the decode threshold number of encoded data slices includes one or more data-based encoded data slices of the set of data-based encoded data slices and one or more redundancy-based encoded data slices of the set of redundancy-based encoded data slices.

As a specific example, the DS error encoding 112 converts the concatenated data object 406 into a data matrix, generates a coded matrix based on the data matrix and an encoding matrix, generates the set of data-based encoded data slices 408 (e.g., data-based encoded data slices 1-3) from a first portion of the coded matrix that corresponds to a first portion of the encoding matrix, and generates the set of redundancy-based encoded data slices 410 (e.g., redundancy-based encoded data slices or error coding slices k+1 and n) from a second portion of the coded matrix that corresponds to a second portion of the encoding matrix. The generating of the encoded data slices is discussed in greater detail with reference to FIGS. 41B-E.

Having generated the set of encoded data slices, the DS error encoding 112 outputs, via the network 24, the set of data-based encoded data slices to the first set of DST execution units (e.g., DST EX units 1-*k*) for storage and outputs, via the network 24 the set of redundancy-based encoded data slices to the second set of DST execution units (e.g., DST EX units k+1 through n) for storage. For example, the DS error encoding 112 sends, via the network 24, encoded data slices 1-3 to DST execution units 1-3 for storage and sends, via the network 24, error coded data slices 4 and 5 to DST execution units 4 and 5 for storage when k=3 and n=5.

Having output the set of encoded data slices, the outbound DS processing module 80 associates identifiers of the small data objects with corresponding identifiers (e.g., slice names, source name, DSN address) of each of the set of data-based encoded data slices. For example, the outbound DS processing module 80 updates one or more of a DSN directory and a dispersed hierarchical index to associate received identifiers of the small data objects with the identifiers of the corresponding set of data-based encoded data slices.

FIG. 41B is a diagram illustrating an example of encoding a concatenated object into a plurality of data blocks D1-Dn. The set of data blocks provides a representation of the concatenated object 406 for example, the concatenated object 406 is divided into n equal portions to form data blocks D1-Dn. As another example, the concatenated data object 406 is divided into as many portions as required when a fixed data portion size is utilized.

FIG. 41C is a diagram illustrating an example of matrix multiplication of an encoding matrix (E) and a data matrix (D) using a dispersed storage error coding function to produce a coded matrix (C). The encoding function may utilize a variety of encoding approaches to facilitate dispersed storage error encoding of data. The encoding function includes, but is not limited to, at least one of Reed Solomon encoding, an information dispersal algorithm, on-line codes, forward error correction, erasure codes, convolution encoding, Trellis encoding, Golay, Multidimensional parity, Hamming, Bose Ray Chauduri Hocquenghem (BCH), and/or Cauchy-Reed-Solomon. In an example of a Reed Solomon encoding function, the matrix multiplication is utilized to encode a data segment or concatenated object 406 to produce a set of encoded data blocks 412 as a representation of the data segment or concatenated object 406. The Reed Solomon encoding function is associated with an error coding number (e.g., pillar width, number of slices per set) and a decode threshold number. As a specific example, the encoding matrix includes the error coding number of Y rows and the decode threshold number of X columns. Accordingly, the encoding matrix includes Y rows of X coefficients. The set of data blocks of the data segment or concatenated object 406 is arranged into the data matrix having X rows of Z number of data words (e.g., X*Z=number of data blocks). The data matrix is matrix multiplied by the encoding matrix to produce the coded matrix, which includes Y rows of Z number of encoded values (e.g., encoded data blocks 412).

FIG. 41D is a diagram illustrating another example of matrix multiplication of an encoding matrix (E) and a data matrix (D) using a dispersed storage error coding function to produce a coded matrix (C), where a set of encoded data slices are produced from the coded matrix. In an example of operation of using a Reed Solomon encoding function, the concatenated object 406 of FIG. 41B is converted into data blocks (e.g., D1-D12) of a portion of the data matrix (e.g., any number of bytes per block). Next, the encoding matrix is matrix multiplied by the data matrix to produce the coded matrix, where the coded matrix includes encoded data blocks 412. As a specific example, the dispersed storage error encoding utilizes an error coding number of five and a decode threshold number of three. The encoding matrix (E) includes five rows of three coefficients (e.g., a-o). The data segment is divided into data blocks D1-12, which are arranged into the portion of the data matrix (D) having 3 rows of 4 data blocks when the number of data blocks is 12. The number of rows of the data matrix matches the number of columns of the encoding matrix (e.g., the decode threshold number). The number of columns of the data matrix increases as the number of data blocks of the data segment increases. The data matrix is matrix multiplied by the encoding matrix to produce the coded matrix, which includes 5 rows of 4 encoded data blocks (e.g., X11-X14, X21-X24, X31-X34, X41-X44, and X51-X54). The number of rows of the coded matrix matches the number of rows of the encoding matrix (e.g., the error coding number). For instance, X11=aD1+bD5+cD9; X12=aD2+bD6+cD10; X21=dD1+eD5+fD9; X31=gD1+hD5+iD9; X34=gD4+hD8+iD12; and X54=mD4+nD8+oD12.

One or more encoded data blocks 412 from each row of the coded matrix are selected to form a corresponding encoded data slice of the set of encoded data slices. Accordingly, an error coding number of encoded data slices are produced from the coded matrix. For example, coded values X11-X14 are selected to produce an encoded data slice 1, coded values X21-X24 are selected to produce an encoded data slice 2, coded values X31-X34 are selected to produce an encoded data slice 3, coded values X41-X44 are selected to produce an encoded data slice 4, and coded values X51-X54 are selected to produce an encoded data slice 5. The data matrix (e.g., the concatenated object 406) may be recovered (e.g., to produce a recovered data segment) when any decode threshold number of corruption-free error coded data slices are available of the set of error coded data slices. Alternatively, the recovered concatenated object may be produced when a decode threshold number of encoded data blocks for each column of the coded matrix are available.

FIG. 41E is a diagram illustrating another example of matrix multiplication of an encoding matrix (E) and a data matrix (D) using a dispersed storage error coding function to produce a coded matrix (C), where a decode threshold number of rows of the encoding matrix includes a unity matrix. Accordingly, matrix multiplying the encoding matrix with the data matrix produces the coded matrix where the encoded data blocks 412 include a set of encoded data slices.

The set of encoded data slices includes a set of data-based encoded data slices 1-3 and a set of redundancy-based encoded data slices 4-5 when the error coding number is five (e.g., n=5) and the decode threshold number is three (e.g., k=3). For example, matrix multiplying a first portion of the encoding matrix that includes the unity matrix by the data matrix produces a first portion of the coded matrix that includes the set of data-based encoded data slices 1-3 and matrix multiplying a second portion of the encoding matrix (e.g., remaining rows after the unity matrix) by the data matrix produces a second portion of the coded matrix that includes the set of redundancy-based encoded data slices 4-5. For instance, coded matrix values X11-X14 includes data blocks D1-D4 forming data-based encoded data slice 1, coded matrix values X21-X24 includes data blocks D5-D8 forming data-based encoded data slice 2, and coded matrix values X31-X34 includes data blocks D9-D12 forming data-based encoded data slice 3. As another instance, coded matrix values X41-X44 forms redundancy-based encoded data slice 4, and coded matrix values X51-X54 forms redundancy-based encoded data slice 5.

FIG. 41F is a diagram illustrating an example of mapping data objects to the concatenated object 406 where the independent data objects are mapped such that the "k" rows corresponds to a number of data-based encoded data slices (e.g., the decode threshold number) resulting from performing the dispersed storage error encoding function and where the one or more independent data objects is mapped to a single row of the "k" rows. As a specific example of generating the concatenated object 406 where the one or more independent data objects are mapped to the single row, the data partitioning 110 generates the concatenated object 406 to include small data objects 1 and 2 in a first row, small data object 3 in a second row, small data object 4 in a third row, through small data object k+1 in a "kth" row. Having mapped the one or more small data objects to each row, padding is added to each row of the "k" rows when a combined size of the one or more independent data objects is less than a row size (e.g., a size of a desired encoded data slice). For instance, the first row is padded such that a size of the small data object 1 and 2 plus a size of a padding 1 equals the row size, the second row is padded such that a size of the small data object 3 plus a size of a padding 2 equals the row size, etc.

FIG. 41G illustrates an example of retrieving the stored data to reproduce the data in accordance with the data concatenation approach where the inbound DS processing module 82 identifies an identifier of a stored encoded data slice corresponding to a small data object for retrieval. For example, the inbound DS processing module 82 accesses at least one of a DSN directory and a dispersed hierarchical index using an identifier of the small data object for retrieval to recover the identifier (e.g., slice name) of the corresponding stored encoded data slice. For instance, the inbound DS processing module 82 obtains a slice name corresponding to encoded data slice 2 that includes storage of small data object 2 for retrieval.

Having identified the identifier of the corresponding stored encoded data slice, the inbound DS processing module 82 initiates retrieval of the stored encoded data slice. For example, the inbound DS processing module 82 issues a read slice request to a DST execution unit corresponding to the identifier of the stored encoded data slice for retrieval and receives a read slice response that includes the stored encoded data slice when the stored encoded data slice is available. For instance, the DS error decoding 182 receives, via the network 24, encoded data slice 2 from DST execution unit 2 when the encoded data slice 2 is available from the DST execution unit 2.

Having received the corresponding stored encoded data slice that includes the small data object for retrieval, the inbound DS processing module 82 extracts the small data object from the received corresponding stored encoded data slice. For example, the data de-partitioning 184 extracts the small data object 2 from the received encoded data slice 2 to produce recovered small data object 2.

FIG. 41H illustrates an example of retrieving the stored data to reproduce the data in accordance with the data concatenation approach where the inbound DS processing module 82 retrieves a decode threshold number of encoded data slices of the set of encoded data slices. For example, the inbound DS processing module 82 determines that the stored encoded data slice 2 is not available from the corresponding DST execution unit 2 by at least one of detecting that a response timeframe has expired since issuing the read slice request, receiving no read slice response, and receiving an unfavorable read slice response (e.g., but does not include the stored encoded data slice). Having determined that the stored encoded data slice is not available, the inbound DS processing module 82 issues a decode threshold number of read slice requests to other DST execution units of the DST execution unit set 402, and receives at least a decode threshold number of favorable read slice responses that includes the decode threshold number of encoded data slices of the set of encoded data slices. For example, the DS error decoding 182 receives, via the network 24, the decode threshold number of encoded data slices that includes one or more data slices 408 and one or more error coding slices 410.

Having received the decode threshold number of encoded data slices, the DS error decoding 182 dispersed storage error decodes the received decode threshold number of encoded data slices to produce a recovered concatenated object 414. The data de-partitioning 184 extracts the encoded data slice for retrieval from the recovered concatenated object to produce a recovered small data object. For example, the data de-partitioning 184 extracts the encoded data slice 2 for retrieval from the recovered concatenated object 414 and extracts the small data object 2 from the extracted encoded data slice 2.

FIG. 41I is a flowchart illustrating an example of concatenating data objects for storage. In particular, a method is presented for use in conjunction with one or more functions and features described in conjunction with FIGS. 1-39 and 41A-H. The method begins at step 420 where a processing module of a computing device of one or more computing devices of a dispersed storage network (DSN) receives a message to concatenate a plurality of independent data objects, where the message is one of a user input message to group data objects having a common trait and a system message based on dispersed storage network conditions.

The method continues at step 422 where the processing module concatenates the plurality of independent data objects into a concatenated data object, where the concatenating is based a parameter of a dispersed storage error encoding function that indicates a number of data-based encoded data slices (e.g., a decode threshold number) resulting from performing the dispersed storage error encoding function. As a specific example, the processing module identifies data objects having the common trait and establishes the plurality of independent data objects from the data objects having the common trait.

As another specific example of the concatenating of the plurality of independent data objects, the processing module maps the plurality of independent data objects into "k" rows to produce the concatenated data object, wherein the "k" rows corresponds to a number of data-based encoded data slices resulting from performing the dispersed storage error encoding function and wherein the one or more independent data objects is mapped to a single row of the "k" rows. The processing module pads the single row of the "k" rows when a combined size of the one or more independent data objects is less than a row size.

As yet another specific example of the concatenating the plurality of independent data objects, the processing module maps the plurality of independent data objects into "k" rows to produce the concatenated data object, where the "k" rows corresponds to a number of data-based encoded data slices resulting from performing the dispersed storage error encoding function and where an independent data object of the plurality of independent data objects is mapped to more than one row of the "k" rows.

The method continues at step 424 where the processing module performs the dispersed storage error encoding function on the concatenated data object to produce a set of data-based encoded data slices and a set of redundancy-based encoded data slices, where one or more independent data objects of the plurality of independent data objects is recoverable from a corresponding data-based encoded data slice of the set of encoded data slices or from a decode threshold number of encoded data slices. The decode threshold number of encoded data slices includes one or more data-based encoded data slices of the set of data-based encoded data slices and one or more redundancy-based encoded data slices of the set of redundancy-based encoded data slices. As a specific example, the processing module converts the concatenated data object into a data matrix, generates a coded matrix based on the data matrix and an encoding matrix, generates the set of data-based encoded data slices from a first portion of the coded matrix that corresponds to a first portion of the encoding matrix, and generates the set of redundancy-based encoded data slices from a second portion of the coded matrix that corresponds to a second portion of the encoding matrix.

The method continues at step 426 where the processing module outputs the set of data-based encoded data slices to a first set of storage units for storage. The method continues at step 428 where the processing module outputs the set of redundancy-based encoded data slices to a second set of storage units for storage.

The method described above in conjunction with the processing module can alternatively be performed by other modules of the dispersed storage network or by other devices. In addition, at least one memory section of a computer readable storage medium that stores operational instructions can, when executed by one or more processing modules of one or more computing devices of the dispersed storage network (DSN), cause the one or more computing devices to perform any or all of the method steps described above.

FIGS. 42A-C are schematic block diagrams of another embodiment of a dispersed storage network (DSN) illustrating an example of storing and retrieving data. The DSN includes dispersed storage and task (DST) execution unit sets 1-2, the network 24 of FIG. 1, and the DST client module 34 of FIG. 1. Each DST execution unit set includes a set of DST execution units 1-*n*. Each DST execution unit may be implemented utilizing the DST execution unit 36 of FIG. 1. The DST client module 34 includes the outbound dispersed storage (DS) processing module 80 and the inbound DS processing module 82 of FIG. 3. Each DST execution unit set may be associated with attributes of the corresponding set of DST execution units. Such attributes include one or more of storage capacity, storage latency, retrieval reliability, storage availability, and ingestion rate capability. Each DST execution unit set may be associated with value ranges of the attributes with respect to the other DST execution unit sets. For example, DST execution unit set 1 may be associated with lower than average storage capacity and higher than average ingestion rate capability while DST execution unit set 2 may be associated with higher than average storage capacity and average ingestion rate capability.

FIG. 42A illustrates initial steps of the example of the storing of the data to produce stored data. As a specific example, the outbound DS processing module 80 initiates receiving of the data 430 (e.g., a long transfer, a data stream) for storage and tracks a cumulative size of the received data 430 while the data has been received. While the cumulative size of the received data is less than a size threshold level, the outbound DS processing module 80 facilitates storage of a portion of the received data 430 in the DST execution unit set 1. For example, the outbound DS processing module 80 partitions the portion of the received data to produce a data segment, dispersed storage error encodes the data segment to produce a set of encoded data slices (e.g., slices 1-1, 1-2, through 1-*n* for a first set), generates a set of write slice requests 432 that includes the set of encoded data slices, and sends the set of write slice requests 432 to the set of DST execution units 1-*n* of the DST execution unit set 1. The set of DST execution units 1-*n* stores the set of encoded data slices for each received set of encoded data slices of the portion of the data.

FIG. 42B illustrates further steps of the example of the storing of the data to produce the stored data. In the example, when the cumulative size of the received data is greater than the size threshold level, the outbound DS processing module 80 facilitate storage of remaining portions of the received data 430 in the DST execution unit set 1. For example, for each remaining portion, the outbound DS processing module 80 partitions the remaining portion into data segments, and for each data segment, dispersed storage error encodes the data segment to produce another set of encoded data slices, issues another set of write slice requests 432 that includes the other set of encoded data slices to the set of DST execution units 1-*n* of the DST execution unit set 2. The set of DST execution units 1-*n* of the DST execution unit set 2 stores the other set of encoded data slices etc. For instance, the set of DST execution units 1-*n* of the DST execution unit set 2 stores encoded data slices 3-1, 3-2, through 3-*n* etc.

When the cumulative size of the received data is greater than a size threshold level, the outbound DS processing module 80 further facilitates migration of one or more sets of encoded data slices of the received data from the DST execution unit set 1 to the DST execution unit set 2. For example, the outbound DS processing module 80 retrieves encoded data slices 1-1, 1-2, through 1-*n* from the DST execution unit set 1 and stores the retrieved encoded data slices in the DST execution unit set 2 etc. When confirming that the migration has been completed, the outbound DS processing module 80 may facilitate deletion of the one or more sets of encoded data slices of the received data from the DST execution unit set 1. For example, the outbound DS processing module 80 issues delete slice requests to the set of DST execution units 1-*n* of the DST execution unit set 1 to delete the one or more sets of encoded data slices of the received data.

Having migrated the encoded data slices to the DST execution unit set 2, the outbound DS processing module 80 generates metadata of the data that includes an association of one or more of a storage location of the received data within the DST execution unit set 1, identity of the received data, and identity of the sets of encoded data slices. Alternatively, when the cumulative size of all of the received data is not greater than the size threshold level, the outbound DS processing module 80 generates the metadata to indicate that storage of the data is associated with the DST execution unit set 1.

Having generated the metadata, the outbound DS processing module 80 dispersed storage error encodes the metadata to produce a set of metadata slices (e.g., M-1, M2, through M-n). The outbound DS processing module 80 stores the set of metadata slices in the DST execution unit set 1. For example, the outbound DS processing module 80 issues a set of write slice requests 432 to the set of DST execution units 1-*n* of the DST execution unit set 1, where the set of write slice requests 432 includes the set of metadata slices. The set of DST execution units 1-*n* of the DST execution unit set 1 stores the set of metadata slices.

Having stored the set of metadata slices, the outbound DS processing module 80 associates a storage location (e.g., a source name, a DSN address, a set of slice names) of the metadata slices with the identity of the received data. For example, the outbound DS processing module 80 updates a DSN directory to associate the identity of the received data and the source name of the storage location of the set of metadata slices. As another example, the outbound DS processing module 80 updates an entry of an index node of a dispersed hierarchical index to associate the identity of the received data and the source name of the storage location of the set of metadata slices.

FIG. 42C illustrates an example of the retrieving of the stored data. As a specific example, the inbound DS processing module 82 identifies the storage location of the metadata slices based on the identity of the data for retrieval. For example, the inbound DS processing module 82 accesses the DSN directory using the identity of the data for retrieval to recover the source name of the storage location of the metadata slices. Having identified the storage location, the inbound DS processing module 82 recovers the metadata using the storage location of the metadata slices. For example, the inbound DS processing module 82 issues a read threshold number of read slice requests to the set of DST execution units 1-*n* of the DST execution unit set 1 that corresponds to the storage location, where the read slice requests includes slice names of the metadata slices, receives read slice responses 434 from the DST execution unit set 1, and dispersed storage error decodes a decode threshold number of extracted metadata slices from the received read slice responses to reproduce the metadata.

Having recovered the metadata, the inbound DS processing module 82 identifies a storage location of the data for retrieval from the reproduced metadata. For example, the inbound DS processing module 82 extracts a DSN address from the reproduced metadata and determines an identifier of a corresponding DST execution unit set (e.g., set 2). Having identified the storage location of the data, the inbound DS processing module 82 retrieves one or more sets of encoded data slices using the storage location. For example, the inbound DS processing module 82 issues a set of read slice requests to the DST execution unit set 2, where the set of read slice requests includes one or more sets of slice names corresponding to the one or more sets of encoded data slices and receives read slice responses from the set of DST execution units 1-*n* of the DST execution unit set 2. Having received the read slice responses 434, the inbound DS processing module 82 disperse storage error decodes a decode threshold number of encoded data slices of each of one or more sets of encoded data slices to produce a plurality of recovered data segments and aggregates the plurality of recovered data segments to produce the recovered data 436.

FIG. 42D is a flowchart illustrating another example of accessing data. The accessing of the data includes storing of the data and retrieving of the data. As a specific example of the storing of the data, the method begins or continues at step 438 where a processing module (e.g., of a distributed storage and task (DST) client module) receives data and while a cumulative size of the data being received is less than a size threshold level, the processing module stores a portion of the received data in a first set of storage units. For example, the processing module partitions a portion of the received data to produce a data segment, dispersed storage error encodes the data segment to produce a set of encoded data slices, and issues a set of write slice requests to the first set of storage units, where the set of write slice request includes the set of encoded data slices.

When a cumulative size of the data being received is greater than the size threshold level, the method continues at step 440 where the processing module stores remaining portions of the received data in a second set of storage units. For example, the processing module partitions the remaining portions of the received data to produce data segments, and for each additional data segment, dispersed storage error encodes the additional data segment to produce an additional set of encoded data slices, and issues an additional set of write slice requests to the second set of storage units, where the additional set of write slice requests includes the additional set of encoded data slices.

When the cumulative size of the data being received is greater than the size threshold level, the method continues at step 442 where the processing module facilitates migration of one or more portions of the received data from the first set of storage units to the second set of storage units. For example, for each set of encoded data slices stored in the first set of storage units, the processing module retrieves each of the sets of encoded data slices and stores each of the sets of encoded data slices of the second set of storage units. The method continues at step 444 where the processing module generates metadata of the data that includes an association of a storage location of the portions of the received data in the second set of storage units and the identity of the data.

The method continues at step 446 where the processing module dispersed storage error encodes the metadata to produce a set of metadata slices. The method continues at step 448 where the processing module stores the set of metadata slices in the first set of storage units. The method continues at step 450 where the processing module associates the identity of the data with a storage location of the metadata slices. For example, the processing module updates at least one of a dispersed storage network (DSN) directory and a dispersed hierarchical index.

As a specific example of the retrieving of the data, the method continues or begins at step 452 where the processing module identifies the storage location of the set of metadata slices based on identity of data for retrieval. For example, the processing module accesses at least one of the DSN directory in the dispersed hierarchical index using the identity of the data to recover the storage location. The method continues at step 454 where the processing module recovers the metadata from the first set of storage units using the storage location. For example, the processing module issues a set of read slice requests to the first set of storage units using the storage location, receives metadata slices, and dispersed storage error decodes a decode threshold number of metadata slices to reproduce the metadata.

The method continues at step 456 where the processing module identifies a storage location for the data for retrieval from the recovered metadata. For example, the processing module extracts a DSN address from the recovered metadata and identifies the storage location for the data based on the DSN address (e.g., performs a DSN address to storage location lookup to identify the second set of storage units).

The method continues at step 458 where the processing module retrieves at least a decode threshold number of encoded data slices of each set of encoded data slices of a plurality of sets of encoded data slices corresponding to the portions of the data from the second set of storage units using the storage location for the data. For example, the processing module generates one or more sets of read slice requests using the storage location for the data, sends the one or more sets of read slice requests to the second set of storage units, receives read slice responses, and extracts a decode threshold number of encoded data slices from each set of received encoded data slices.

For each set of encoded data slices, the method continues at step 460 where the processing module decodes the at least the decode threshold number of encoded data slices to reproduce the data for retrieval. For example, the processing module disperse storage error decodes a decode threshold number of encoded data slices of the at least the decode threshold number of encoded data slices for each set of encoded data slices to reproduce a corresponding data segment and aggregates each of the corresponding reproduced data segments to reproduce the data for retrieval.

FIG. 43A is a schematic block diagram of an embodiment of a storage service access system that includes the user device 12 of FIG. 1, the distributed storage and task (DST) processing unit 16 of FIG. 1, one or more authentication servers 462, and at least one storage service 464. The storage service 464 includes one or more of a dispersed storage network (DSN), a Web services provider (e.g., Amazon Web Services (AWS)), and a distributed storage and task network (DSTN).

The storage service access system functions to authenticate access to the storage service 464. In an example of operation, the user device 12 (e.g., a requesting entity with regards to the requesting access to the storage service, alternatively a storage service provider on behalf of the user device 12) issues a generate key request 466 to the DST processing unit 16. The generate key request 466 includes one or more of a user name associated with a user, and a password associated with the username and user. The DST processing unit 16 identifies one of the authentication servers 462 based on the generate key request 466 (e.g., based on the username and a mapping of usernames to authentication servers).

The DST processing unit 16 issues an authentication request 468 to the identified authentication server, where the authentication request 468 includes the generate key request 466 (e.g., the username and the password). The authentication server 462 authenticates the authentication request 468 by comparing the authentication request 468 to authentication records and account status information. When the authentication server 462 determines that the authentication request 468 is favorably authenticated, the authentication server 462 issues an authentication response 470 to the DST processing unit 16. The authentication response 470 includes one or more of the authentication request 468 and an account identifier (ID) associated with the username and/or user.

The DST processing unit 16 determines whether the generate key request 466 is authenticated based on the authentication response 470. For example, the DST processing unit 16 indicates that the generate key request 466 is authenticated when the authentication response 470 includes the account ID. Having authenticated the generate key request, the DST processing unit 16 generates a storage key and a storage key ID. The storage key includes a secret key to be associated with the account ID and may be utilized to access the storage service. For example, the DST processing unit 16 generates a random AWS key as the storage key. As another example, the DST processing unit 16 generates another storage service key as the storage key such that the storage key is compatible with the storage service 464. The DST processing unit 16 may generate another random number to produce the storage key ID.

Having generated the storage key and the storage key ID, the DST processing unit 16 generates an index entry of an index (e.g., of a dispersed hierarchical index, of a local index) to include one or more of the storage key, the storage key ID, the account ID, an identifier of the identified authentication server (e.g., authentication server ID), where an index key to locate the entry of the index may be based on one or more of the storage key ID, the authentication server ID, the account ID, and a storage key value. Having generated the index entry of the index, the DST processing unit 16 updates the index to include the generated index entry. For example, the DST processing unit 16 accesses a DSN memory using the index key to search the dispersed hierarchical index for an index node, retrieves the index node, updates the index node to include the index entry, and stores the updated index node in the DSN memory to update the dispersed hierarchical index.

Having updated the index, the DST processing unit 16 issues a generate key response 472 to the user device 12, where the generate key response 472 includes the storage key ID and may include the storage key. Having received the generate key response 472, the user device 12 issues an access validation request 474 to the DST processing unit 16, where the access validation request 474 includes the storage key ID and a signature request. The DST processing unit 16 accesses the index using the storage key ID to recover the index entry and extract one or more of the storage key, the account ID, and the authentication server ID. The DST processing unit 16 may issue another authentication request 468 to an authentication server 462 associated with the authentication server ID and receive another authentication response 470.

When the other authentication response 470 is favorable (e.g., the user/account ID is still authenticated), the DST processing unit 16 validates the signature request using the storage key. For example, the DST processing unit 16 signs the signature request using the storage key. Having validated the signature request, the DST processing unit 16 issues an access validation response 476 to the user device 12. Having received the access validation response 476, the user device 12 issues a storage service access request 478 to the storage service 464, where the storage service access request includes the validated signature request. The storage service 464 processes the storage service access request 478 and issues a storage service access response 478 to the user device. Alternatively, or in addition to, the storage service may issue a generate key request as a query 480 to the DST processing unit 16 and receive the generate key response on behalf of the user device 12 as a query response 482.

FIG. 43B is a flowchart illustrating an example of authentication access to a storage service. The method begins or continues to establish authentication at step 484 where a processing module (e.g., of a distributed storage and task (DST) client module) receives a generate key request from a requesting entity (e.g., a storage service on behalf of a user device, the user device) for an accessing entity (e.g., the user device). The method continues at step 486 where the processing module issues an authentication request to a corresponding authentication module based on the generate key request. For example, the processing module identifies the authentication module based on the generate key request, generates the authentication request to include a username and password of the generate key request, sends the authentication request to the identified authentication module, and receives an authentication response.

The method continues at step 488 where the processing module determines whether the authentication is favorable based on the received authentication response from the authentication module. For example, the processing module indicates that the authentication is favorable when the received authentication response indicates that the requesting entity and/or the accessing entity are authenticated. When the authentication is favorable, the method continues at step 490 where the processing module generates a storage key for the accessing entity. For example, the processing module generates a secret key as the storage key and an identifier (ID) of the storage key (e.g., storage key ID).

The method continues at step 492 where the processing module generates an index entry to include access information. The access information includes one or more of an account ID of the accessing entity, the storage key ID, the storage key, an identifier of the authentication module, and at least one indexing key (e.g., the processing module may generate the indexing key based on one or more of the storage key ID, the authentication module ID, the account ID, and the storage key). The method continues at step 494 where the processing module updates one or more dispersed hierarchical indexes to include the index entry based on one or more indexing keys. For example, the processing module searches a first dispersed hierarchical index using a selected indexing key, adds the index entry to an identified index node, and stores the updated index node in the dispersed hierarchical index (e.g., encodes the updated index node to produce a set of index slices and facilitate storage of the set of index slices in a dispersed storage network (DSN) memory). The method continues at step 496 where the processing module issues a generate key response to the requesting entity, where the generate key response includes one or more of the storage key ID and the storage key.

The method continues where the processing module begins to facilitate access to the storage service at step 498 when the processing module receives an access validation request from the accessing entity. The access validation request includes one or more of the storage key ID and a signature request. The method continues at step 500 where the processing module accesses a corresponding dispersed hierarchical index based on the access validation request to recover the index entry. For example, the processing module searches the dispersed hierarchical index using the storage key ID of the request as an indexing key and extracts one or more of the storage key, the account ID, and the authentication module ID from an identified index entry of the index. Alternatively, the processing module accesses a list of index entries using the account ID to recover the index entry.

The method continues at step 502 where the processing module issues an authentication request to the corresponding authentication module based on the recovered index entry. For example, the processing module identifies data from an authentication module from the index entry, generates the authentication request to include the account ID, sends the authentication request to the identified a convocation module, and receives an authentication response.

The method continues at step 504 where the processing module determines whether the authentication is favorable based on the received authentication response from the authentication module. When the authentication is favorable, the method continues at step 506 where the processing module issues a favorable access validation response to the accessing entity. For example, the processing module validates the signature request from the accessing entity to produce a validated signature, generates the favorable access validation response to include the validated signature request, and sends the favorable access validation response to the accessing entity.

The method continues at step 508 where the accessing entity accesses the storage service using the favorable access validation response. For example, the accessing entity generates an access request that includes the validated signature, sends the access request to the storage service, and receives an access response from the storage service.

FIGS. 44A-B are schematic block diagrams of another embodiment of a dispersed storage network (DSN) illustrating another example of storing data, where the DSN includes the distributed storage and task (DST) client module 34 of FIG. 1, the network 24 of FIG. 1, and a DST execution unit set 510. The DST client module 34 includes the outbound dispersed storage (DS) processing module 80 and the inbound DS processing module 82 of FIG. 3. The DST execution unit set 510 includes a set of DST execution units 36 of FIG. 1, where one or more DST execution units are deployed at one or more sites. Each DST execution unit provides at least one storage slot of N storage slots. A storage slot includes at least one virtual storage location associated with physical memory of the DST execution unit. For example, the DST execution unit set 510 includes DST execution units 1-14 when 30 storage slots are provided and a varying number of storage slots are associated with each DST execution unit. The DSN functions to store data to the set of DST execution unit set 510 and to retrieve the data from the DST execution unit set 510.

FIG. 44A illustrates initial steps of an example of operation of the storing of the data to the DST execution unit set 510, where the outbound DS processing module 80 receives a write data object request 512 from a requesting entity. The write data object request 512 includes one or more of a data object for storage in the DSN, a data identifier (ID) of the data, an ID of the requesting entity, and a desired performance level indicator. Having received the write data object request 512, the outbound DS processing module 80 obtains dispersal parameters. The dispersal parameters includes one or more of a number of storage slots N, an information dispersal algorithm (IDA) width number, a write threshold number, a read threshold number, and a decode threshold number. The obtaining includes at least one of retrieving a portion of system registry information, utilizing a predetermination, determining based on the desired performance level indicator, and accessing a list based on the requesting entity ID.

Having obtained the dispersal parameters, the outbound DS processing module 80 selects a set of primary storage slots of N storage slots associated with the DST execution unit set, where the set of storage slots includes at least a decode threshold number of storage slots and at most an IDA width number of storage slots. The selecting may be based on one or more of DST execution unit availability information, a DST execution unit performance level, site availability information, system topology information, a system loading level, a system loading goal level, a data storage availability goal, a data retrieval reliability goal, and a site selection scheme. As a specific example, the outbound DS processing module 80 selects the IDA width number of storage slots out of the N storage slots. As such, the outbound DS processing module 80 selects one permutation out of a number of permutations expressed by a formula:

number of permutations of the selecting of the IDA width number of storage slots=N choose IDA width. For instance, the number of permutations of selecting the IDA width number of storage slots=30 choose 15=155 million permutations, when N=30 and the IDA width=15.

Storage of data within the DST execution unit set can tolerate a number of storage slot failures and/or unavailability without affecting data storage availability and data retrieval reliability in accordance with a formula: number of storage slot failures tolerated=N-IDA width=30−15=15. As such, the storage of data within the DST execution unit set can tolerate 15 storage slot failures.

The outbound DS processing module 80 may select the IDA width number of storage slots in accordance with the site selection scheme to improve the data retrieval reliability. For example, the outbound DS processing module 80 selects storage slots at each site of the one or more sites such that at least a decode threshold number of encoded data slices are available from available storage slots at a minimum desired number of sites. As a specific example, the outbound DS processing module 80 selects storage slots associated with available and better-than-average performing DST execution units such that the decode threshold number of encoded data slices are available from any two operational sites when one of three total sites is unavailable. For instance, the outbound DS processing module 80 selects 5 storage slots at each of the 3 sites when the IDA width is 15 and the decode threshold is 10.

Having selected the set of primary storage slots, the outbound DS processing module 80 encodes the data object using a dispersed storage error encoding function and in accordance with the dispersal parameters to produce a plurality of sets of encoded data slices. For example, the outbound DS processing module 80 encodes a first data segment of a plurality of data segments of the data object to produce a first set of encoded data slices, where the first set of encoded data slices includes the IDA width number of slices and the first data segment may be recovered when at least any decode threshold number of encoded data slices of the set of encoded data slices is retrievable.

Having encoded the data object, the outbound DS processing module 80, identifies DST execution units associated with the selected set of primary storage slots. The identifying may be based on one or more of a table lookup (e.g., a storage slot to DST execution unit mapping), initiating a query, and receiving a query response. For example, the outbound DS processing module 80 identifies DST execution units 1, 2, 3, 5, 6, 8, 10, 12, and 13 based on accessing the storage slot to DST execution unit mapping.

Having identified the DST execution units associated with the selected set of primary storage slots, the outbound DS processing module 80 identifies an underperforming DST execution unit (e.g., poor performance, failing, failed) of the identified DST execution units associated with the selected set of primary storage slots. The identifying may be based on one or more of receiving an error message, performing a test, interpreting test results, and monitoring performance information associated with the identified DST execution units. For example, the outbound DS processing module 80 identifies DST execution unit 13 as the underperforming DST execution unit based on receiving an error message from DST execution unit 13, where the error message is interpreted to indicate underperformance.

Having identified underperforming DST execution unit, the outbound DS processing module 80 identifies one or more primary storage slots associated with the underperforming DST execution unit. For example, the processing module accesses the storage slot to DST execution unit mapping to identify the one or more primary storage slots associated with the underperforming DST execution unit. For instance, the outbound DS processing module 80 identifies primary storage slot 29 associated with DST execution unit 13 by accessing the storage slot to DST execution unit mapping.

For each of the one or more identified primary storage slots associated with the underperforming DST execution unit, the outbound DS processing module 80 replicates an associated encoded data slice of each of the plurality sets of encoded data slices to produce replicated encoded data slices. For example, the outbound DS processing module 80 identifies encoded data slice 15 associated with primary storage slot 29 and replicates encoded data slice 15 of each of the sets of encoded data slices to produce replicated encoded data slices 15.

Having produced the replicated encoded data slices, the outbound DS processing module 80 generates one or more sets of write slice requests 514, where the one or more sets of write slice requests 514 includes the plurality of sets of encoded data slices and the replicated encoded data slices. Having generated the one or more sets of write slice requests 514, the outbound DS processing module 80, for each replicated slice, selects an alternate storage slot associated with another DST execution unit, where the other DST execution unit is not underperforming. The selecting may be based on one or more of the slice to storage slot mapping, performance levels of the DST execution units, a DST execution unit performance threshold level, a performance goal, a network loading level, and a network loading level goal. For example, the outbound DS processing module 80 selects storage slot 30 associated with DST execution unit 14 for storage of the replicated encoded data slices 15 when performance levels of the DST execution unit 14 is greater than the DST execution unit performance threshold level (e.g., not underperforming).

Having selected the alternate storage slot, the outbound DS processing module 80 sends, via the network 24, the one or more sets of write slice requests 514 to the identified DST execution units and to the other DST execution unit. As an example of the sending the one or more sets of write slice requests to the identified DST execution units, the outbound DS processing module 80 sends, via the network 24, write slice requests 514 to store encoded data slices 1-2 in storage slots 1-2 of DST execution unit 1, encoded data slices 3-4 in storage slots 4-5 of DST execution unit 2, encoded data slice 5 in storage slot 7 of DST execution unit 3, encoded data slice 6 in storage slot 13 of DST execution unit 5, encoded data slices 7-9 in storage slots 14-16 of DST execution unit 6, encoded data slice 10 in storage slot 19 of DST execution unit 8, encoded data slices 11-12 in storage slots 23-24 of DST execution unit 10, encoded data slices 13-14 in storage slots 27-28 of DST execution unit 12, and encoded data slice 15 in storage slot 29 of underperforming DST execution unit 13. As an example of the sending of the one or more sets of write slice requests 514 to the other DST execution unit, the outbound DS processing module 80 sends, via the network 24, at least one write slice request 514 to store replicated encoded data slices 15 in storage slot 30 of DST execution unit 14.

Having sent the one or more sets of write slice requests 514, the outbound DS processing module 80 receives, via the network 24, write slice responses 516 from at least some DST execution units of the DST execution unit set. Each write slice response 516 includes a write operation status indicator. The write operation status indicator includes a favorable indication when a corresponding write slice request was successfully executed. The write operation status indicator includes an unfavorable indication when the corresponding write slice request was not successfully executed (e.g., due to an error). The example of operation continues as is discussed in greater detail with reference to FIG. 44B.

FIG. 44B illustrates further steps of the example of operation of the storing of the data to the DST execution unit set, where the outbound DS processing module 80, for each replicated encoded data slice, selects one storage slot of the storage slot associated with the encoded data slice and the alternate storage slot associated with the replicated encoded data slice based on one or more of the received write slice responses, a performance level, a performance level goal, and a predetermination. For example, the outbound DS processing module 80 selects the alternate storage slot when receiving a favorable write slice response from DST execution unit 14 with regards to the storage of the replicated encoded data slice 15 in storage slot 30 of the DST execution unit 14 and not receiving a write slice response from DST execution unit 13 with regards to the storage of the encoded data slice 15 in storage slot 29 within a storage time frame. As another example, the outbound DS processing module 80 selects the storage slot when receiving a favorable write slice response from DST execution unit 13.

Having selected the one storage slot, the outbound DS processing module 80 issues a commit request 518, via the network 24, to a DST execution unit associated with the selected one storage slot. For example, the outbound DS processing module 80 generates and sends, via the network 24, the commit request 518 to DST execution unit 14 when the one selected storage slot is storage slot 30 associated with DST execution unit 14, where the commit request 518 indicates to commit redundant encoded data slice 15.

Having sent the commit request 518, the outbound DS processing module 80 issues, for a remaining storage slot of the storage slot associated with the encoded data slice and the alternate storage slot associated with the replicated encoded data slice, a rollback request 520. For example, the outbound DS processing module 80 generates and sends, via the network 24, the rollback request to DST execution unit 13 where the rollback request 520 indicates to rollback storage of the encoded data slice 15.

Having issued the rollback request 520, the outbound DS processing module 80, for each other encoded data slice of each set of encoded data slices (e.g., non-replicated slices), issues, via the network 24, a commit request 518 to an associated DST execution unit in accordance with one or more of a corresponding received write slice response and the slice to storage slot mapping. As a specific example, the outbound DS processing module 80 generates and sends, via the network 24, commit requests 518 to commit storage of encoded data slices 1-2 in storage slots 1-2 of DST execution unit 1, encoded data slices 3-4 in storage slots 4-5 of DST execution unit 2, encoded data slice 5 in storage slot 7 of DST execution unit 3, encoded data slice 6 in storage slot 13 of DST execution unit 5, encoded data slices 7-9 in storage slots 14-16 of DST execution unit 6, encoded data slice 10 in storage slot 19 of DST execution unit 8, encoded data slices 11-12 in storage slots 23-24 of DST execution unit 10, and encoded data slices 13-14 in storage slots 27-28 of DST execution unit 12.

FIG. 44C is a flowchart illustrating an example of storing data. The method begins or continues at step 522 where a processing module (e.g., of a distributed storage and task (DST) client module) selects a set of primary storage slots from N storage slots associated with a set of storage units. The method continues at step 524 where the processing module encodes data for storage in accordance with dispersal parameters to produce a plurality of sets of encoded data slices. The method continues at step 526 where the processing module identifies an underperforming storage unit associated with a primary storage slot of the selected set of primary storage slots. For example, the processing module obtains historical storage unit performance information and identifies a most underperforming storage unit of the set of storage units.

The method continues at step 528 where the processing module replicates each encoded data slice associated with the primary storage slot of the underperforming storage unit to produce replicated encoded data slices. For each replicated encoded data slice, the method continues at step 530 where the processing module selects an alternate storage slot associated with another storage unit of the set of storage units. For example, the processing module interprets the historical performance storage unit performance information to identify a favorably performing storage unit that is different than the identified underperforming storage unit.

The method continues at step 532 of the processing module generates one or more sets of write slice requests, where the one or more sets of write slice requests includes the plurality of sets of encoded data slices and the replicated encoded data slices. The generating includes generating one or more sets of slice names and replicating at least some of the slice names that are associated with the replicated encoded data slices. The method continues at step 534 where the processing module sends the one or more sets of write slice requests to the set of storage units and to the other storage unit. For example, the processing module sends the one or more sets of write slice requests to storage units associated with the primary set of storage units and at least one write slice request to the other storage unit. The method continues at step 536 where the processing module receives write slice responses from at least some of the storage units.

For each replicated encoded data slice, the method continues at step 538 where the processing module selects one storage slot of the primary storage slot and the alternate storage slot based on the received write slice responses. For example, the processing module selects the storage slot when receiving a corresponding favorable write slice response for the storage slot. As another example, the processing module selects the alternate storage slot when receiving a corresponding favorable write slice response for the alternate storage slot and not receiving a favorable write slice response corresponding to the storage slot within a response timeframe.

The method continues at step 540 where the processing module issues a commit request to a storage unit associated with the selected one storage slot. For example, the processing module issues the commit request to include a transaction number associated with a corresponding write slice request, identifies the storage unit associated with the selected one storage slot, and outputs the commit requests to the identified storage unit. The method continues at step 542 where the processing module issues a rollback request to an un-selected storage unit associated with a remaining storage slot of the storage slot of the primary storage slots and the alternate storage slot. The issuing includes generating the rollback request to include the transaction number. For each other encoded data slice of each set of encoded data slices, the method continues at step 544 where the processing module issues a commit request to an associated storage unit in accordance with a corresponding received write slice response.

FIGS. 45A-B are schematic block diagrams of another embodiment of a dispersed storage network (DSN) illustrating an example of rebuilding stored data. The DSN includes a distributed storage and task (DST) execution unit set 546, the network 24 of FIG. 1, and the DST client module 34 of FIG. 1. The DST execution unit set 546 includes a set of DST execution units 1-8. Each DST execution unit may be implemented utilizing the DST execution unit 36 of FIG. 1. The DST client module 34 includes the inbound dispersed storage (DS) processing module 82 of FIG. 3, and the outbound DS processing module 80 of FIG. 3. The DSN functions to store data as stored data, retrieve stored data to reproduce the data, and to rebuild stored data. The rebuilding the stored data includes rebuilding the stored data while retrieving the stored data.

FIG. 45A illustrates initial steps of an example of the rebuilding of the stored data while retrieving the stored data. As a specific example, the inbound DS processing module 82 receives a read data request 548 to retrieve the stored data, where the data is dispersed error encoded to produce a plurality of sets of encoded data slices that are stored in a set of storage resources (e.g., the set of DST execution units 1-8). Each set of encoded data slices includes an information dispersal algorithm (IDA) width number of encoded data slices. For example, the IDA width is 8 when producing eight encoded data slices for each set of encoded data slice. The data can be recovered when at least a decode threshold number of encoded data slices for each set of encoded data slices is available. For example, the data may be recovered when 5-8 encoded data slices for each set of encoded data slices are available and the decode threshold number is 5.

Having received the read data request 548, the inbound DS processing module 82 generates a read threshold number of read slice requests 550 for a read threshold number of encoded data slices of each set of encoded data slices. The read threshold number is greater than or equal to the decode threshold number and less than or equal to the IDA width number. For example, the inbound DS processing module 82 generates 6 read slice requests corresponding to encoded data slices 1-1, 1-2, 1-3, 1-4, 1-5, and 1-6 when the read threshold number is 6. Having generated the read threshold number of read slice requests 550, the inbound DS processing module 82 generates a list slice request 552 for each remaining encoded data slice of a set of encoded data slices. For example, the inbound DS processing module 82 generates a list slice request 552 for encoded data slice 1-7 and another list slice request 552 for encoded data slice 1-8.

Having generated the read slice requests 550 and the list slice requests 552, the inbound DS processing module 82 sends the read threshold number of read slice requests 550 and the remaining list slice requests 552 to the set of DST execution units 1-8 corresponding to the set of storage resources (e.g., including in accordance with a mapping of storage resources to DST execution units). For example, the inbound DS processing module 82 sends read slice requests 1-6 to DST execution units 1-6 and sends the list slice requests 7-8 to DST execution units 7-8.

Having sent the requests, the inbound DS processing module 82 receives read slice responses 554 and list slice responses 556 from at least some of the DST execution units. For example, the inbound DS processing module 82 receives read slice responses 1-6 from DST execution units 1-7 and list slice responses 7-8 from DST execution units 7-8. For each set of encoded data slices, the inbound DS processing module 82 dispersed storage error decodes a decode threshold number of encoded data slices of received encoded data slices from the read slice responses 554 to reproduce a data segment of a plurality of data segments. The inbound DS processing module 82 aggregates the plurality of data segments to produce recovered data 549.

For each set of encoded data slices, the inbound DS processing module 82 determines whether a slice error has occurred based on the received read slice responses 554 and received list slice responses 556. A slice error includes at least one of a missing slice and a corrupted slice. For example, the inbound DS processing module 82 indicates that encoded data slice 1-4 is associated with a slice error when the read slice response 4 indicates that the encoded data slice 1-4 is corrupted or missing. As another example, the inbound DS processing module 82 indicates that encoded data slice 1-8 is associated with another slice error when the inbound DS processing module 82 interprets the list slice response 8 and detects that encoded data slice 1-8 is missing. When the slice error has occurred, the inbound DS processing module 82 identifies a corresponding reproduced data segment 558 of the plurality of reproduced data segments.

FIG. 45B illustrates further steps of the example of the rebuilding of the stored data while retrieving the stored data. As a specific example, when the slice error(s) has occurred, the outbound DS processing module 80 dispersed storage error encodes the identified reproduced data segment associated with the slice error(s) to reproduce a corresponding set of encoded data slices. For each slice error, the outbound DS processing module 80 generates a write slice request 560 that includes a corresponding reproduced encoded data slice of the reproduced set of encoded data slices. Having generated the write slice request 560, the outbound DS processing module 80 selects a storage resource for storing the corresponding reproduced encoded data slice. The selecting may be based on one or more of DST execution unit availability, DST execution unit performance, network performance, a predetermination, and a DST execution unit solicitation as a store storage unit. For example, the outbound DS processing module 80 selects DST execution unit 4 for storage of reproduced encoded data slice 1-4 and selects DST execution unit 8 for storage of reproduced encoded data slice 1-8 when DST execution units 4 and 8 are associated with favorable performance levels.

Having selected the storage resource, the outbound DS processing module 80 sends the write slice request 560 to a DST execution unit corresponding to the selected storage resource. For example, the outbound DS processing module 80 sends a write slice request 4 to DST execution unit 4 for storage of reproduced encoded data slice 1-4 within the DST execution unit 4 and sends a write slice request 8 to DST execution unit 8 for storage of reproduced encoded data slice 1-8 within the DST execution unit 8. Alternatively, the outbound DS processing module 80 sends write slice request 8 to DST execution unit 7 when DST execution unit 8 is associated with unfavorable performance levels, DST execution unit 7 is associated with favorable performance levels, and DST execution unit 7 as indicated availability as a foster storage unit.

FIG. 45C is a flowchart illustrating an example of rebuilding stored data. The method begins or continues at step 562 where a processing module (e.g., of a distributed storage and task (DST) client module) receives a read data request for data stored in a dispersed storage network (DSN) as a plurality of sets of encoded data slices. For each set of encoded data slices, the method continues at step 564 of the processing module retrieves at least a decode threshold number of encoded data slices from the DSN. For example, the processing module issues a read threshold number of read slice requests to a read threshold number of storage units of a set of storage units of the DSN and receives at least a decode threshold number of favorable read slice responses from the read threshold number of storage units.

For each at least a decode threshold number of encoded data slices, the method continues at step 566 where the processing module determines whether the remaining encoded data slices of the set of encoded data slices are favorably stored in the DSN. For example, the processing module issues list slice requests to storage units associated with the remaining encoded data slices, receives list slice responses, and indicates that the remaining encoded data slices are favorably stored when a sufficient number of encoded data slices are listed by the list slice responses.

For each set of encoded data slices, the method continues at step 568 where the processing module decodes a decode threshold number of encoded data slices of the at least a decode threshold number of encoded data slices to reproduce a corresponding data segment. For example, the processing module selects the decode threshold number of encoded data slices and dispersed storage error decodes the decode threshold number of encoded data slices to produce the reproduce corresponding data segment. Alternatively, or in addition to, the processing module aggregates a plurality of reproduced data segments to reproduce the data for outputting to a requesting entity.

For each set of encoded data slices, the method continues at step 570 where the processing module determines whether a storage error has occurred. For example, the processing module interprets read slice responses and list slice responses to identify a missing and/or corrupted encoded data slices of one or more storage errors. When the storage error has occurred, the method continues at step 572 where the processing module dispersed storage error encodes a corresponding reproduced data segment to produce a reproduced set of encoded data slices.

For each storage error, the method continues at step 574 where the processing module generates a write slice request that includes a corresponding reproduced encoded data slice. For each write slice request, the method continues at step 576 where the processing module selects a storage resource for storing the corresponding reproduced encoded data slice. The selecting may be based on one or more of storage resource performance, storage resource availability, and a predetermination. For example, the processing module selects a same storage resource associated with the storage error when a storage unit associated with the storage error has favorable storage performance. As another example, the processing module selects a foster storage resource for temporary storage of the encoded data slice when the storage resource associated with the storage error has an unfavorable attribute and the foster storage resource has favorable performance. The method continues at step 578 where the processing module sends the write slice requests to the selected storage resource of the DSN.

FIGS. 46A-B are schematic block diagrams of another embodiment of a dispersed storage network (DSN) illustrating another example of storing data. The DSN includes the DST execution unit set 510 of FIG. 44A, the network 24 of FIG. 1, and the DST client module 34 of FIG. 1. The DST client module 34 includes the outbound dispersed storage (DS) processing module 80 of FIG. 3 and the inbound DS processing module 82 of FIG. 3. The DSN functions to store data to the set of DST execution unit set and to retrieve the data from the DST execution unit set.

FIG. 46A illustrates initial steps of an example of operation of the storing of the data to the DST execution unit set, where the outbound DS processing module 80 receives a write data object request 512 from a requesting entity. The write data object request 512 includes one or more of a data object for storage in the DSN, a data identifier (ID) of the data, an ID of the requesting entity, and a desired performance level indicator. Having received the write data object request 512, the outbound DS processing module 80 obtains dispersal parameters. The dispersal parameters includes one or more of a number of storage slots N, an information dispersal algorithm (IDA) width number, a write threshold number, a read threshold number, and a decode threshold number. The obtaining includes at least one of retrieving a portion of system registry information, utilizing a predetermination, determining based on the desired performance level indicator, and accessing a list based on the requesting entity ID.

Having obtained the dispersal parameters, the outbound DS processing module 80 selects a set of primary storage slots of N storage slots associated with the DST execution unit set, where the set of storage slots includes at least a decode threshold number of storage slots and at most an IDA width number of storage slots. The selecting may be based on one or more of DST execution unit availability information, a DST execution unit performance level, site availability information, system topology information, a system loading level, a system loading goal level, a data storage availability goal, a data retrieval reliability goal, and a site selection scheme. As a specific example, the outbound DS processing module 80 selects the IDA width number of storage slots out of the N storage slots. As such, the outbound DS processing module 80 selects one permutation out of a number of permutations expressed by a formula: number of permutations of the selecting of the IDA width number of storage slots=N choose IDA width. For instance, the number of permutations of selecting the IDA width number of storage slots=30 choose 15=155 million permutations, when N=30 and the IDA width=15.

Storage of data within the DST execution unit set can tolerate a number of storage slot failures and/or unavailability without affecting data storage availability and data retrieval reliability in accordance with a formula: number of storage slot failures tolerated=N-IDA width=30-15=15. As such, the storage of data within the DST execution unit set can tolerate 15 storage slot failures.

The outbound DS processing module 80 may select the IDA width number of storage slots in accordance with the site selection scheme to improve the data retrieval reliability. For example, the outbound DS processing module 80 selects storage slots at each site of the one or more sites such that at least a decode threshold number of encoded data slices are available from available storage slots at a minimum desired number of sites. As a specific example, the outbound DS processing module 80 selects storage slots associated with available and better-than-average performing DST execution units such that the decode threshold number of encoded data slices are available from any two operational sites when one of three total sites is unavailable. For instance, the outbound DS processing module 80 selects 5 storage slots at each of the 3 sites when the IDA width is 15 and the decode threshold is 10.

Having selected the set of primary storage slots, the outbound DS processing module 80 encodes the data object using a dispersed storage error encoding function and in accordance with the dispersal parameters to produce a plurality of sets of encoded data slices. For example, the outbound DS processing module 80 encodes a first data segment of a plurality of data segments of the data object to produce a first set of encoded data slices, where the first set of encoded data slices includes the IDA width number of slices and the first data segment may be recovered when at least any decode threshold number of encoded data slices of the set of encoded data slices is retrievable.

Having encoded the data object, the outbound DS processing module 80, identifies DST execution units associated with the selected set of primary storage slots. The identifying may be based on one or more of a table lookup (e.g., a storage slot to DST execution unit mapping), initiating a query, and receiving a query response. For example, the outbound DS processing module 80 identifies DST execution units 1, 2, 3, 5, 6, 8, 10, 12, and 13 based on accessing the storage slot to DST execution unit mapping.

Having identified the DST execution units associated with the selected set of primary storage slots, the outbound DS processing module 80 generates one or more sets of write slice requests 514, where the one or more sets of write slice requests 514 includes the plurality of sets of encoded data slices. Having generated the one or more sets of write slice requests 514, the outbound DS processing module 80 sends, via the network 24, the one or more sets of write slice requests 514 to the identified DST execution units. For example, the outbound DS processing module 80 sends, via the network 24, write slice requests 514 to store encoded data slices 1-2 in storage slots 1-2 of DST execution unit 1, encoded data slices 3-4 in storage slots 4-5 of DST execution unit 2, encoded data slice 5 in storage slot 7 of DST execution unit 3, encoded data slice 6 in storage slot 13 of DST execution unit 5, encoded data slices 7-9 in storage slots 14-16 of DST execution unit 6, encoded data slice 10 in storage slot 19 of DST execution unit 8, encoded data slices 11-12 in storage slots 23-24 of DST execution unit 10, encoded data slices 13-14 in storage slots 27-28 of DST execution unit 12, and encoded data slice 15 in storage slot 29 of DST execution unit 13.

Having sent the one or more sets of write slice requests 514, the outbound DS processing module 80 receives, via the network 24, write slice responses 516 from at least some DST execution units of the DST execution unit set. Each read slice response 516 includes a write operation status indicator. The write operation status indicator includes a favorable indication when a corresponding write slice request was successfully executed. The write operation status indicator includes an unfavorable indication when the corresponding write slice request was not successfully executed (e.g., due to an error).

Having received the write slice responses 516, the outbound DS processing module 80 identifies one or more write failures based on the received write slice responses 516. For example, the outbound DS processing module 80 identifies write failures associated with storage of encoded data slices 13-14 in storage slots 27-28 of DST execution unit 12 when a corresponding write slice response has not been received from DST execution unit 12 within a response timeframe (e.g., DST execution unit 12 is unavailable). The example of operation continues as is discussed in greater detail with reference to FIG. 46B.

FIG. 46B illustrates further steps of the example of operation of the storing of the data to the DST execution unit set, where the outbound DS processing module 80, for each write failure, generates a foster encoded data slice. For example, the outbound DS processing module 80 generates a foster encoded data slice 13 for encoded data slice 13 and a foster encoded data slice 14 for encoded data slice 14. Having generated the foster encoded data slices, the outbound DS processing module 80 obtains capacity information for the DST execution unit set. For example, the outbound DS processing module 80 issues capacity information requests 580 to the DST execution unit set and receives capacity information responses 582. The capacity information may include one or more of total capacity, capacity utilized, available capacity, and capacity utilization growth rate.

For each foster encoded data slice, the outbound DS processing module 80 selects a storage slot based on the obtained capacity information for the DST execution unit set. The selecting includes selecting how many foster encoded data slices to store in each storage slot in accordance with a selection scheme. The selection scheme includes rank ordering starting with most available capacity, selecting at least one storage unit for all slices, and selecting a different storage unit for each foster encoded data slice. For example, the outbound DS processing module 80 selects storage slot 25 of DST execution unit 11 for storage of foster encoded data slice 14 and selects storage slot 30 of DST execution unit 14 for storage of foster encoded data slice 13 when DST execution unit 14 has a most available storage space of storage units supporting secondary slots followed by DST execution unit 11 etc.

For each foster encoded data slice, the outbound DS processing module 80 issues a write slice request 514 to a DST execution units that corresponds to the selected storage slots for the foster encoded data slice. The write slice request 514 includes the foster encoded data slice. For example, the outbound DS processing module 80 issues a write slice request 514 to DST execution unit 11 that includes foster encoded data slice 14 and issues another write slice request to DST execution unit 14 that includes foster encoded data slice 13.

FIG. 46C is a flowchart illustrating another example of storing data, which include similar steps to FIG. 44C. The method begins or continues with steps 524 and 522 of FIG. 44C where a processing module (e.g., of a distributed storage and task (DST) client module) encodes data for storage in accordance with dispersal parameters to produce a plurality of sets of encoded data slices and selects a set of primary storage slots from N storage slots associated with a set of storage units.

The method continues at step 584 where the processing module identifies storage units of the set of storage units associated with the selected set of primary storage slots. For example, the processing module performs a lookup based on the selected primary storage slots to identify the storage units. The method continues at step 586 where the processing module generates one or more sets of write slice requests to include the plurality of sets of encoded data slices. The method continues at step 588 where the processing module sends the one or more sets of write slice requests to the identified storage units. The method continues with step 536 of FIG. 44C where the processing module receives write slice responses.

The method continues at step 590 where the processing module determines whether one or more write failures have occurred based on the received write slice responses. When the one or more write failures have occurred, for each write failure, the method continues at step 592 where the processing module generates a foster encoded data slice. For example, the processing module indicates a write failure when not receiving a write slice response within a response timeframe. The method continues at step 594 where the processing module obtains capacity information for at least some storage units of the set of storage units.

For each foster encoded data slice, the method continues at step 596 where the processing module selects a storage slot based on the capacity information. For example, the processing module selects the storage slot based on the capacity information in accordance with a by rank ordering selection scheme. For each foster encoded data slice, the method continues at step 598 where the processing module issues a write slice request to a storage unit that corresponds to the selected storage slots for the foster encoded data slice. For example, the processing module generates the write slice requests to include the foster encoded data slice and sends the write slice request to the storage unit.

FIG. 47A is a schematic block diagram of another embodiment of a dispersed storage network (DSN) that includes at least two distributed storage and task (DST) client modules 1-2, the network 24 of FIG. 1, and a DST execution unit set 600. Each DST client module may be implemented using the DST client module 34 of FIG. 1. Each DST client module includes the outbound DS processing module 80 of FIG. 3. The DSN functions to resolve write conflicts while storing data in the DST execution unit set.

In an example of operation of the resolving of the write conflicts, DST execution unit 1 dispersed storage error encodes data A-1 to produce a plurality of sets of encoded data slices 1 (e.g., each set includes encoded data slices 1, 2, 3, through n), generates a set of write slice requests range 1 that includes the plurality of sets of encoded data slices 1, and sends, via the network 24, the set of write slice requests range 1 to the set of DST execution units 1-n. The range 1 includes a range of slice names associated with the plurality of sets of encoded data slices from data A-1. For example, the DST client module 1 sends, via the network 24, range 1 encoded data slices 1 to DST execution unit 1, range 1 encoded data slices 2 to DST execution unit 2, etc.

Substantially simultaneously, DST execution unit 2 dispersed storage error encodes data A-2 to produce a plurality of sets of encoded data slices 2 (e.g., each set includes encoded data slices 1, 2, 3, through n), generates a set of write slice requests range 2 that includes the plurality of sets of encoded data slices 2, and sends, via the network 24, the set of write slice requests range 2 to the set of DST execution units 1-n. The range 2 includes another range of slice names associated with the plurality of sets of encoded data slices from data A-2. For example, the DST client module 2 sends, via the network 24, range 2 encoded data slices 2 to DST execution unit 1, range 2 encoded data slices 2 to DST execution unit 2, etc.

Each DST execution unit of the DST execution unit set 600 receives a corresponding write slice request from one of the DST client module 1 and the DST client module 2, where the write slice request includes a plurality of encoded data slices for storage in the DST execution unit and a corresponding plurality of slice names of the plurality of encoded data slices. Having received the write slice request, the DST execution unit interprets the plurality of slice names to produce a slice name range (e.g., a high and low slice name produces the range). Having produced the slice name range, the DST execution unit determines whether a write lock conflict exists based on the slice name range. For example, the processing module indicates the write lock conflict when the slice name range conflicts with a previously and still active locked slice name range of the DST execution unit.

When the write lock conflict does not exist, the DST execution unit indicates that the slice name ranges now locked, initiates local storage of the received plurality of encoded data slices, issues a favorable write slice response to the corresponding one of the DST client modules 1 and 2, and indicates that the slice name range is not locked when completing the local storage of the plurality of encoded data slices (e.g., completing after receiving a corresponding commit transaction request).

When the write lock conflict does exist, the DST execution unit issues an unfavorable write slice response to the corresponding one of the DST client modules 1 and 2. The unfavorable write slice response indicates that the write lock conflict exists.

FIG. 47B is a flowchart illustrating an example of resolving write conflicts. The method begins or continues at step 602 where a processing module (e.g., of a distributed storage and task (DST) execution unit, of a storage unit) receives a write slice request from a requesting entity, where the write slice request includes a plurality of encoded data slices and the corresponding plurality of slice names. The method continues at step 604 where the processing module interprets the plurality of slice names to produce a slice name range. The interpreting includes identifying a lowest slice name and a high slice name of the corresponding plurality of slice names to produce the slice name range.

The method continues at step 606 where the processing module determines whether a write lock conflict exists based on the slice name range. For example, the processing module indicates that the write lock conflict exists when the slice name range conflicts with a lock slice name range. For instance, the slice name range overlaps with a retrieved locked slice name range of a currently active write lock. When the write conflict exists, the method continues at step 608 where the processing module issues an unfavorable write slice response to the requesting entity. For example, the processing module generates the unfavorable write slice response to indicate that the write lock conflict exists, and sends the write slice response to the requesting entity. When the write lock conflict does not exist, the method branches to step 610.

The method continues at step 610 where the processing module indicates that the slice name range is locked when the write conflict does not exist. For example, the processing module updates a lock slice name list to include the slice name range. The method continues at step 612 where the processing module initiates local storage of the plurality of encoded data slices. For example, the processing module stores the plurality of encoded data slices in the memory of the storage unit.

The method continues at step 614 where the processing module issues a favorable write slice response to the requesting entity. For example, the processing module generates the favorable write slice response to indicate a favorable write slice operation and sends the favorable write slice response to the requesting entity. The issuing may further include receiving at least one of a rollback transaction request and a commit transaction request followed by at least one of a finalize transaction request or an undo transaction request.

The method continues at step 616 where the processing module indicates that the slice name range is not locked when completing the local storage of the plurality of encoded data slice. For example, the processing module receives the finalize transaction request and updates the locked slice name list to indicate that the slice name range is not locked.

FIG. 48A is a schematic block diagram of another embodiment of a dispersed storage network (DSN) that includes the distribute storage and task (DST) client module 34 of FIG. 1, the network 24 of FIG. 1, and the DST execution unit set 600 of FIG. 47A. The DST execution set includes a set of DST execution units 1-*n*. The DST client module 34 includes the outbound dispersed storage (DS) processing module 80 of FIG. 3 and the inbound DS processing module 82 of FIG. 3. The outbound DS processing module 80 includes a selection module 618, a compression module 620, and the DS error encoding 112 of FIG. 4. The inbound DS processing module 80 includes the DS error decoding 182 of FIG. 13, a de-compression module 622, and a de-selection module 624. The DSN functions to store and retrieve a plurality of correlated data.

In an example of operation of the storing the plurality of correlated data, the outbound DS processing module 80 receives a plurality of sorted data entries 626, where the sorted data entries share a common affiliation. The common affiliation includes at least one of belonging to a common index node of a dispersed hierarchical index, being sorted with similar sorting factor outcomes, sharing a common data type, sharing a common data source, sharing a common data owner, belonging to a common storage vault, etc. The receiving of the plurality of sorted data entries may include searching the dispersed hierarchical index and recovering the common index node that includes the sorted data entries.

Having obtained the plurality of sorted data entries 626, the outbound DS processing module 80 obtains a data access goal level associated with the plurality of sorted data entries. The obtaining includes at least one of performing a lookup, determining based on historical performance, and receiving. Such data access goal levels include a data access latency goal, a data access bandwidth goal, and a data access transfer rate goal.

Having obtained the data access goal level, the outbound DS processing module 80 obtains a DSN performance information. The DSN performance information includes one or more of access latency, bandwidth, transfer rates, resource availability levels, local memory capacity, available processing capacity levels, and available storage levels. The obtaining includes at least one of performing a lookup, accessing a historical record, initiating a query, receiving a query response, initiating a test, and interpreting a test result.

Having obtained the DSN performance information, the outbound DS processing module 80 selects compression parameters based on one or more of the data access goal level and the DSN performance information. For example, the outbound DS processing module 80 performs an iterative function to estimate data access performance based on a given set of compression parameters and the DSN performance information, compares the estimated data access performance to the data access goal level and adjusts the compression parameters such that the estimated performance is substantially the same as the data access goal level. The compression parameters include one or more of a compression algorithm identifier, a compression level, an allocated memory level, a desired size of compressed data, and a size of the data object for compression. Data access latency includes a number of access cycles multiplied by a sum of an individual access latency and the individual compression related latency.

Having selected the compression parameters, the selection module selects sorted data entries to produce a data object 628 based on the selected compression parameters. For example, a data object A includes a plurality of index keys 1, 2, 3, 4, etc., and corresponding content 1, 2, 3, 4, etc. Having produced the data object 628, the compression module compresses the data object 628 to produce a compressed data object 630 in accordance with the selected compression parameters. For example, the compression module compresses a data object A using the selected compression parameters to produce a compressed data object A.

Having produced the compressed data object 630, the DS error encoding 112 dispersed storage error encodes the compressed data object to produce one or more sets of encoded data slices. The outbound DS processing module 80 issues, via the network 24, write slice requests 634 to the set of DST execution units 1-*n*, where the write slice requests 634 includes encoded data slices 1-*n* of each set of encoded data slices. The outbound DS processing module 80 receives write slice responses 636 from the DST execution unit set indicating whether the one or more sets of encoded data slices have been successfully stored.

In an example of operation of the retrieving of the plurality of correlated data, the inbound DS processing module 82 issues read slice requests 638 to the set of DST execution units 1-*n* and receives read slice responses 640 from at least some of the set of DST execution units 1-*n*, where the read slice responses 640 includes encoded data slices of the one or more sets of encoded data slices. Having received the read slice responses, the DS error decoding 182, for each set of encoded data slices, decodes a decode threshold number of received encoded data slices to reproduce the compressed data object 630. The de-compression module 622 decompresses the compressed data object 630 to reproduce the data object 628. The de-selection module 624 selects one or more entries of the reproduced data object to provide recovered sorted data entries 632.

FIG. 48B is a flowchart illustrating an example of storing a plurality of correlated data. The method begins or continues at step 642 where a processing module (e.g., of a distributed storage and task (DST) client module) obtains a plurality of sorted data entries. For example, the processing module searches a dispersed hierarchical index of a dispersed storage network (DSN) to recover an index node that includes a compressed data object that includes plurality of sorted data entries and decompresses the compressed data object to produce the sorted data entries. The method continues at step 644 where the processing module obtains a data access performance goal level associated with the plurality of sorted data entries. For example, the processing module accesses system registry information and interprets historical performance information to produce the data access performance goal level.

The method continues at step 646 where the processing module obtains DSN performance information. The obtaining includes one or more of accessing historical DSN performance information, initiating a performance test, and interpreting a performance test result. The method continues at step 648 where the processing module selects compression parameters based on the data access performance goal level and the DSN performance information. For example, the processing module performs an iterative function that includes estimating a performance based on a set of compression parameters and adjusting the compression parameters to provide estimated performance that is substantially the same as the data access performance level.

The method continues at step 650 where the processing module selects sorted data entries of the plurality of sorted data entries based on the selected compression parameters to produce a data object. The selecting includes one or more of utilizing a number of entries from the compression parameters, selecting all entries from a previous recovery operation of an index node, selecting a first sorted subset, selecting a last sorted subset, and selecting a middle sorted subset. The processing module may initiate generating of another data object to store remaining sorted data entries.

The method continues at step 652 where the processing module compresses the data object to produce a compressed data object using the selected compression parameters. For example, the processing module applies a compression algorithm of the compression parameters to the data object to produce the compressed data object. the method continues at step 654 where the processing module disperse storage error encodes the compressed data object to produce one or more sets of encoded data slices for storage in a set of storage units. For example, the processing module encodes the compressed data object to produce one or more sets of encoded data slices, issues one or more sets of write slice requests that includes the one or more sets of encoded data slices to the set of storage units. When the other data object is generated, the processing module may encode the other data object to produce more sets of encoded data slices for storage in the set of storage units.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc., described with reference to one or more of the embodiments discussed herein. Further, from figure to figure, the embodiments may incorporate the same or similarly named functions, steps, modules, etc., that may use the same or different reference numbers and, as such, the functions, steps, modules, etc., may be the same or similar functions, steps, modules, etc., or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution in a storage network, the method comprises:
identifying a data object of a plurality of data objects for retrieval from the storage network, wherein the plurality of data objects have a common trait and the plurality of data objects are combined to produce a concatenated data object encoded in accordance with a dispersed encoding function to produce a set of encoded data blocks;
identifying, based on a mapping of the plurality of data objects, an encoded data block of the set of encoded data blocks corresponding to the data object;
retrieving the encoded data block from a storage unit of the storage network; and
decoding at least a portion of the encoded data block in accordance with the dispersed encoding function and the mapping to reproduce the data object.

2. The method of claim 1, wherein the concatenated data object is encoded by:
generating a plurality of data blocks; and
dispersed error encoding the plurality of data blocks to produce the set of encoded data blocks.

3. The method of claim 2, wherein the data object is mapped to the encoded data block of the set of encoded data blocks.

4. The method of claim 1, wherein the dispersed encoding function includes an erasure coding.

5. The method of claim 1, wherein the dispersed encoding function includes a forward error-correction encoding.

6. The method of claim 1, wherein the mapping of the plurality of data objects includes a mapping of the plurality of data objects to a data structure corresponding to the set of encoded data blocks, wherein the data object is mapped to one or more of the set of encoded data blocks.

7. The method of claim 6, wherein the data structure is a data matrix.

8. The method of claim 1, wherein the mapping of the plurality of data objects includes:
a mapping of the plurality of data objects into "k" rows, wherein one or more of the plurality of data objects is mapped to a single row of the "k" rows.

9. The method of claim 8, wherein the "k" rows correspond to a number of the set of encoded data blocks resulting from performing the dispersed encoding function.

10. The method of claim 1, wherein the common trait is a common data type.

11. The method of claim 10, wherein the common trait is a common entity.

12. The method of claim 1, wherein the mapping of the plurality of data objects includes a mapping of the plurality of data objects to a data matrix that includes the set of encoded data blocks.

13. A computer readable memory comprises:
a memory section that stores operational instructions that, when executed by a computing device of a storage network, causes the computing device to perform operations that include:
identifying a data object of a plurality of data objects for retrieval from the storage network, wherein the plurality of data objects have a common trait and the plurality of data objects are combined to produce a concatenated data object encoded in accordance with a dispersed encoding function to produce a set of encoded data blocks;
identifying, based on a mapping of the plurality of data objects, an encoded data block of the set of encoded data blocks corresponding to the data object;
retrieving the encoded data block from a storage unit of the storage network; and
decoding at least a portion of the encoded data block in accordance with the dispersed encoding function and the mapping to reproduce the data object.

14. The computer readable memory of claim 13, wherein the dispersed encoding function includes an erasure coding.

15. The computer readable memory of claim 13, wherein the dispersed encoding function includes a forward error-correction encoding.

16. The computer readable memory of claim 13, wherein the concatenated data object is encoded by:
generating a plurality of data blocks; and
dispersed error encoding the plurality of data blocks to produce the set of encoded data blocks.

17. The computer readable memory of claim 16, wherein the common trait is a common data type.

18. The computer readable memory of claim 13, wherein common trait is a common entity.

19. The computer readable memory of claim 18, wherein the mapping of the plurality of data objects includes a mapping of the plurality of data objects to a data structure corresponding to the set of encoded data blocks, wherein the data object is mapped to one or more of the set of encoded data blocks.

20. The computer readable memory of claim 13, wherein the mapping of the plurality of data objects includes a mapping of the plurality of data objects to a data matrix.

* * * * *